US010529461B2

(12) United States Patent
Lee et al.

(10) Patent No.: US 10,529,461 B2
(45) Date of Patent: Jan. 7, 2020

(54) HETEROCYCLIC COMPOUNDS AND ORGANIC LIGHT-EMITTING DIODE INCLUDING THE SAME

(71) Applicant: SFC CO., LTD., Cheongju-si (KR)

(72) Inventors: Se-jin Lee, Daejeon (KR); Seok-Bae Park, Geumsan-gun (KR); Taejung Yu, Yongin-si (KR); Byung-sun Yang, Namwon-si (KR); Yeong-tae Choi, Yongin-si (KR)

(73) Assignee: SFC CO., LTD., Cheongju (KR)

( * ) Notice: Subject to any disclaimer, the term of this patent is extended or adjusted under 35 U.S.C. 154(b) by 217 days.

(21) Appl. No.: 15/607,756

(22) Filed: May 30, 2017

(65) Prior Publication Data

US 2017/0352447 A1 Dec. 7, 2017

(30) Foreign Application Priority Data

Jun. 3, 2016 (KR) ........................ 10-2016-0069742
Apr. 26, 2017 (KR) ........................ 10-2017-0053799

(51) Int. Cl.
*H01B 1/12* (2006.01)
*H01L 51/50* (2006.01)

(52) U.S. Cl.
CPC ............. *H01B 1/128* (2013.01); *H01B 1/127* (2013.01); *H01L 51/5072* (2013.01); (Continued)

(58) Field of Classification Search
None
See application file for complete search history.

(56) References Cited

U.S. PATENT DOCUMENTS

2012/0206035 A1* 8/2012 Shitagaki ............ H01L 51/0072 313/503
2016/0351816 A1* 12/2016 Kim .................... H01L 51/0052

FOREIGN PATENT DOCUMENTS

CN 104271700 A 1/2015
CN 106206999 A 12/2016
(Continued)

OTHER PUBLICATIONS

Machine English translation of Lee et al. (KR 10-2013-0070431). Feb. 25, 2019.*
(Continued)

*Primary Examiner* — Jay Yang
(74) *Attorney, Agent, or Firm* — STIP Law Group, LLC

(57) ABSTRACT

Disclosed are an organic heterocyclic compound represented by Chemical Formula A and an organic light-emitting diode comprising the same.

[Chemical Formula A]

(Continued)

-continued

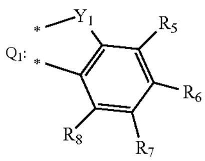

wherein substituents R1 to R8, X1 to X4, W1, and Y1 are each as defined in the specification.

16 Claims, 1 Drawing Sheet

(52) U.S. Cl.
CPC ...... *H01L 51/5012* (2013.01); *H01L 51/5056* (2013.01); *H01L 51/5088* (2013.01); *H01L 51/5092* (2013.01)

(56) References Cited

FOREIGN PATENT DOCUMENTS

| | | | | |
|---|---|---|---|---|
| JP | 2010166070 | A | | 7/2010 |
| JP | 2010168363 | A | | 8/2010 |
| KR | 1020110013220 | A | | 2/2011 |
| KR | 1020120104204 | A | | 9/2012 |
| KR | 10-2013-0069413 | | * | 6/2013 |
| KR | 10-2013-0070431 | | * | 6/2013 |
| KR | 1020130070431 | A | | 6/2013 |
| WO | WO2011149284 | A2 | | 12/2011 |

OTHER PUBLICATIONS

Machine English translation of Park et al. (KR 10-2013-0069413). Feb. 25, 2019.*
Office action from China National Intellectual Property Administration of 201710398487, dated Jan. 16, 2019.
Office Action from China National Intellectual Property Administration of 201710398487.7, dated Aug. 20, 2019.

* cited by examiner

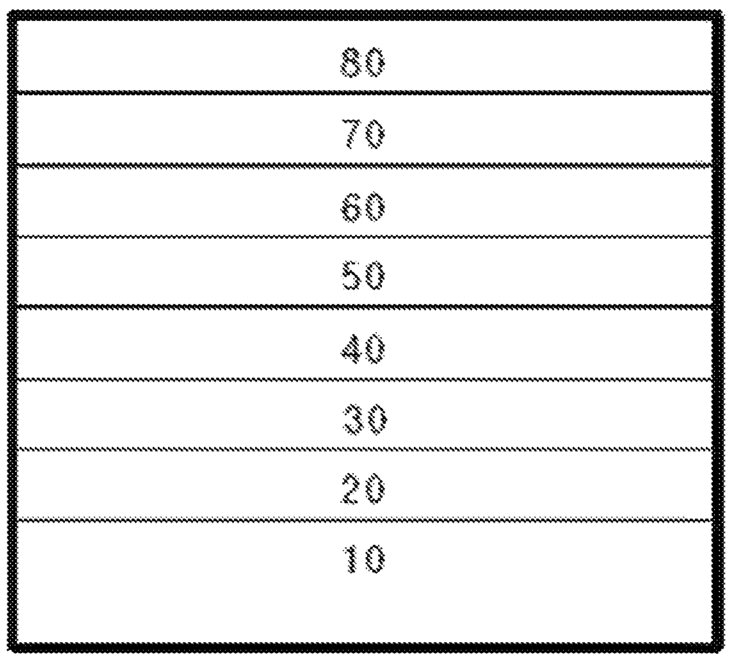
80
70
60
50
40
30
20
10

HETEROCYCLIC COMPOUNDS AND ORGANIC LIGHT-EMITTING DIODE INCLUDING THE SAME

CROSS-REFERENCE TO RELATED APPLICATIONS

This application claims the priority of the Korean Patent Applications NO 10-2016-0069742 filed on Jun. 3, 2016 and NO 10-2017-0053799 filed on Apr. 26, 2017, in the Korean Intellectual Property Office, the disclosure of which is incorporated herein by reference.

BACKGROUND OF THE INVENTION

1. Field of the Invention

The present disclosure relates to a novel heterocyclic compound and an organic light-emitting diode comprising the same. More particularly, the present disclosure relates to a heterocyclic compound useful for a light-emitting layer or electron transport layer of an organic light-emitting diode, and an organic light-emitting diode comprising the same.

2. Description of the Prior Art

In general, the term "organic light-emitting phenomenon" refers to a phenomenon in which electrical energy is converted to light energy by means of an organic material. An organic light-emitting diode using the organic light-emitting phenomenon has a structure usually comprising an anode, a cathode, and an organic material layer interposed therebetween.

In this regard, the organic material layer may be of a multilayer structure consisting of different materials, for example, a hole injection layer, a hole transport layer, a light-emitting layer, an electron transport layer, and an electron injection layer, in order to improve the efficiency and stability of the organic light-emitting diode (OLED). In the organic light-emitting dioded having such a structure, when a voltage is applied between the two electrodes, a hole injected from the anode migrates to the organic layer while an electron is released from the cathode and moves toward the organic layer. In the luminescent zone, the hole and the electron recombine to produce an exciton. When the exciton returns to the ground state from the excited state, the molecule of the organic layer emits light. Such an organic light-emitting diode is known to have characteristics such as self-luminescence, high luminance, high efficiency, low driving voltage, a wide viewing angle, high contrast, and high-speed response.

The light-emitting mechanism forms the basis for classification of luminescent materials as fluorescent or phosphorescent materials, which use excitons in singlet and triplet states, respectively.

Meanwhile, when a single material is employed as the luminescent material, intermolecular actions cause the wavelength of maximum luminescence to shift toward a longer wavelength, resulting in reduced color purity and light emission efficiency. In this regard, a host-dopant system may be used as a luminescent material so as to increase the color purity and the light emission efficiency through energy transfer.

This is based on the principle whereby, when a dopant is smaller in energy band gap than a host accounting for the light-emitting layer, the addition of a small amount of the dopant to the host generates excitons from the light-emitting layer so that the excitons are transported to the dopant, thus emitting light at high efficiency. Here, light of desired wavelengths can be obtained depending on the kind of dopant because the wavelength of the host moves to the wavelength range of the dopant.

Application of an electric current to such an organic light-emitting diode induces the injection of holes and electrons from the anode and the cathode, respectively. After being transported respectively by a hole transport layer and an electron transport layer, the injected holes and electrons recombine in a light-emitting layer to produce excitons. The excitons return to the ground state, emitting light. According to the light-emitting mechanism, the light is classified as fluorescence emission with singlet transition to singlet and phosphorescence emission with triplet transition singlet. The fluorescence and the phosphorescence may be used as luminescent light sources of OLEDs.

With regard to the efficiency of organic light-emitting diodes, statistically, there is a 25% probability of forming a singlet state. It would thus be expected that in fluorescent OLEDs only the formation of singlet excitons results in the emission of useful radiation, and thus there is a theoretical limit of 25% in the internal quantum efficiency of fluorescent OLEDs. On the other hand, phosphorescent light, which uses triplet excitons, has been extensively studied because its emission efficiency is far superior to that of fluorescent light.

The most widely known phosphorescent host material is CBP, and OLEDs employing a hole barrier layer of BCP, BAlq, etc. are known.

However, although diodes employing phosphorescent materials are higher in terms of efficiency than those employing fluorescent materials, conventional phosphorescent host materials, such as BAlq or CBP, require higher driving voltages than do fluorescent materials. Thus, the diodes employing conventional phosphorescent materials are neither greately advantageous in terms of power efficiency (lm/w) nor are satisfactory in terms of lifespan.

With regard to related arts pertaining to such phosphorescent materials, reference may be made to Korean Patent Publication No. 10-2011-0013220 A (Feb. 9, 20119), which discloses an organic compound having a 6-membered aromatic or heteroaromatic ring frame grafted with an aromatic heterocyclic ring, and Japanese Patent Publication No. 2010-166070 A (Jul. 29, 2010), which discloses an organic compound having a substituted or unsubstituted pyrimidine or quinazoline frame grafted with an aryl or heteroaryl ring.

Further, Korean Patent Publication No. 10-2012-0104204 A (Sep. 20, 2012) describes an organic compound having a substituted anthracene ring structure linked with a pyridoindole derivative, which exhibits excellent electron transport and hole blocking capability and emission efficiency and guarantees high stability in a thin film state, and Japanese Patent Publication No. 2010-168363 A (Aug. 5, 2010) addresses an anthracene derivative having a pyridine naphthyl group, which allows for excellent external quantum efficiency and driving voltage properties.

Despite enormous efforts to prepare luminescent materials for use in organic light-emitting diodes or electron transport materials, there is still the continued need to develop organic light-emitting diodes that exhibit higher light emission efficiency and longer lifespan and which can be driven at low voltages.

RELATED ART DOCUMENTS

Korean Patent Publication No. 10-2011-0013220 A (Feb. 9, 2011)

Japanese Patent Publication No. 2010-166070 A (Jul. 29, 2010)

Korean Patent Publication No. 10-2012-0104204 A (Sep. 20, 2012)

Japanese Patent Publication No. 2010-168363 A (Aug. 5, 2010)

SUMMARY OF THE INVENTION

To accomplish the above purposes, an aspect of the present disclosure the present disclosure a heterocyclic compound represented by the following Chemical Formula A:

[Chemical Formula A]

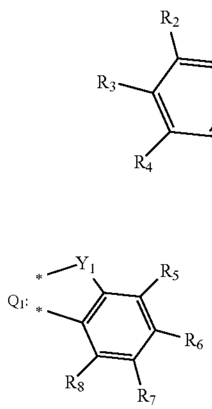

wherein, two adjacent substituents of R1 to R4 each represent a single bond occupying respective positions * of Structural Formula Q1, W1 is any one selected from among O, S, and CR9R10, Y1 is any one selected from among O, S, and CR11R12, X1 is C-(L1)n1-Ar1 or N, X2 is C-(L2)n2-Ar2 or N, X3 is C-(L3)n3-Ar3 or N, and X4 is C-(L4)n4-Ar4 or N, wherein at least one of X1 to X4 is N, L1 to L4 may be the same or different and are each independently a single bond or a linker selected from among a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms, n1 to n4 are each an integer of 0 to 3, with the proviso that when they are each 2 or greater, the corresponding linkers L1 to L4 may each be the same or different, Ar1 to Ar4 may be the same or different and are each independently selected from among hydrogen, deuterium, a substituted or unsubstituted alkyl or heteroalkyl of 1 to 30 carbon atoms, a substituted or unsubstituted aryl of 6 to 40 carbon atoms, a substituted or unsubstituted heteroaryl of 2 to 30 carbon atoms, R1 to R12 may be the same or different and are each independently hydrogen, deuterium, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted aryl of 5 to 50 carbon atoms, a substituted or unsubstituted heteroaryl of 3 to 50 carbon atoms bearing O, N, or S as a heteroatom, a substituted or unsubstituted alkylsilyl of 1 to 24 carbon atoms, a substituted or unsubstituted arylsilyl of 6 to 24 carbon atoms, a substituted or unsubstituted germanium, a substituted or unsubstituted boron, a substituted or unsubstituted aluminum, a carbonyl, a phosphoryl, an amino, a nitrile, a hydroxyl, a nitro, a halogen, a selenium, a tellurium, an amide, and an ester, with the proviso that adjacent substituents may form a fused aliphatic, aromatic, aliphatic heterocylic or aromatic heterocyclic ring.

Another aspect of the present disclosure provides an organic light-emitting diode comprising a first electrode, a second electrode facing the first electrode, and an organic layer interposed therebetween, wherein the organic layer comprises at least one of the heterocyclic compounds of the present disclosure.

BRIEF DESCRIPTION OF THE DRAWINGS

The above and other aspects, features and advantages of the present invention will be more apparent from the following detailed description taken in conjunction with the accompanying drawing, in which:

FIGURE is a schematic cross-sectional view of an organic light-emitting diode according to an embodiment of the present disclosure.

DETAILED DESCRIPTION OF THE EXEMPLARY EMBODIMENTS

Below, a detailed description will be given of the present disclosure.

The present disclosure addresses a compound available for use in a light-emitting layer of an organic light-emitting diode, represented by the following Chemical Formula A:

[Chemical Formula A]

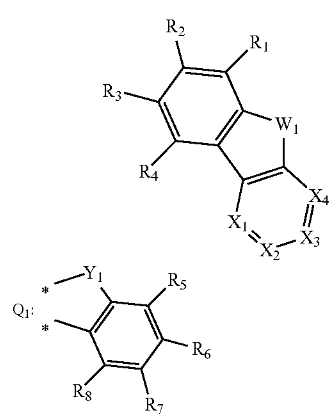

wherein, two adjacent substituents of R1 to R4 each represent a single bond occupying respective positions * of Structural Formula Q1, W1 is any one selected from among O, S, and CR9R10, Y1 is any one selected from among O, S, and CR11R12, X1 is C-(L1)n1-Ar1 or N, X2 is C-(L2)n2-Ar2 or N, X3 is C-(L3)n3-Ar3 or N, and X4 is C-(L4)n4-Ar4 or N, wherein at least one of X1 to X4 is N, L1 to L4 may be the same or different and are each independently a single bond or a linker selected from among a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms, n1 to n4 are each an integer of 0 to 3, with the proviso that when they are each 2 or greater, the corresponding linkers L1 to L4 may each be the same or different, Ar1 to Ar4 may be the same or different and are each independently selected from among hydrogen, deuterium, a substituted or unsubstituted alkyl or heteroalkyl of 1 to 30 carbon atoms, a substituted or unsubstituted aryl of 6 to 40 carbon atoms, a substituted or unsubstituted heteroaryl of 2 to 30 carbon atoms, R1 to R12 may be the same or different and are each independently hydrogen, deuterium, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted akylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted aryl of 5 to 50 carbon atoms, a substituted or unsubstituted heteroaryl of 3 to 50 carbon atoms bearing O, N, or S as a heteroatom, a substituted or unsubstituted alkylsilyl of 1 to 24 carbon atoms, a substituted or unsubstituted arylsilyl of 6 to 24 carbon atoms, a substituted or unsubstituted germanium, a substituted or unsubstituted boron, a substituted or unsubstituted aluminum, a carbonyl, a phosphoryl, an amino, a nitrile, a hydroxyl, a nitro, a halogen, a selenium, a tellurium, an amide, and an ester, with the proviso that adjacent substituents may form a fused aliphatic, aromatic, aliphatic heterocylic or aromatic heterocyclic ring, wherein the term 'substituted' in the expression 'substituted or unsubstituted' used in Chemical Formula A means having at least one substituent selected from the group consisting of a deuterium, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a heteroarylamino of 1 to 24 carbon atoms, an alkylsilyl of 1 to 24 carbon atoms, an arylsilyl of 6 to 24 carbon atoms, and an aryloxy of 6 to 24 carbon atoms.

The expression for a number of carbon atoms, such as in "a substituted or unsubstituted alkyl of 1 to 30 carbon atoms", "a substituted or unsubstituted aryl of 6 to 50 carbon atoms", etc., in the compounds of the present disclosure means the total number of carbon atoms in the alkyl or aryl radical or moiety alone, exclusive of the number of carbon atoms of the substituent. For instance, a phenyl group with a butyl at the para position falls within the scope of an aryl of 6 carbon atoms, even if it is substituted with a butyl radical of 4 carbon atoms.

As used herein, the term "aryl" as a substituent used in the compounds of the present disclosure means an organic radical, derived from an aromatic hydrocarbon by removing a hydrogen atom, including 5- to 7-membered, and preferably 5- or 6-membered mono- or fused ring systems, and may further include a fused ring that is formed by adjacent substituents on the aryl radical.

Concrete examples of the aryl include phenyl, naphthyl, biphenyl, terphenyl, anthryl, indenyl, fluorenyl, phenanthryl, triphenylenyl, pyrenyly, perylenyl, chrysenyl, naphthacenyl, and fluoranthenyl, but are not limited thereto.

At least one hydrogen atom of the aryl radical may be substituted by a deuterium atom, a halogen atom, a hydroxy, a nitro, a cyano, a silyl, an amino (—NH2, —NH(R), or —N(R')(R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The substituent heteroaryl used in the compound of the present disclosure refers to a heteroaromatic organic radical of 2 to 24 carbon atoms containing in at least one ring one to four heteroatoms selected from among N, O, P, Se, Te, Si, Ge, and S. In the aromatic system, two or more rings may be fused. One or more hydrogen atoms on the heteroaryl may be substituted with the same substituents as on the aryl.

Examples of the substituent alkyl useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

Examples of the substituent alkoxy useful in the present disclosure include methoxy, ethoxy, propoxy, isobutyloxy, sec-butyloxy, pentyloxy, iso-amyloxy, and hexyloxy. At least one hydrogen atom of the alkoxy may be substituted by the same substituent as in the aryl.

Representative among examples of the substituent silyl useful in the present disclosure are trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl. One or more hydrogen atoms of the silyl may be substituted by the same substituent as in the aryl.

The compound, represented by Chemical Formula A, of the present disclosure has a structure in which a triple fused ring structure bearing X1 to X4 is fused to a double fused ring structure bearing Structural Formula Q1 wherein the aromatic ring moiety bearing X1 to X4 has substituents, respectively represented by -(L1)n1-Ar1 to -(L4)n4-Ar4, bonded thereto.

In the aromatic ring moiety bearing X1 to X4, that is, substituents that are not N but are represented by -(L1)n1-Ar1 to -(L4)n4-Ar4 may be bonded to the carbon atoms at positions X1 to X4.

In the present disclosure, the heterocyclic compounds having such structures can be used phosphorescent host materials in electron transport layers or electron injection layers as well as light-emitting layers.

In one embodiment, linkers L1 to L4 of Chemical Formula A may be the same or different and are each independently a single bond or a linker selected from among compounds represented by the following Structural Formulas 1 to 9:

[Structural Formula 1]

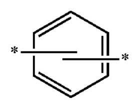

[Structural Formula 2]

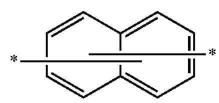

[Structural Formula 3]

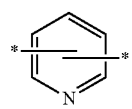

[Structural Formula 4]

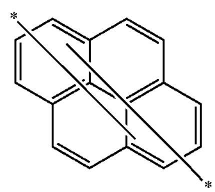

[Structural Formula 5]

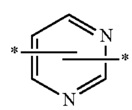

[Structural Formula 6]

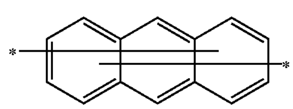

[Structural Formula 7]

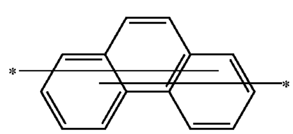

[Structural Formula 8]

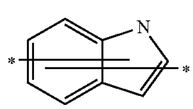

[Structural Formula 9]

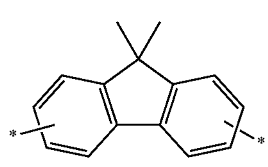

wherein each of the unsubstituted carbon atoms of the aromatic ring moiety in the linkers is bound with a hydrogen atom or a deuterium atom.

In one embodiment, the heterocyclic moiety bearing X1 to X4 in Chemical Formula A may bear one or two nitrogen atoms and n1 to n4 may be the same or different and are each 0 or 1.

When the heterocyclic moiety bearing X1 to X4 in Chemical Formula A bears two nitrogen atoms, the heterocyclic compound represented by Chemical Formula A may be a heterocyclic compound represented by the following Chemical Formula A-1 or A-2:

[Chemical Formula A-1]

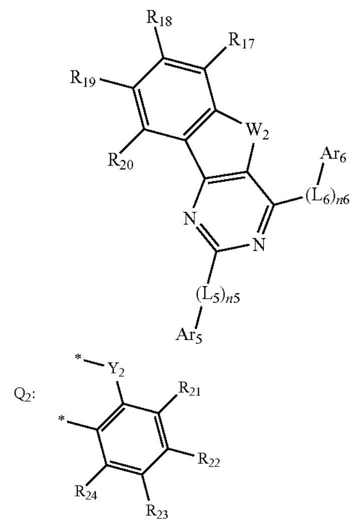

[Chemical Formula A-2]

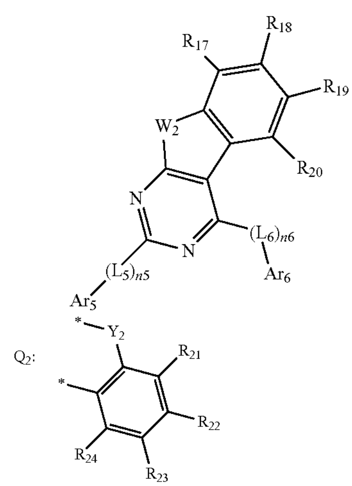

wherein, two adjacent substituents of R17 to R20 each represent a single bond occupying respective positions * of Structural Formula Q2, W2 is any one selected from among O, S, and CR25R26, Y2 is any one selected from among O, S, and CR27R28, linkers L5 and L6 may the same or different and are each independent as defined independent as defined for L1 to L4 in claim 1, n5 and n6 are each an integer of 0 to 3, with the proviso that when each of them is 2 or greater, corresponding L5 and L6 may each be the same or different, Ar5 and Ar6 may be the same or different and are each independent as defined for Ar1 to Ar4 in claim 1, R17 to R28 may be the same or different and are each independent as defined above for R1 to R12.

In another embodiment, one of Ar1 to Ar4 in Chemical Formula A may be a substituted or unsubstituted heteroaryl of 2 to 20 carbon atoms bearing a heteroatom selected from among O, S, and N.

According to a particular embodiment of the present disclosure, R1 to R12 in Chemical Formula A may be the same or different and are each independently selected from among hydrogen, deuterium, a substituted or unsubstituted alkyl of 1 to 20 carbon atoms; a substituted or unsubstituted cycloalkyl of 3 to 20 carbon atoms; a substituted or unsubstituted aryl of 6 to 20 carbon atoms; and a substituted or unsubstituted heteroaryl of 2 to 20 carbon atoms.

One of Ar5 and Ar6 in Chemical Formulas A-1 and A-2 may be a substituent represented by one of the following Chemical Formulas A to E:

[Structural Formula A]

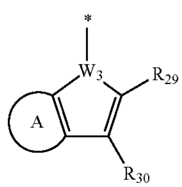

[Structural Formula B]

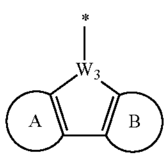

[Structural Formula C]

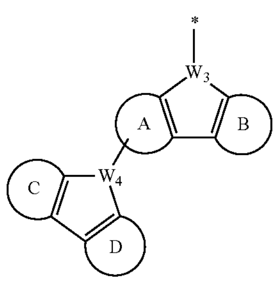

[Structural Formula D]

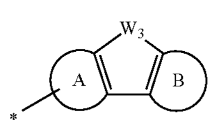

[Structural Formula E]

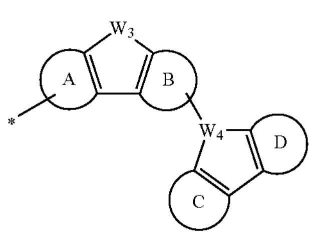

in Structural Formulas A, B, and C of which

W3 is N or C—R31, and W4 is N or C—R32, in Structural Formulas D and E of which

W3 is selected from among O, S, N—R31, and C—R32(—R33), and W4 is selected from among O, S, N—R34, and C—R35(—R36), and in all Structural Formulas A to E of which, R29 to R36 may be the same or different and are each as defined above for R1 to R12, and,

* means a binding site at which linker L5 or L6 is bonded to the moiety linked thereto, cyclic moieties Ⓐ to Ⓓ may be the same or different and are each a hydrocarbon ring of 4 to 20 carbon atoms capable of forming a 5- or 6-membered aliphatic or aromatic mono- or polycyclic ring.

Examples of the heterocyclic compound represented by Chemical Formula A in accordance with the present disclosure include the following Compound 1 to Compound 116, but are not limited thereto.

[Compound 1]

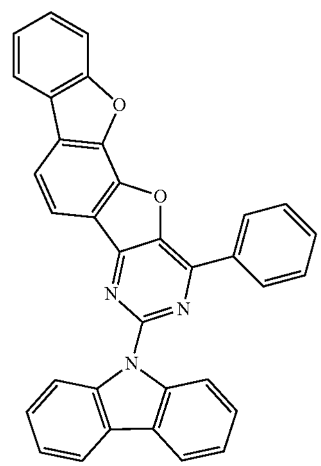

[Compound 2]

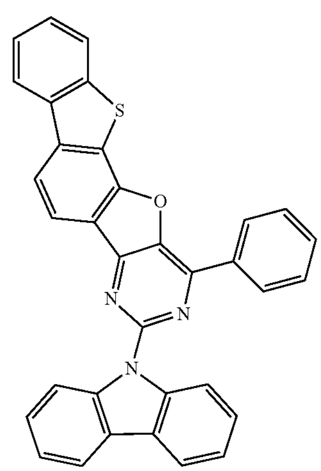

-continued
[Compound 3]
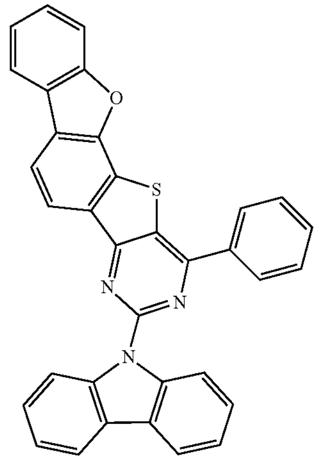
[Compound 4]
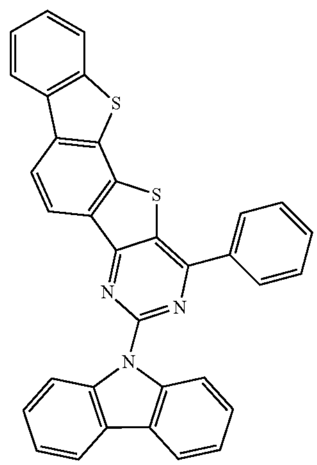
[Compound 5]
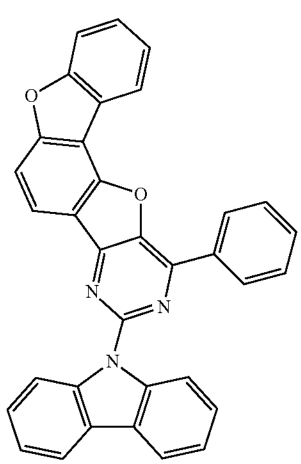
-continued
[Compound 6]
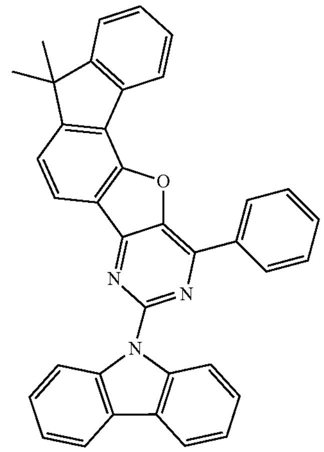
[Compound 7]
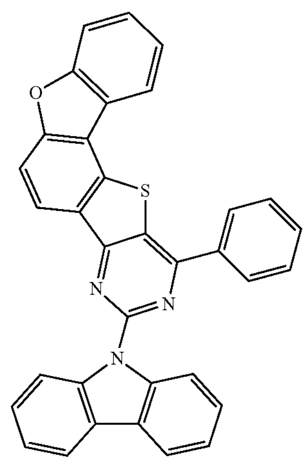
[Compound 8]
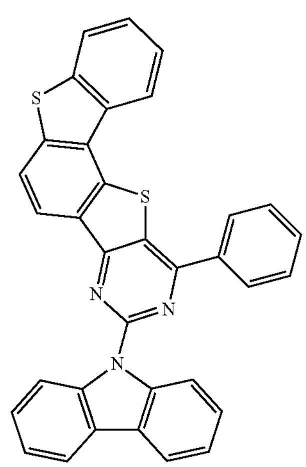

[Compound 9]
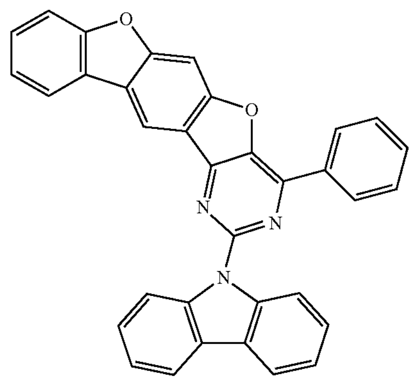
[Compound 10]
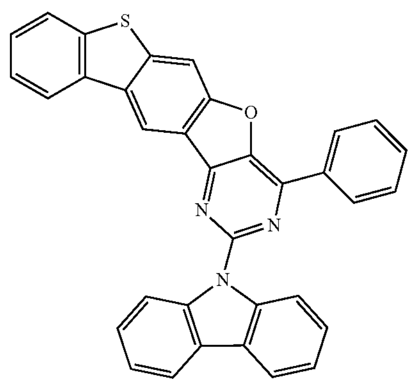
[Compound 11]
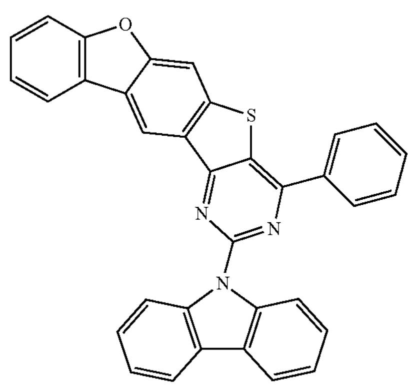
[Compound 12]
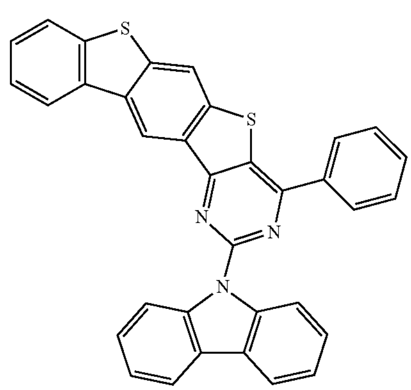
[Compound 13]
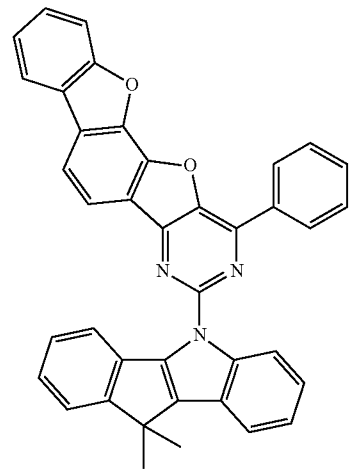
[Compound 14]
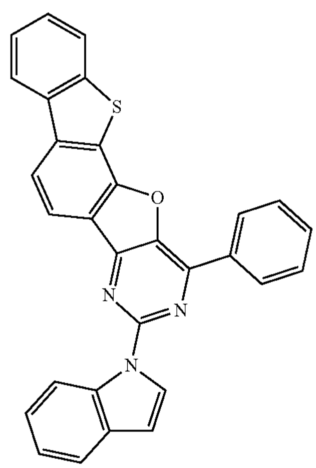
[Compound 15]
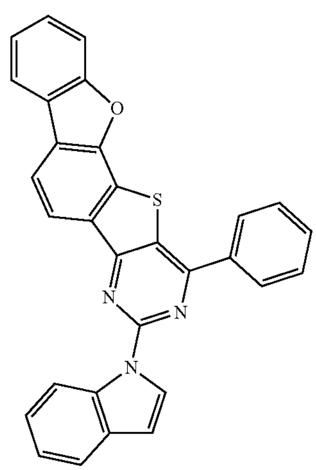

-continued
[Compound 16]
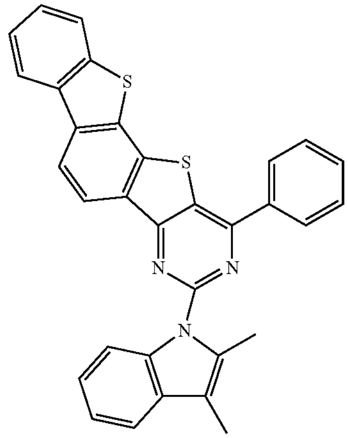
[Compound 17]
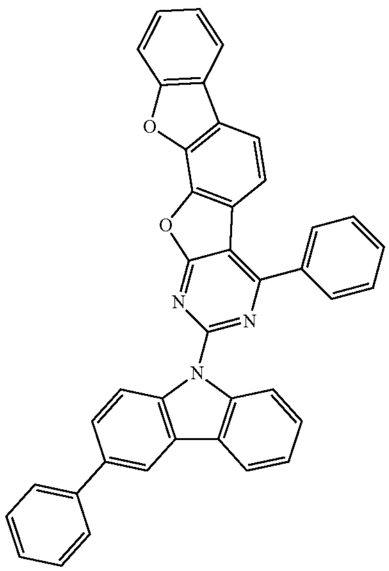
[Compound 18]
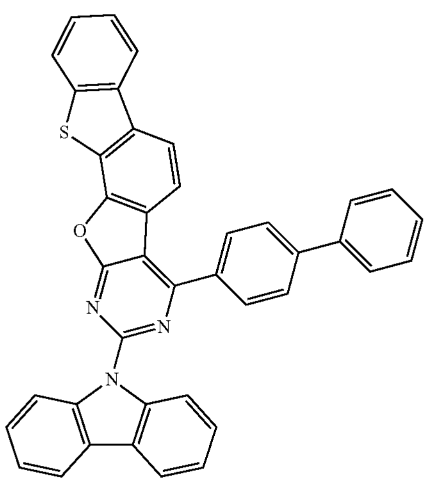
-continued
[Compound 19]
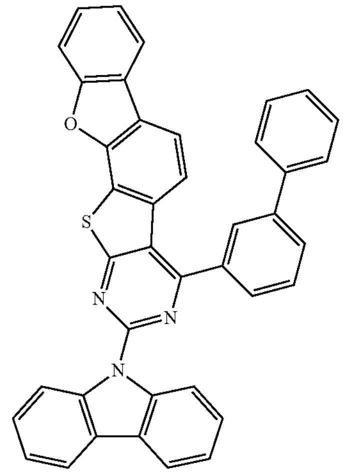
[Compound 20]
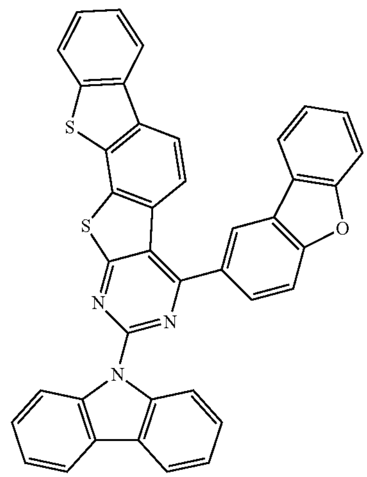
[Compound 21]
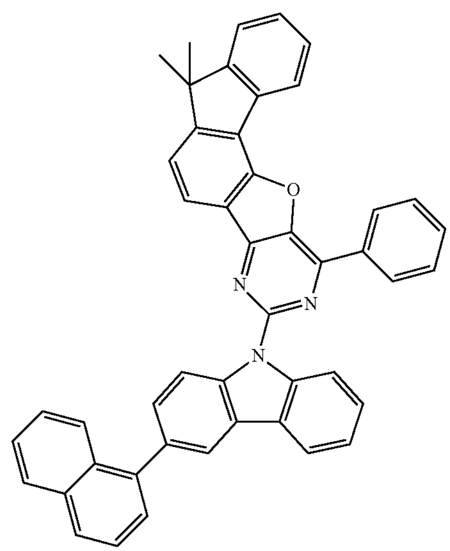

-continued
[Compound 22]
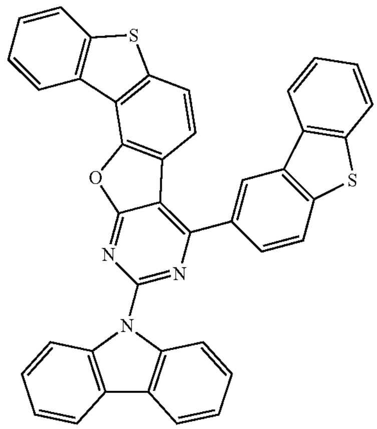
[Compound 23]
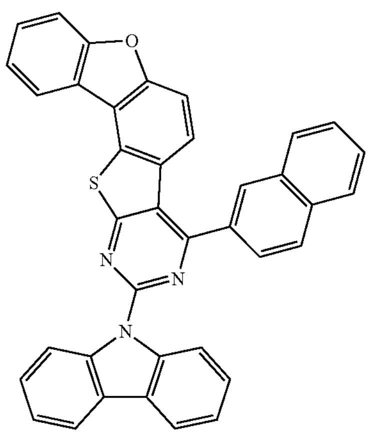
[Compound 24]
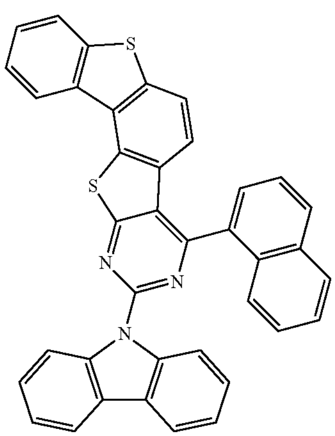
-continued
[Compound 25]
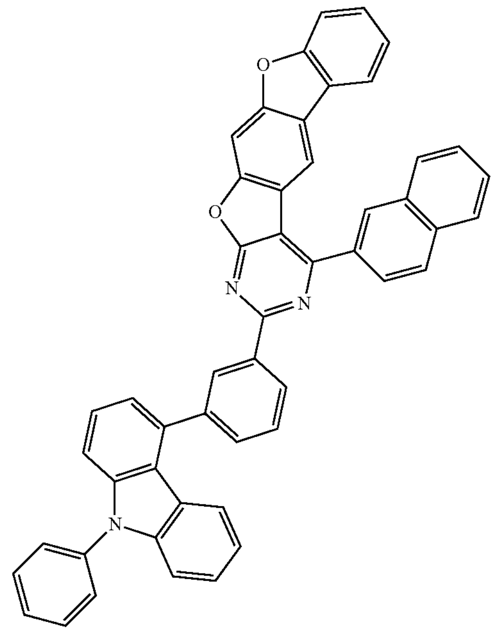
[Compound 26]
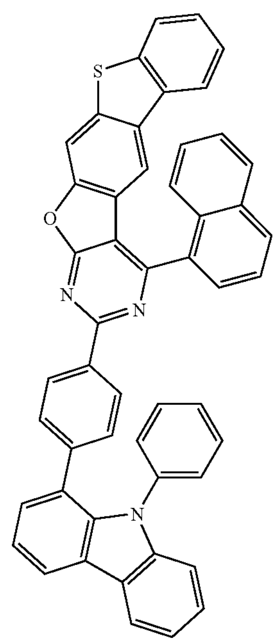

-continued
[Compound 27]
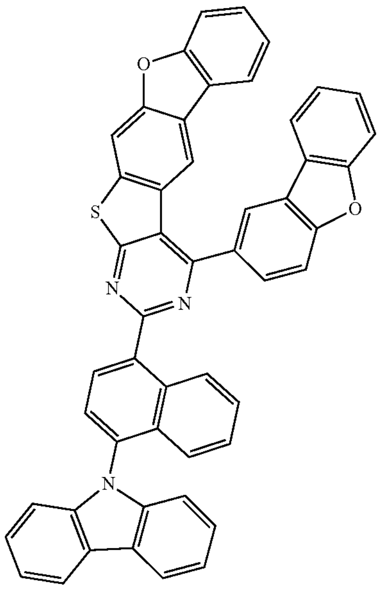
[Compound 28]
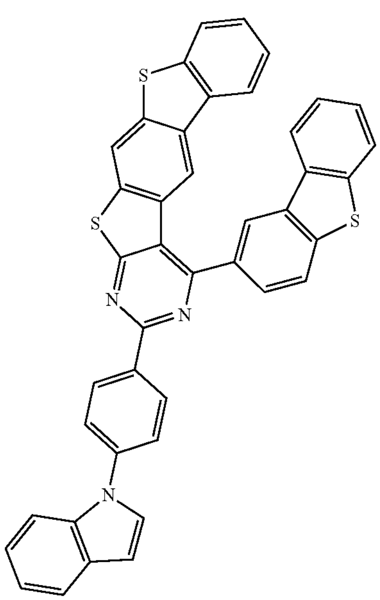
-continued
[Compound 29]
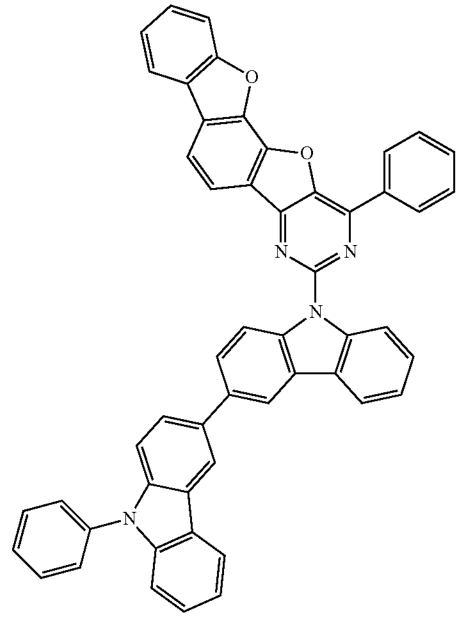
[Compound 30]
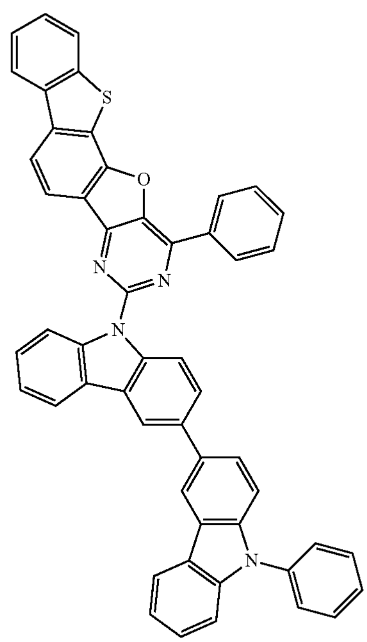

-continued
[Compound 31]
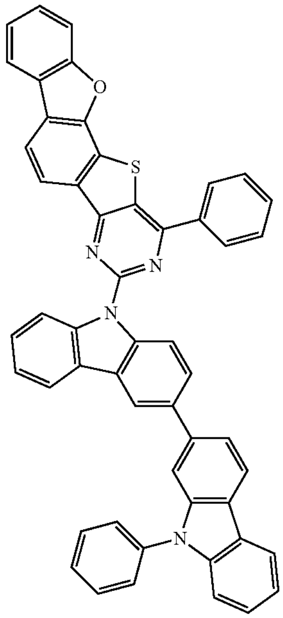
[Compound 32]
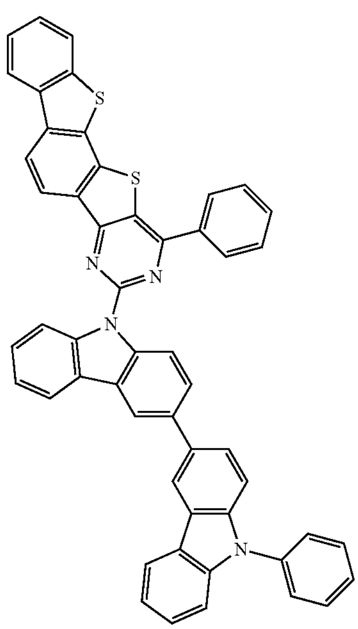
-continued
[Compound 33]
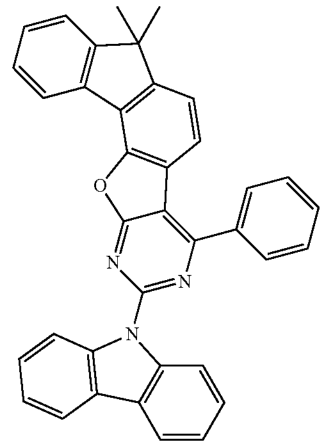
[Compound 34]
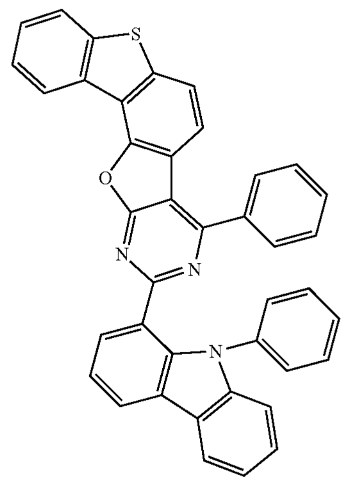
[Compound 35]
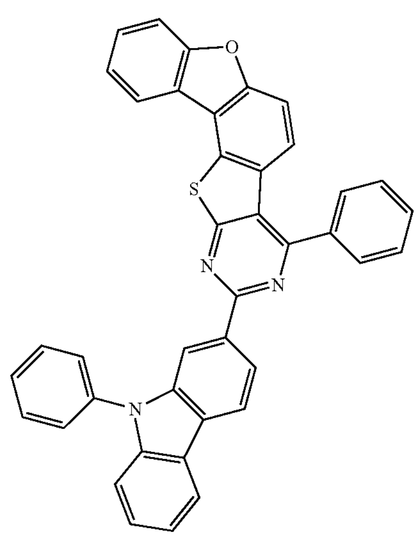

[Compound 36]
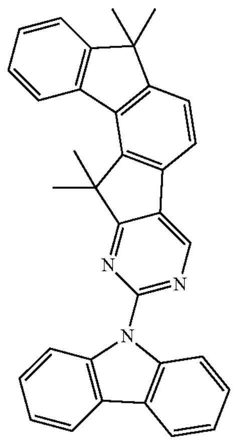
[Compound 37]
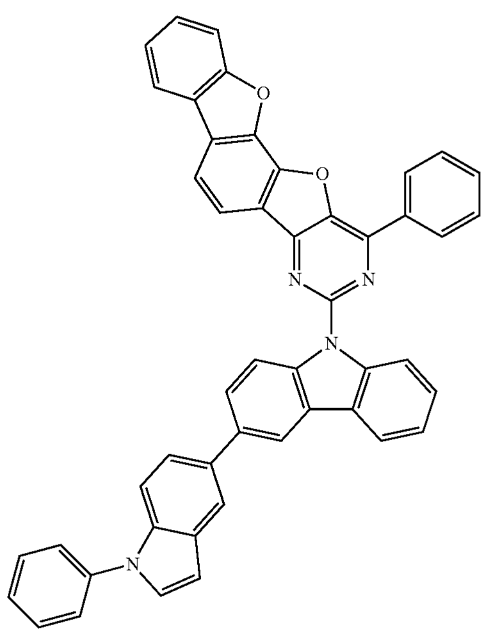
[Compound 38]
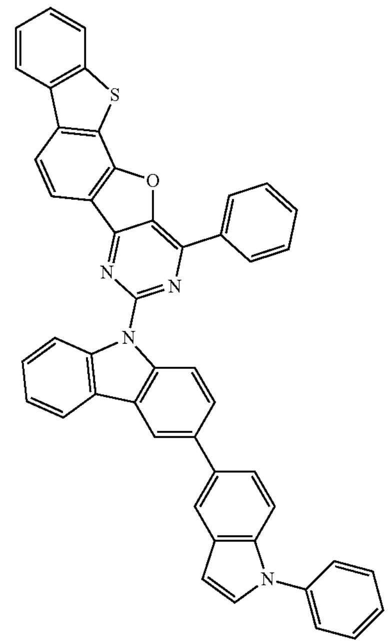
[Compound 39]
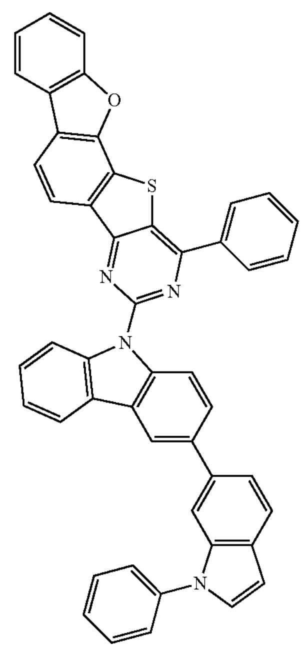

[Compound 40]
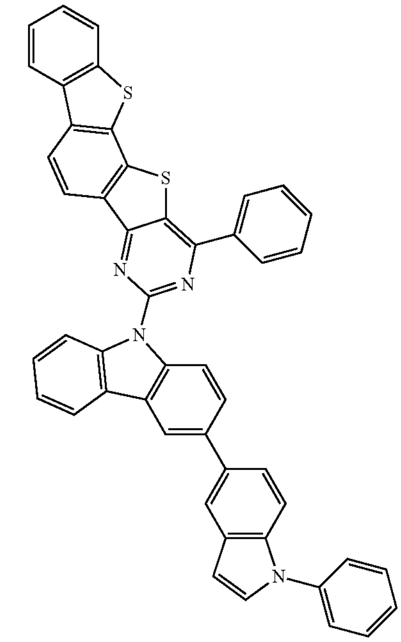
[Compound 41]
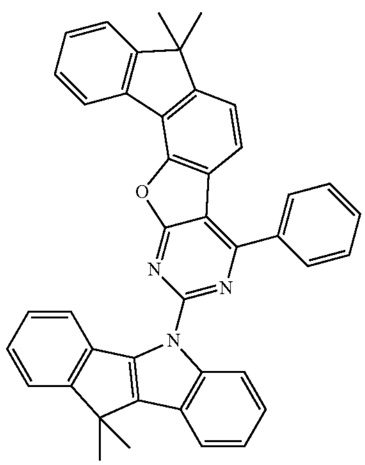
[Compound 42]
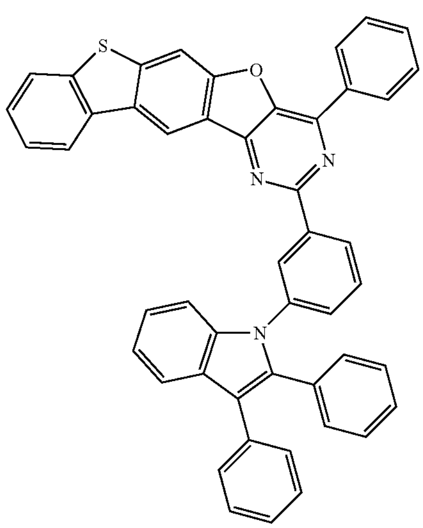
[Compound 43]
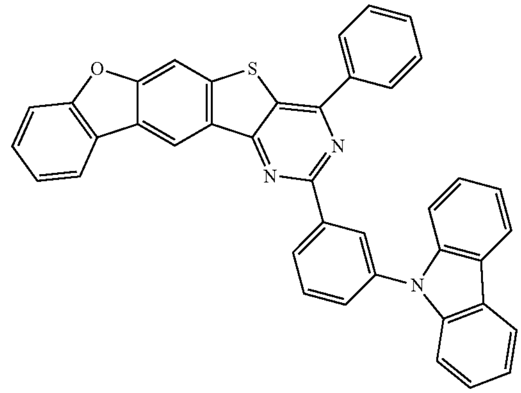
[Compound 44]
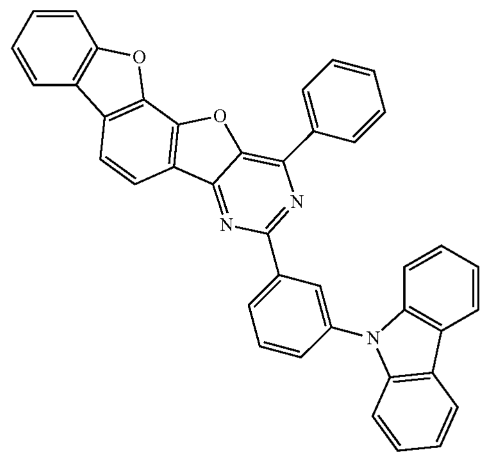
[Compound 45]
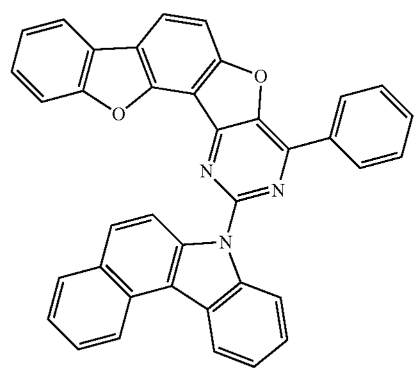
[Compound 46]
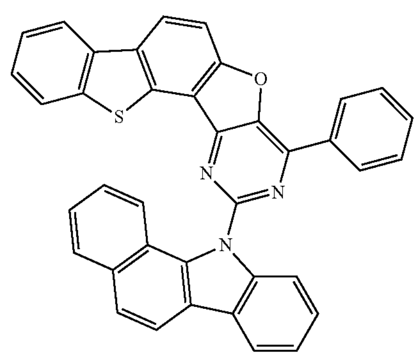

-continued
[Compound 47]
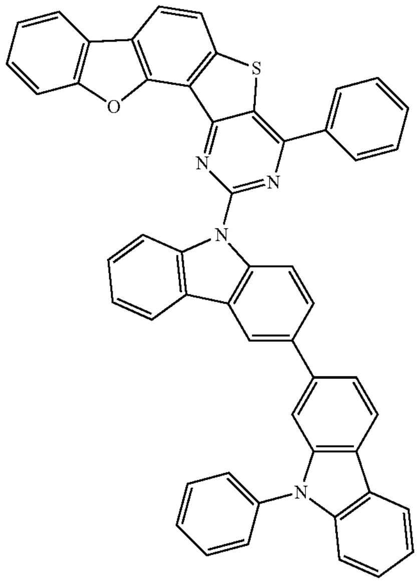
[Compound 48]
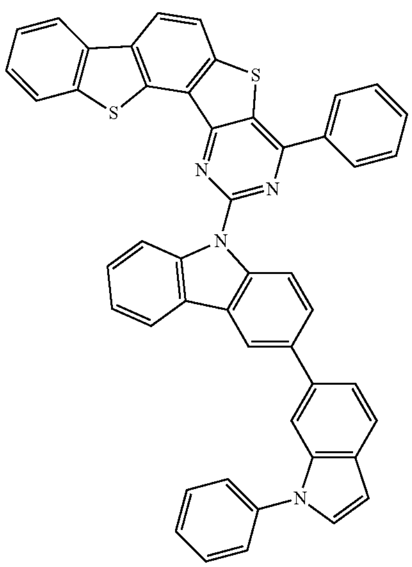
-continued
[Compound 49]
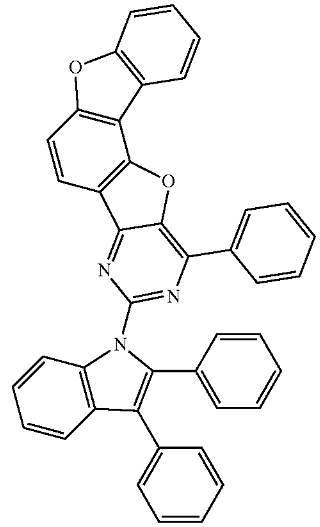
[Compound 50]
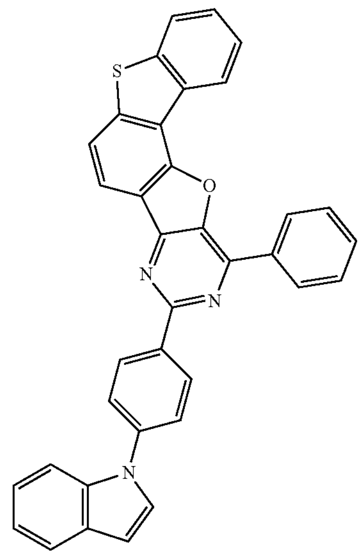
[Compound 51]
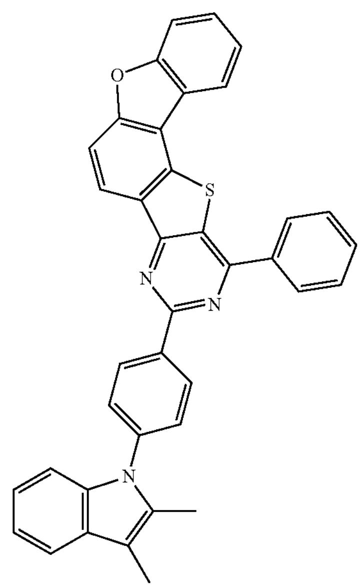

[Compound 52]
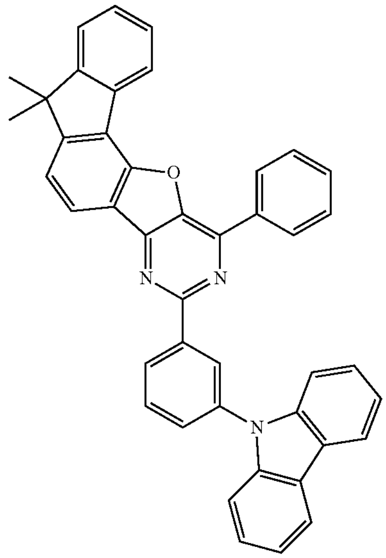
[Compound 53]
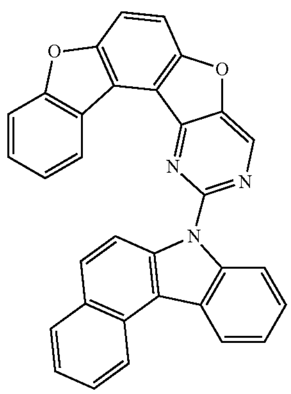
[Compound 54]
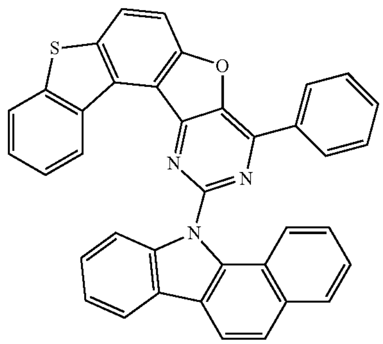
[Compound 55]
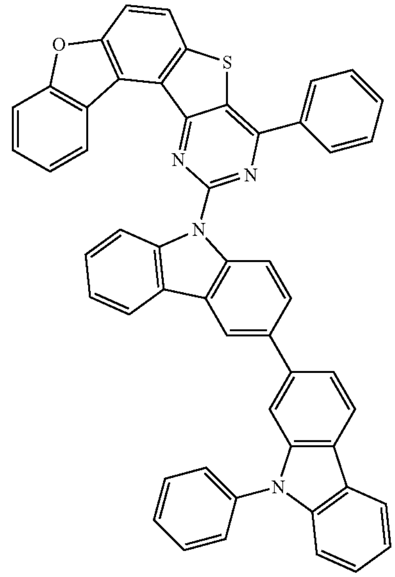
[Compound 56]
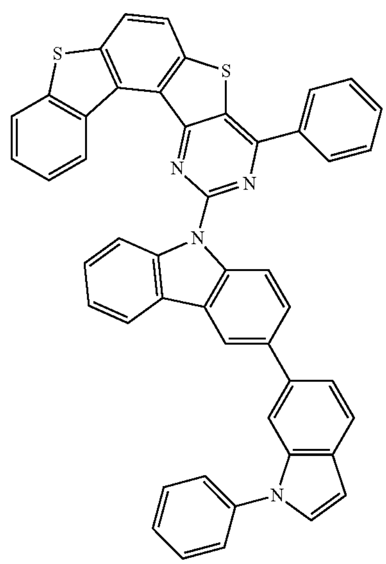
[Compound 57]
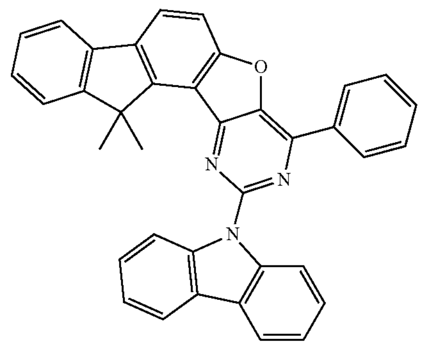

-continued
[Compound 58]
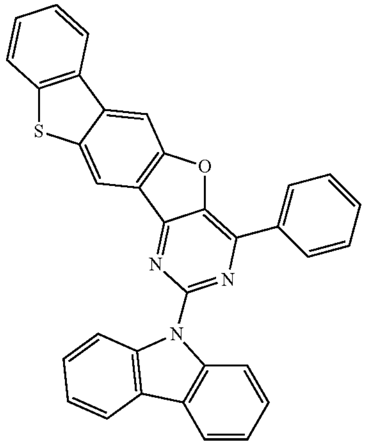
[Compound 59]
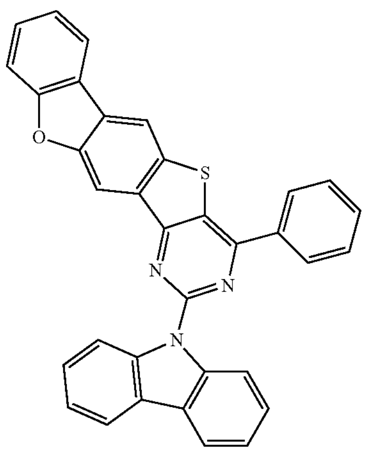
[Compound 60]
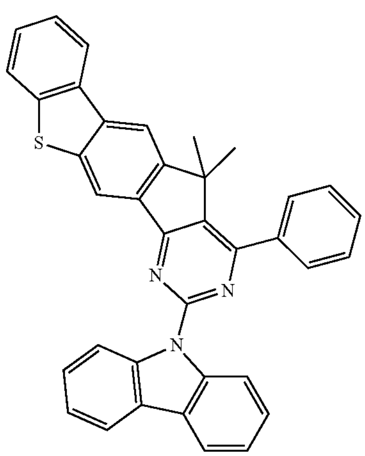
-continued
[Compound 61]
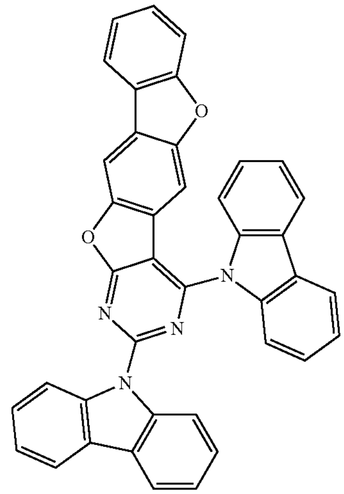
[Compound 62]
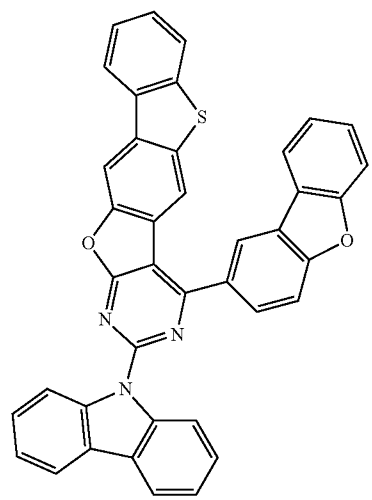
[Compound 63]
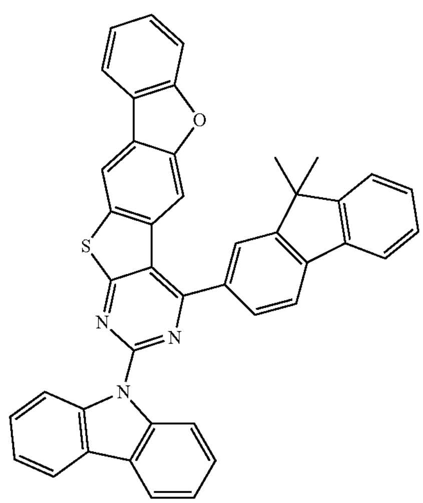

[Compound 64]
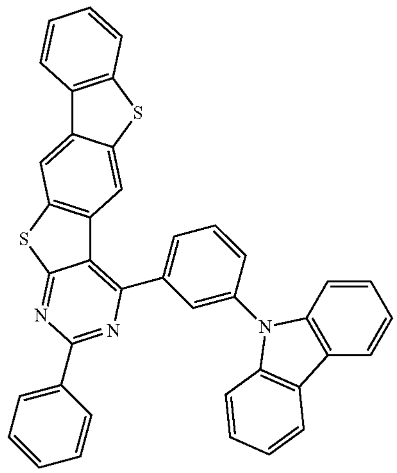
[Compound 65]
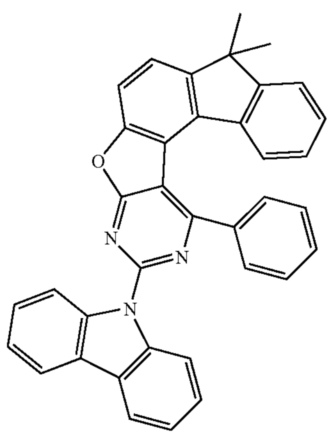
[Compound 66]
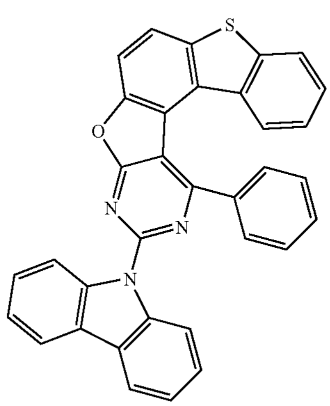
[Compound 67]
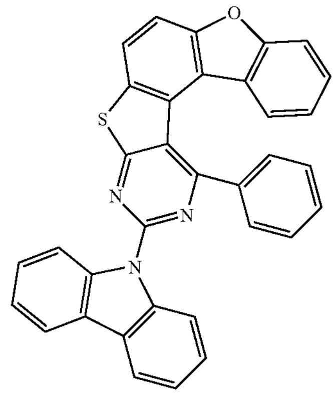
[Compound 68]
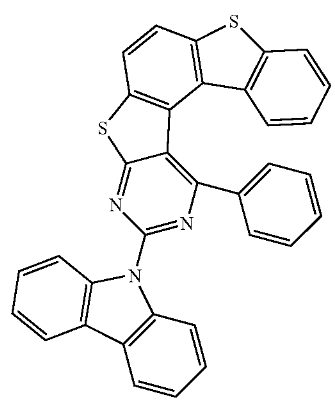
[Compound 69]
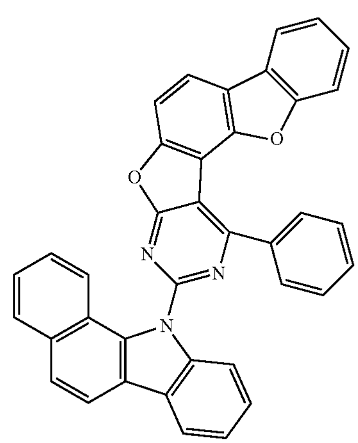

[Compound 70]
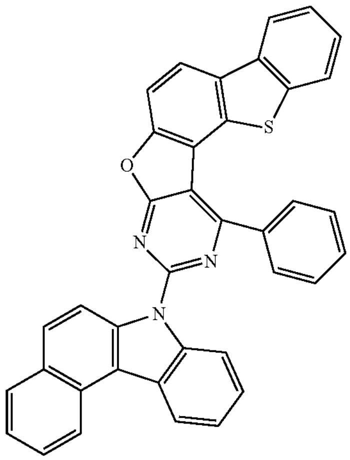
[Compound 71]
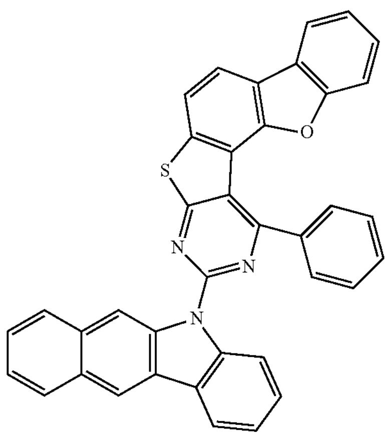
[Compound 72]
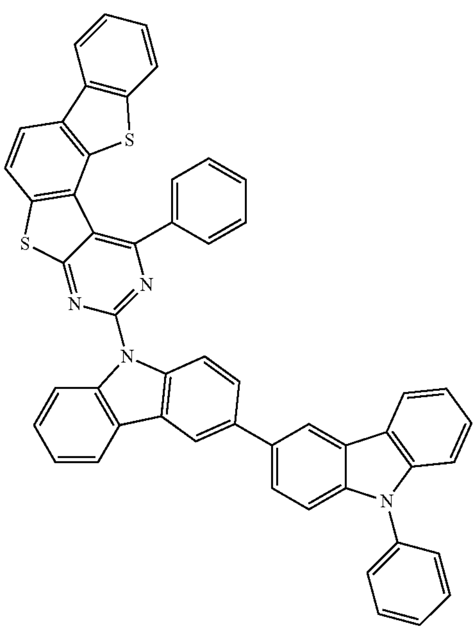
[Compound 73]
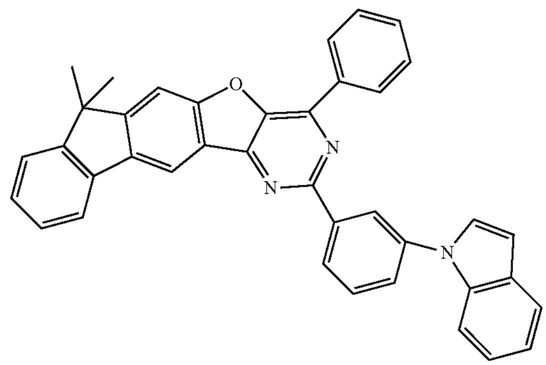
[Compound 74]
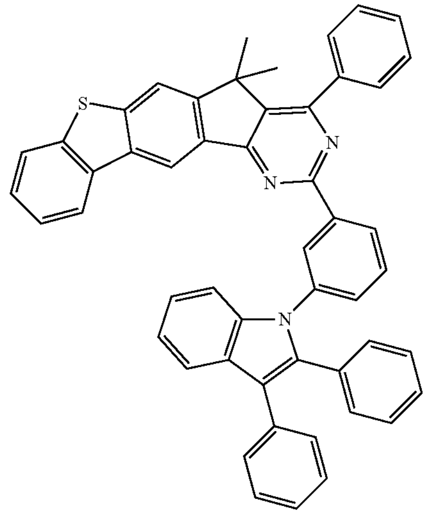
[Compound 75]
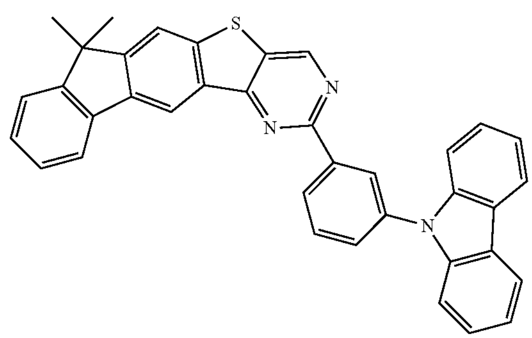

-continued
[Compound 76]
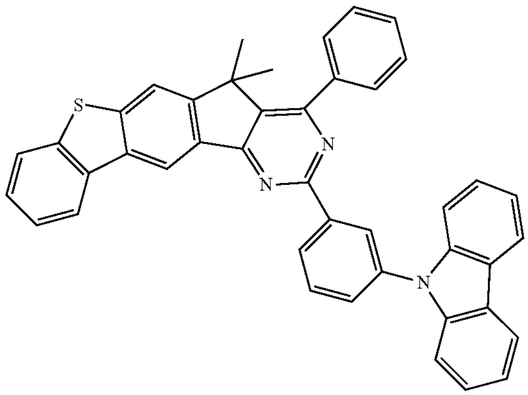
[Compound 77]
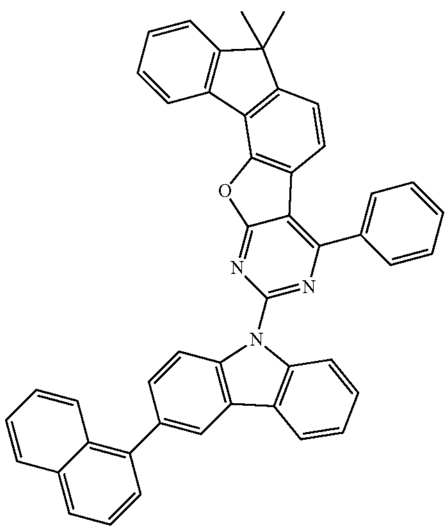
[Compound 78]
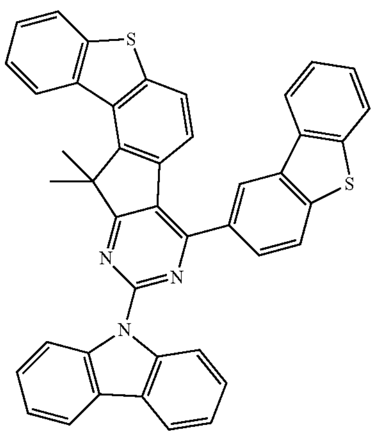
-continued
[Compound 79]
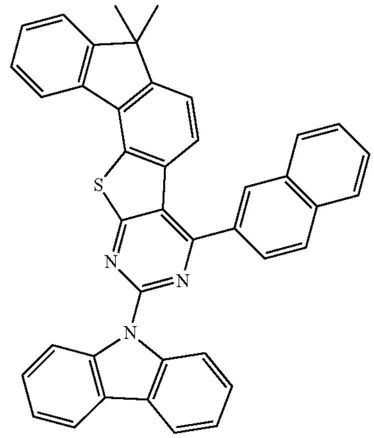
[Compound 80]
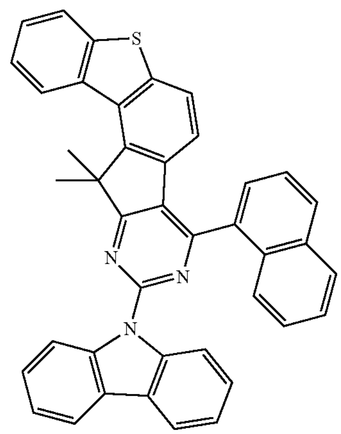
[Compound 81]
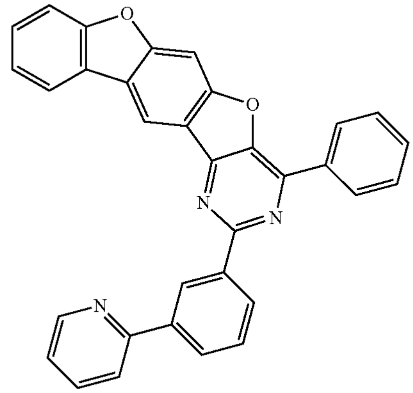

-continued
[Compound 82]
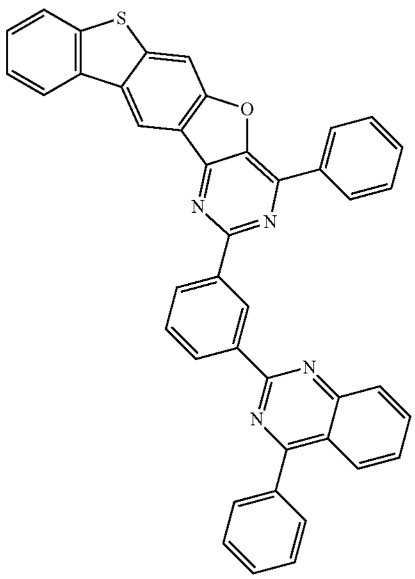
[Compound 83]
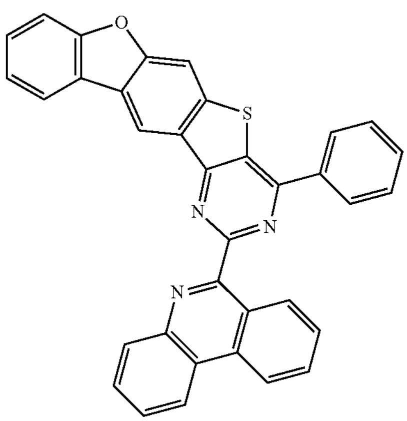
[Compound 84]
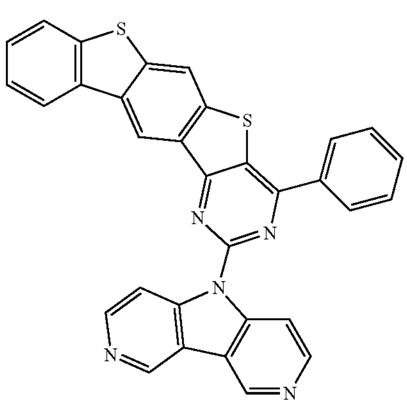
-continued
[Compound 85]
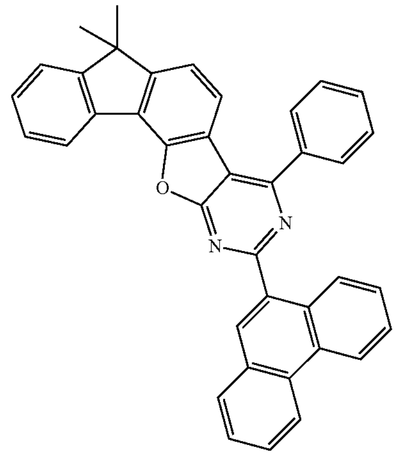
[Compound 86]
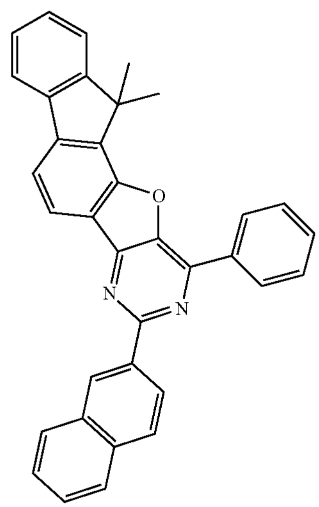
[Compound 87]
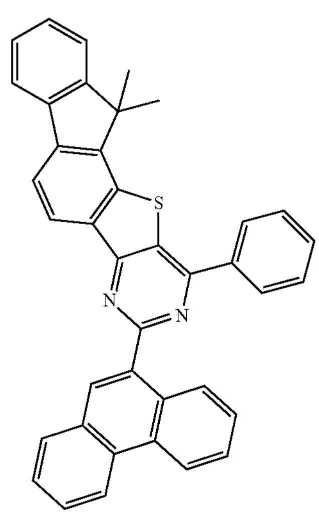

-continued
[Compound 88]
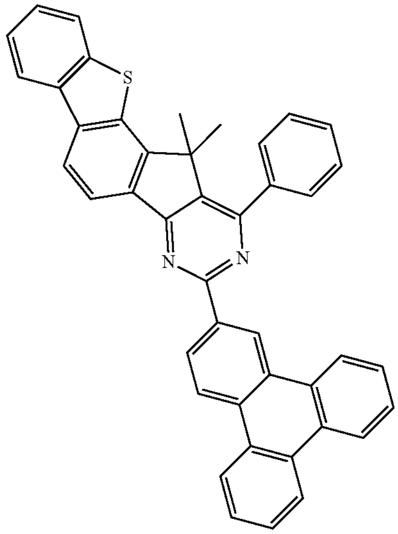
[Compound 89]
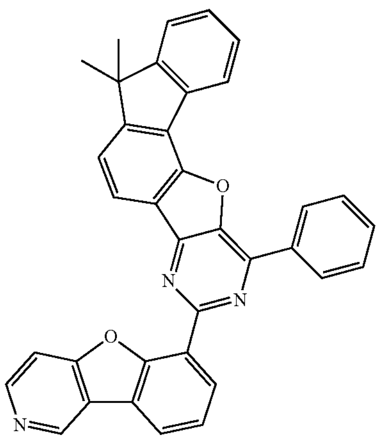
[Compound 90]
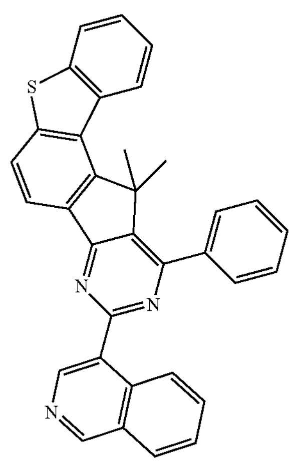
-continued
[Compound 91]
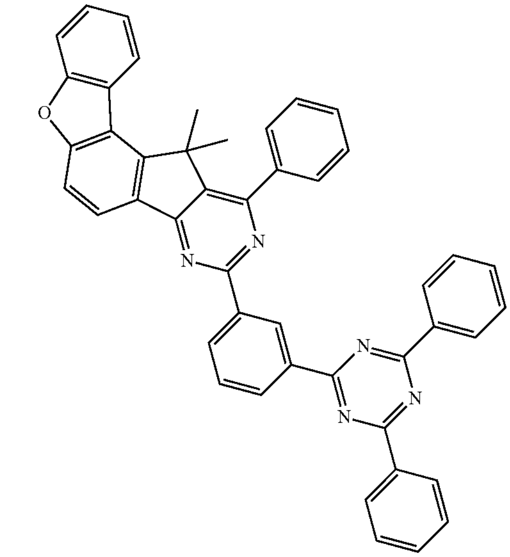
[Compound 92]
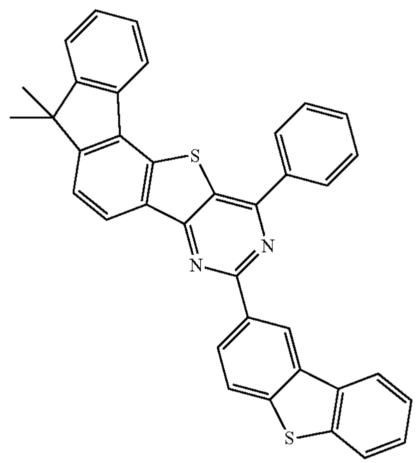
[Compound 93]
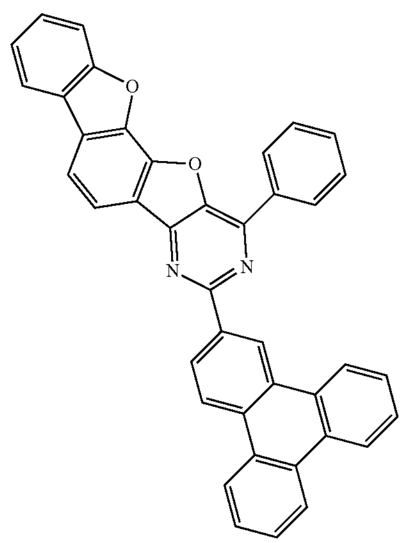

-continued
[Compound 94]
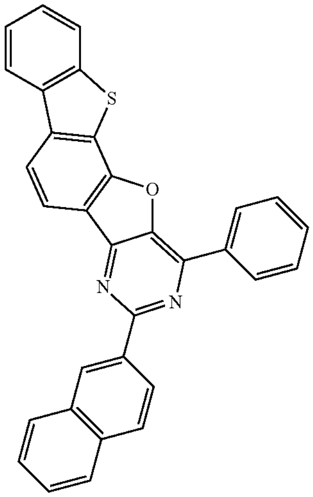
[Compound 95]
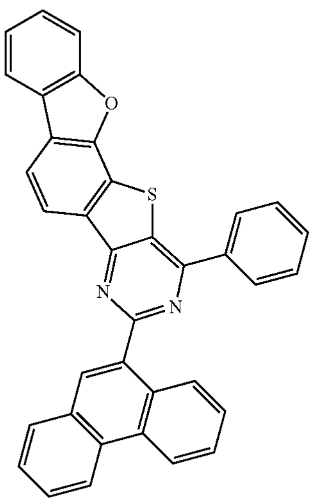
[Compound 96]
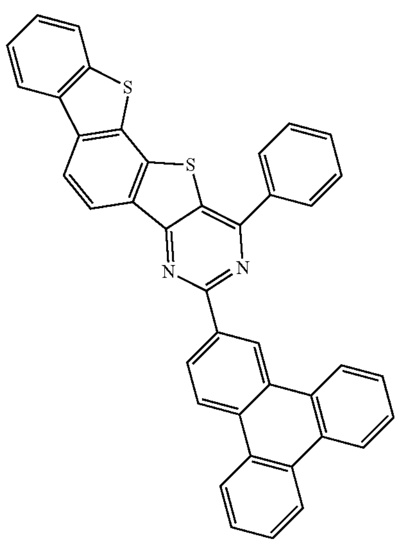
-continued
[Compound 97]
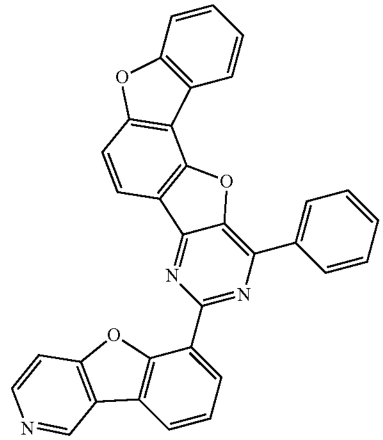
[Compound 98]
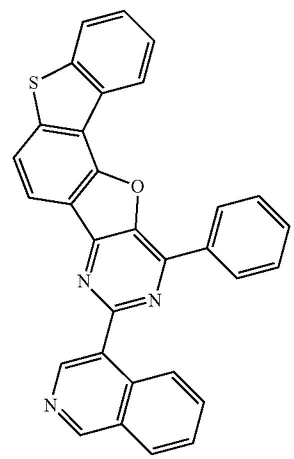
[Compound 99]
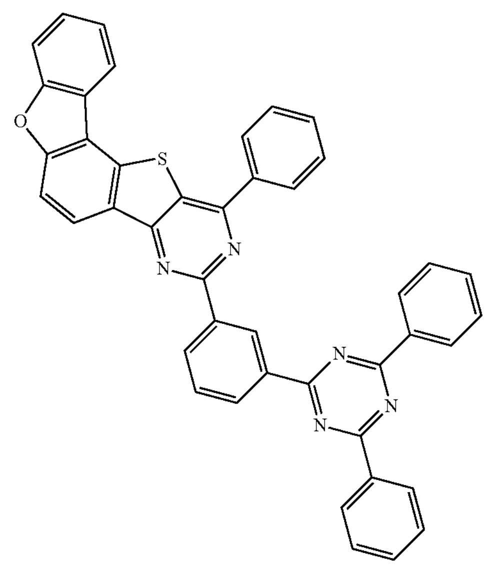

-continued
[Compound 100]
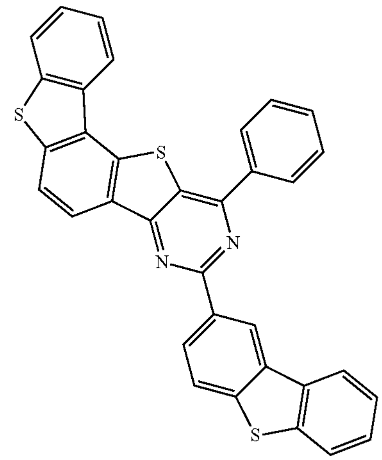
[Compound 101]
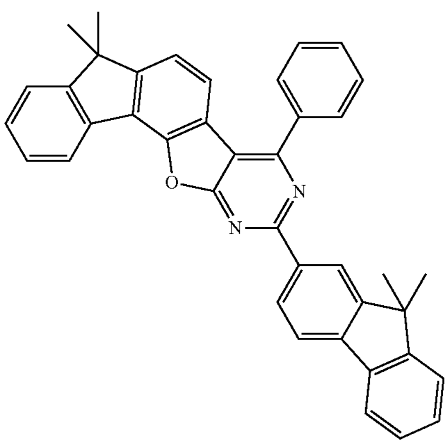
[Compound 102]
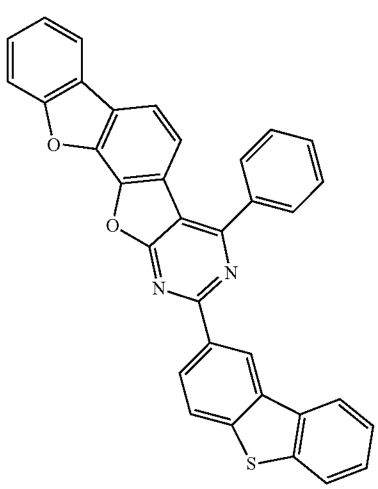
-continued
[Compound 103]
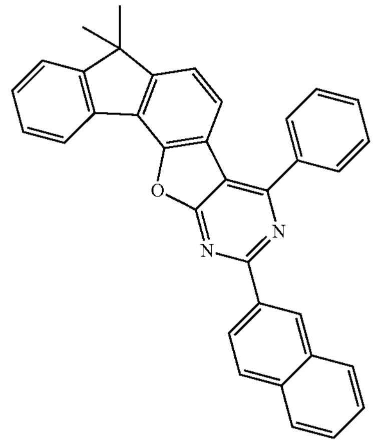
[Compound 104]
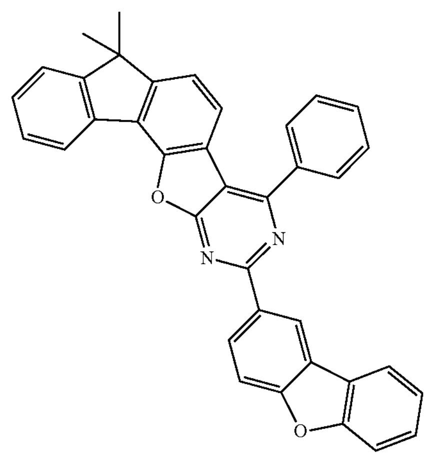
[Compound 105]
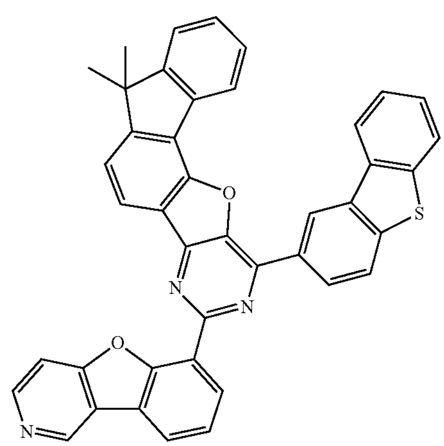

-continued
[Compound 106]
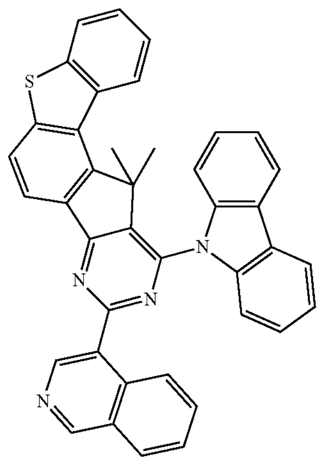
[Compound 107]
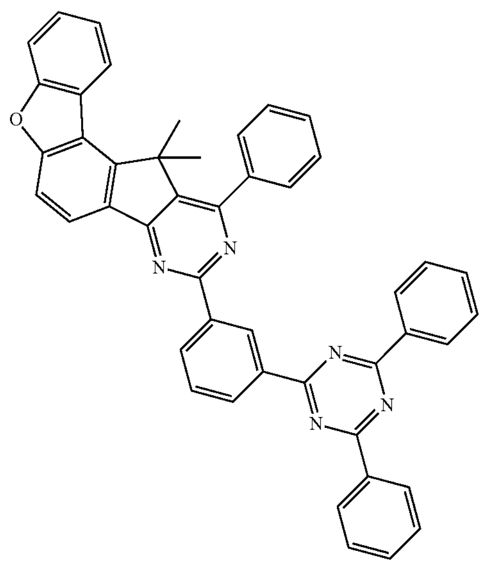
[Compound 108]
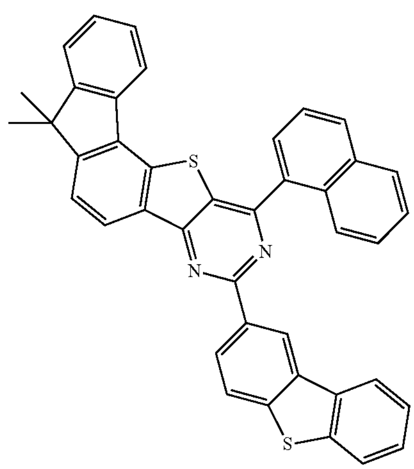
-continued
[Compound 109]
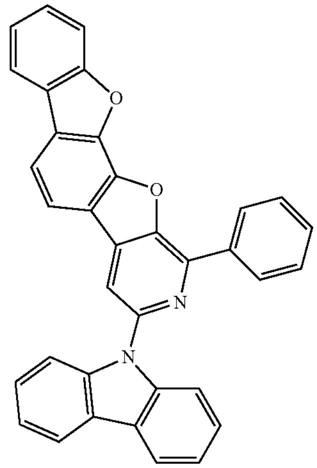
[Compound 110]
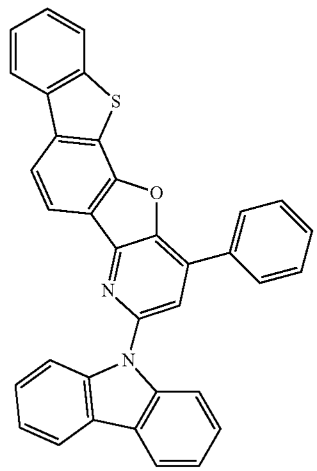
[Compound 111]
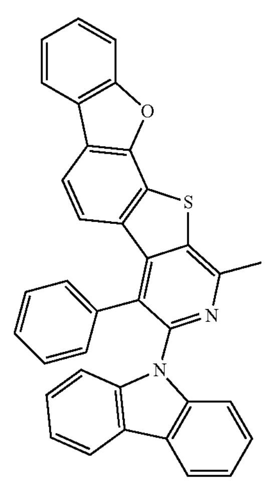

-continued

[Compound 112]

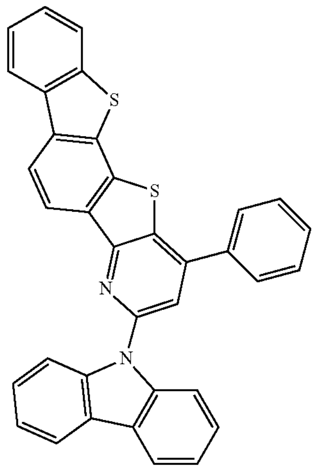

[Compound 113]

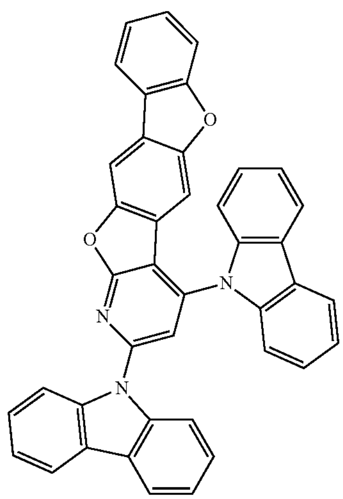

[Compound 114]

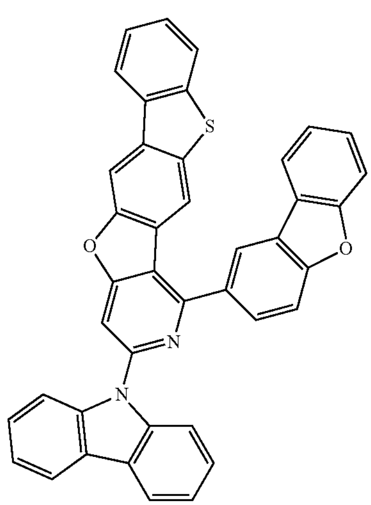

-continued

[Compound 115]

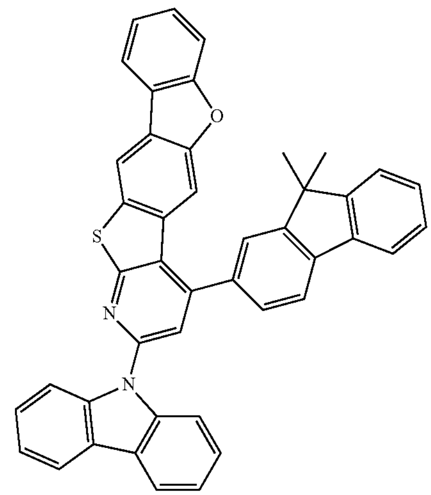

[Compound 116]

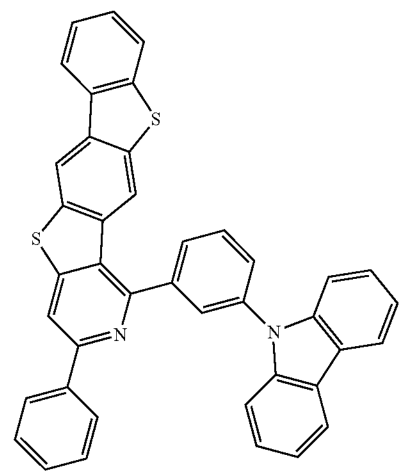

In addition, the present disclosure concerns an organic light-emitting diode comprising: a first electrode; a second electrode facing the first electrode; and an organic layer interposed therebetween, wherein the organic layer comprises at least one of the heterocyclic compounds of the present disclosure.

As used herein, the expression "(the organic layer) . . . comprising at least one organic compound" is construed to mean that the organic layer may comprise one organic compound falling within the scope of the present disclosure or two or more different compounds falling within the scope of the present disclosure.

According to some particular embodiments of the present disclosure, the organic layer may comprise at least one of a hole injection layer, a hole transport layer, a functional layer capable of both hole injection and hole transport, a light-emitting layer, an electron transport layer, and an electron injection layer. In this regard, the organic layer interposed between the first electrode and the second electrode may comprise a light-emitting layer composed of a host and a dopant wherein the heterocyclic compound of the present disclosure is used as the host. In another embodiment, the host may further comprise a heterocyclic compound represented by the following Chemical Formula B:

[Chemical Formula B]

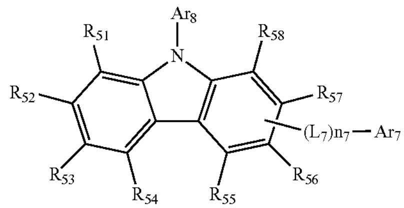

wherein,

L7 is a single bond or a linker selected from among a substituted or unsubstituted alkylene of 1 to 20 carbon atoms, a substituted or unsubstituted alkenylene of 2 to 20 carbon atoms, a substituted or unsubstituted alkynylene of 2 to 20 carbon atoms, a substituted or unsubstituted cycloalkylene of 3 to 20 carbon atoms, a substituted or unsubstituted heterocycloalkylene of 2 to 20 carbon atoms, a substituted or unsubstituted arylene of 6 to 20 carbon atoms, and a substituted or unsubstituted heteroarylene of 2 to 20 carbon atoms, n7 is an integer of 0 to 2, Ar7 and Ar8 may be the same or different and are each independent as defined above for Ar1 to Ar4, R51 to R58 may be the same or different and are each independent as defined above R1 to R12, and one of R55 to R58 is a single bond connected to L7.

Concrete examples of the heterocyclic compounds represented by Chemical Formula B include compounds represented by the following Compounds 117 to 136, but are not limited thereto.

[Compound 117]

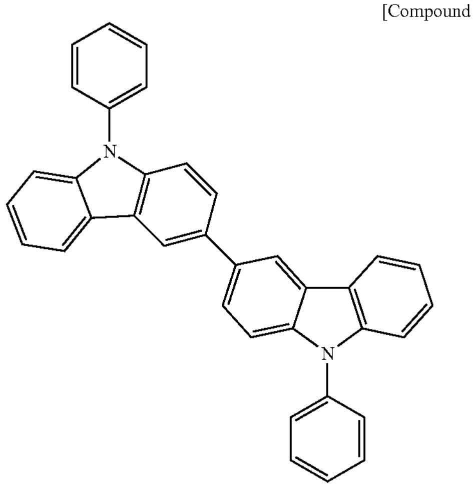

-continued

[Compound 118]

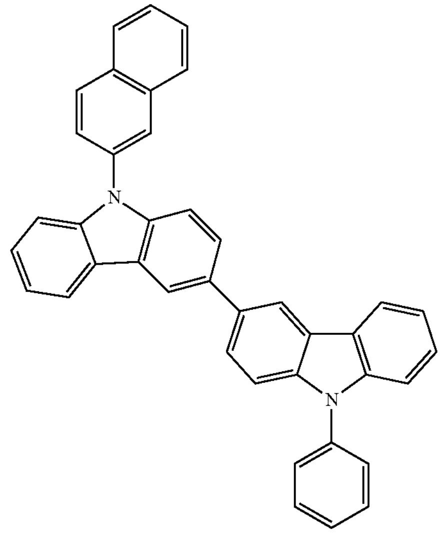

[Cmpound 119]

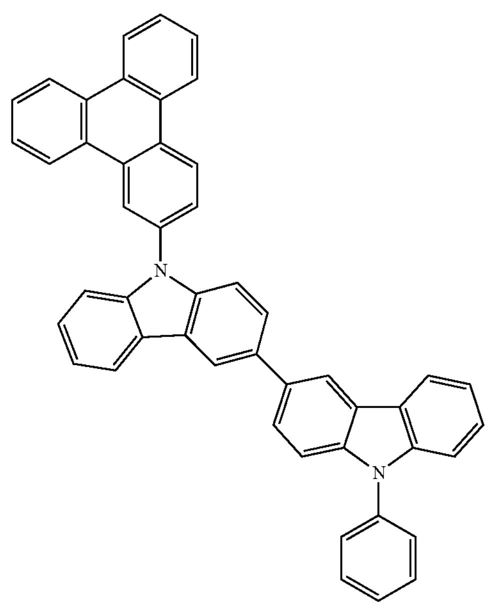

-continued
[Compound 120]
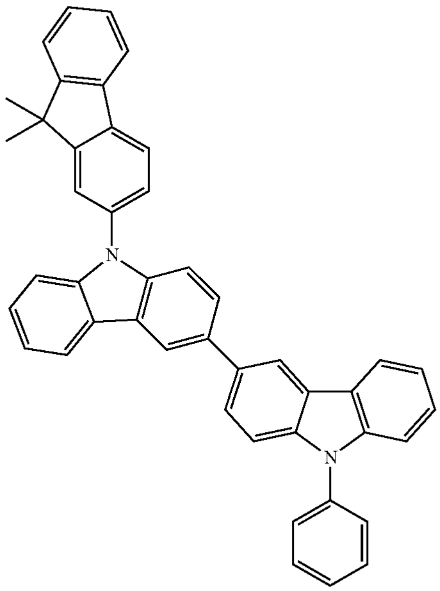
[Compound 121]
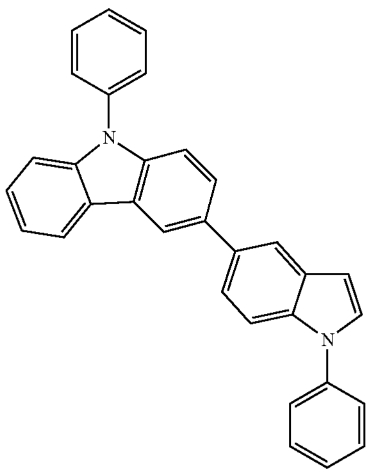
[Compound 122]
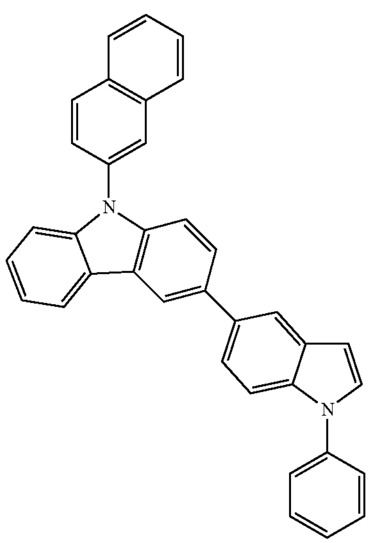
-continued
[Compound 123]
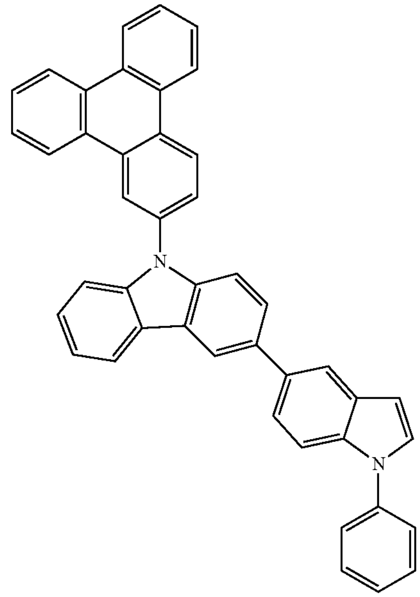
[Compound 124]
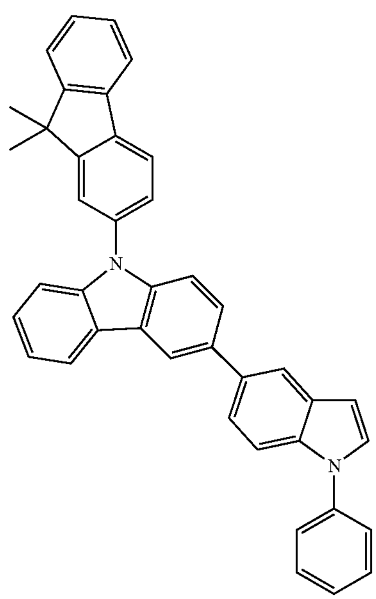

[Compound 125]
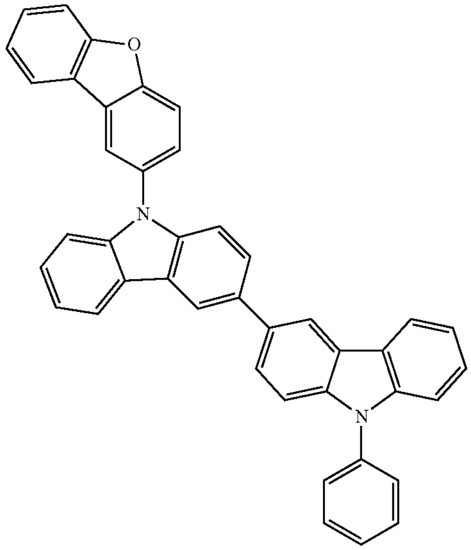
[Compound 127]
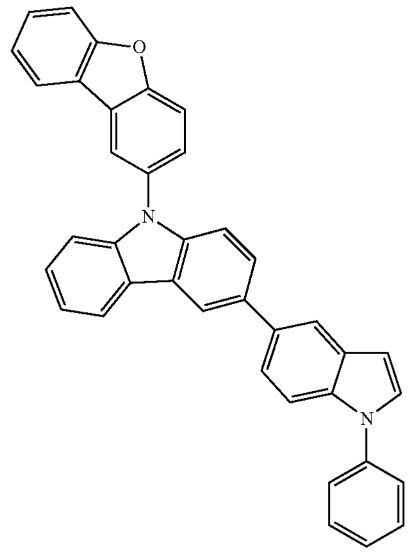
[Compound 126]
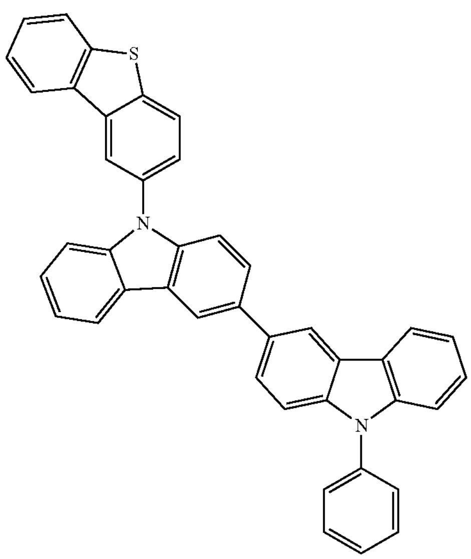
[Compound 128]
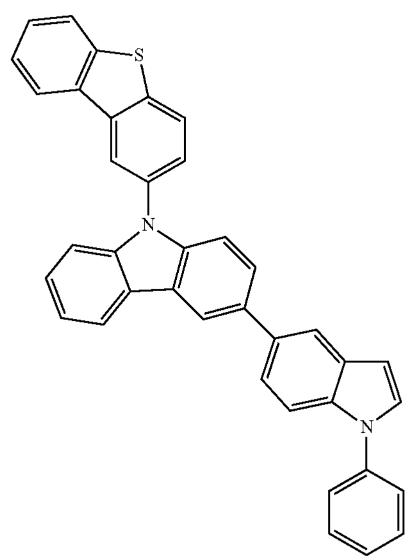

-continued
[Compound 129]
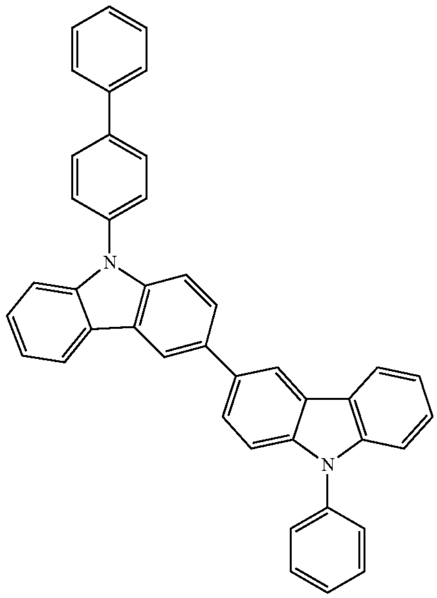
[Compound 130]
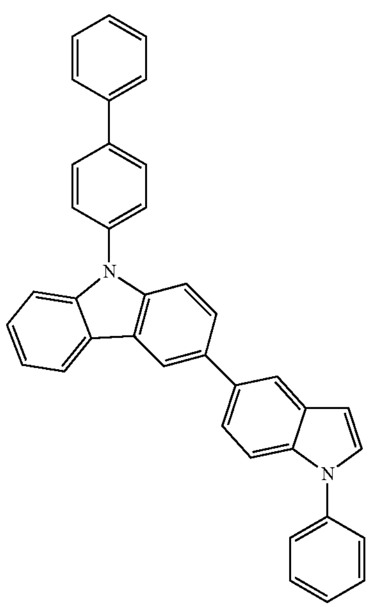
-continued
[Compound 131]
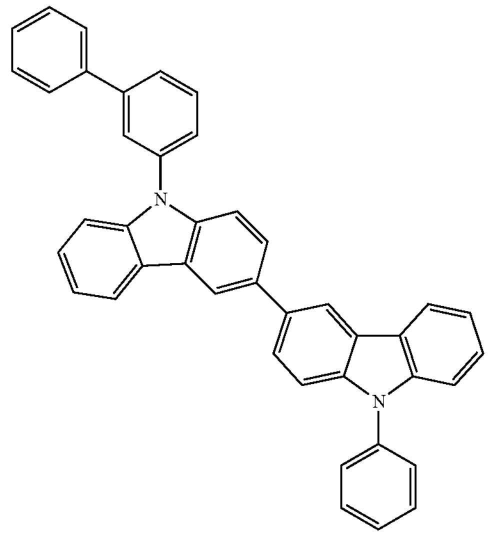
[Compound 132]
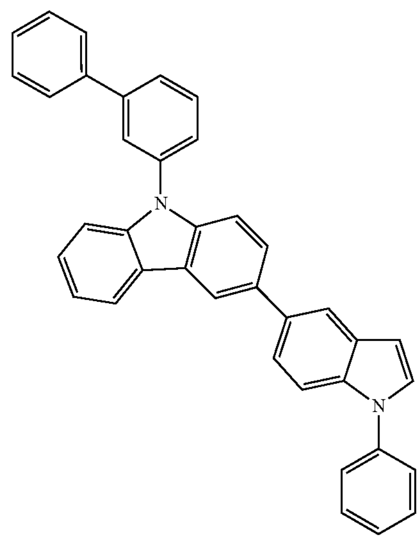
[Compound 133]
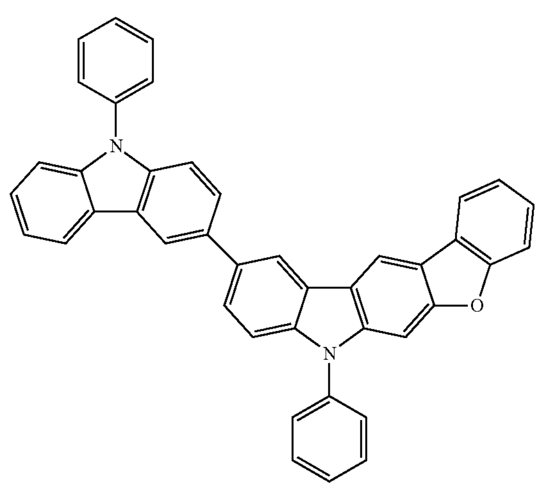

-continued

[Compound 134]

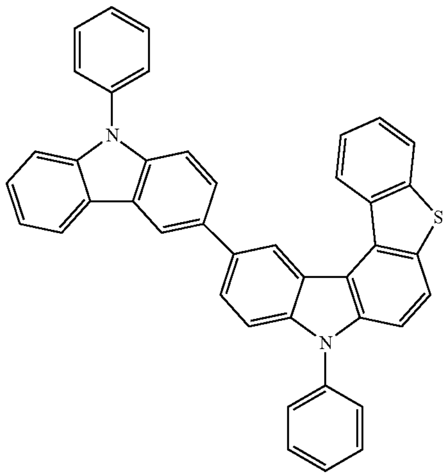

[Compound 135]

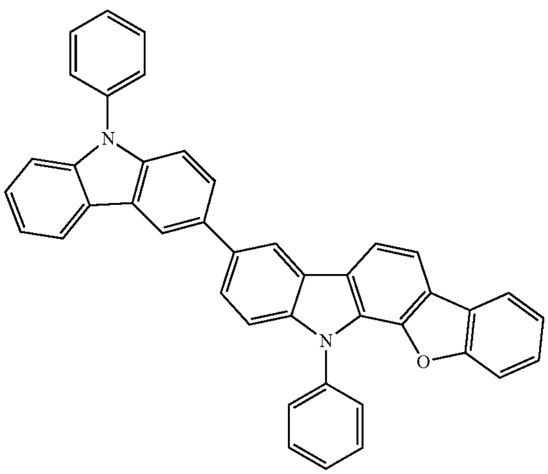

[Compound 136]

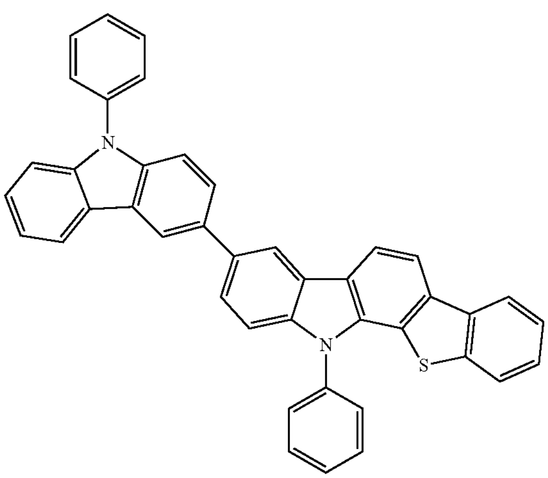

According to the present disclosure, a dopant material may be used, together with a host, in the light-emitting layer. When the light-emitting layer comprises a host and a dopant, the content of the dopant in the light-emitting layer may range from about 0.01 to 20 parts by weight based on 100 parts by weight of the host, but is not limited thereto.

Also, the light-emitting layer may further comprise various dopant and host materials in addition to the dopant and the host.

When the heterocyclic compound of the present disclosure is used as a host, the organic layer may further comprise a hole barrier layer or an electron barrier layer.

In addition, the organic layer interposed between the first electrode and the second electrode may comprise an electron transport layer and the heterocyclic compound of the present disclosure may be used for the electron transport layer.

So long as it functions to stably transport the electrons from the cathode, any known material may be used for the electron transport layer. Examples of the known electron transport material include quinoline derivatives, particularly tris(8-quinolinolate)aluminum (Alq3), Liq, TAZ, Balq, beryllium bis(benzoquinolin-10-oate: Bebq2), ADN, compound 201, compound 202, and the oxadiazole derivatives PBD, BMD, and BND, but are not limited thereto.

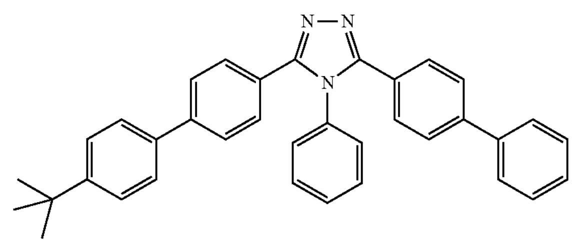

TAZ

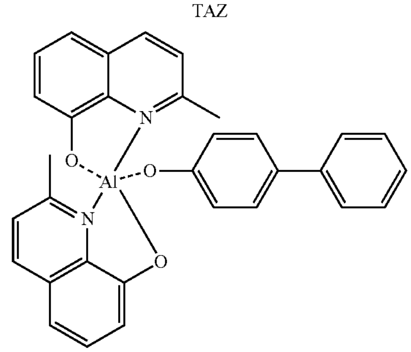

BAlq

<Compound 201>

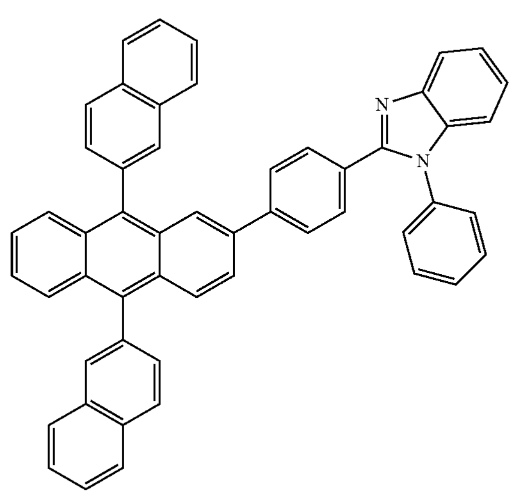

-continued

<Compound 202>

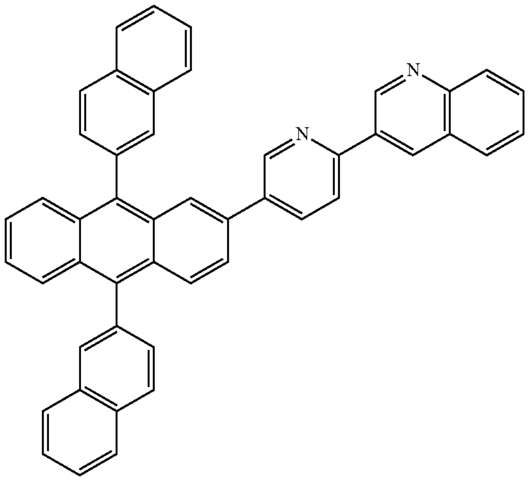

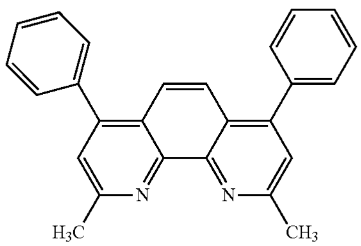

BCP

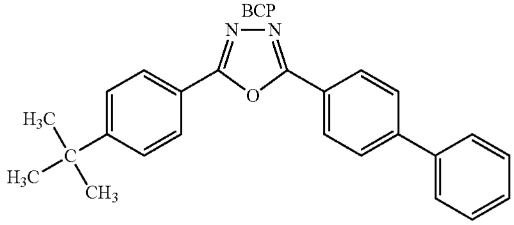

PBD

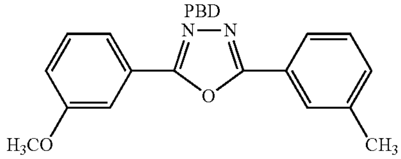

BMD

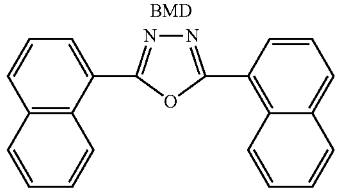

BND

Below, the organic light-emitting diode of the present disclosure is explained with reference to FIGURE.

FIGURE is a schematic cross-sectional view of the structure of an organic light-emitting diode according to some embodiments of the present disclosure. The organic light-emitting diode comprises an anode 20, a hole transport layer 40, an organic light-emitting layer 50, an electron transport layer 60, and a cathode 80, and optionally a hole injection layer 30 and an electron injection layer 70. In addition, one or two intermediate layers may be further formed in the organic light-emitting diode, or a hole barrier layer or an electron barrier layer may also be employed.

Reference is made to FIGURE with regard to the fabrication of the organic light-emitting diode of the present disclosure. First, a substrate 10 is coated with an anode electrode material to form an anode 20. So long as it is used in a typical organic EL device, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode electrode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imposed on the hole injection layer material, as long as it is one that is typically used in the art. For example, mention may be made of 2-TNATA [4,4',4"-tris(2-naphthylphenyl-phenylamino)-triphenylamine], NPD [N,N'-di(1-naphthyl)-N,N'-diphenylbenzidine], TPD [N,N'-diphenyl-N,N'-bis(3-methylphenyl)-1,1'-biphenyl-4,4'-diamine], and DNTPD [N,N'-diphenyl-N,N'-bis-[4-(phenyl-m-tolyl-amino)-phenyl]-biphenyl-4,4'-diamine], but is not limited thereto.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD), and N,N'-di(naphthalen-1-yl)-N,N'-diphenylbenzidine (a-NPD).

Then, an organic light-emitting layer 50 is deposited on the hole transport layer 40, optionally followed by the formation of a hole barrier layer (not shown) on the organic light-emitting layer 50 by deposition in a vacuum or by spin coating. When holes traverse the organic light-emitting layer and are introduced into the cathode, the efficiency and lifespan of the diode are deteriorated. Formed of a material with a low HOMO (Highest Occupied Molecular Orbital) level, the hole barrier layer serves to prevent the introduction of holes into the cathode. Any material that has a higher ionization potential than the light-emitting compound and which is also able to carry electrons may be used for the hole barrier layer without limitation. Representative among hole barrier materials are BAlq, BCP, and TPBI.

A material available for the hole barrier layer may be selected from among, but not limited to, BAlq, BCP, Bphen, TPBI, NTAZ, BeBq2, OXD-7, Liq, and compounds of Chemical Formulas 1001 to 1007.

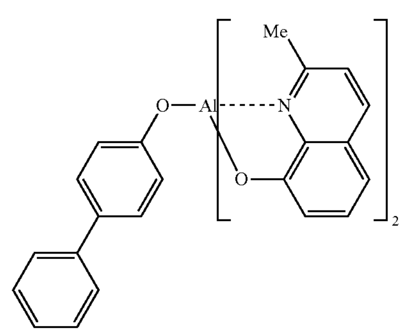

BAlq

-continued
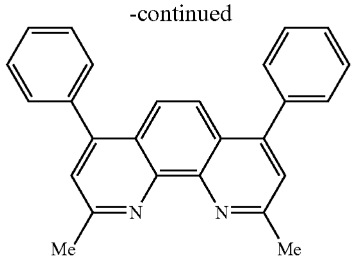
BCP
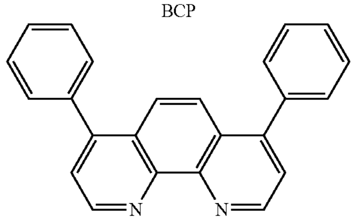
Bphen
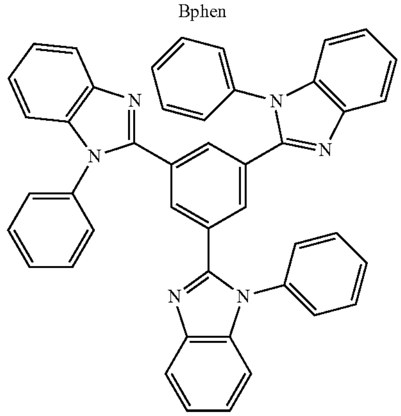
TPBI
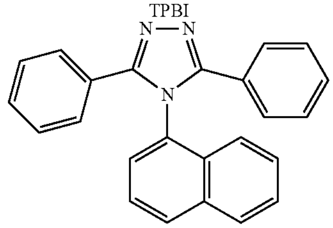
NTAZ
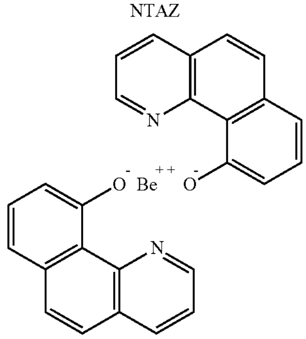
BeBq2
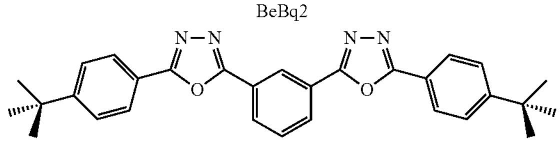
OXD-7
-continued
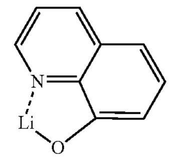
Liq
Chemical Formula 1001
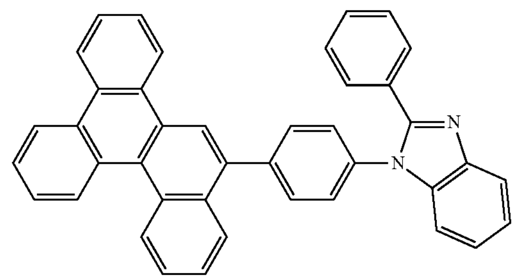
Chemical Formula 1002
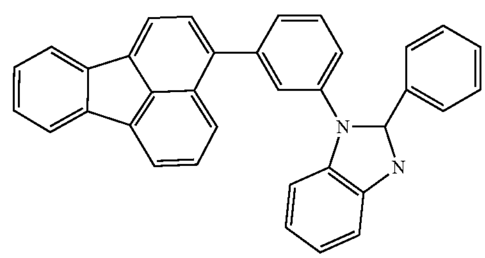
Chemical Formula 1003
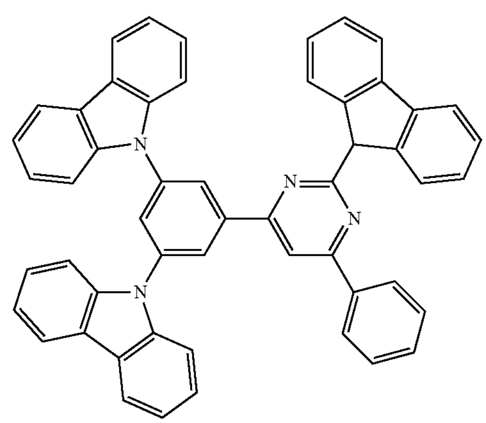

-continued

Chemical Formula 1004

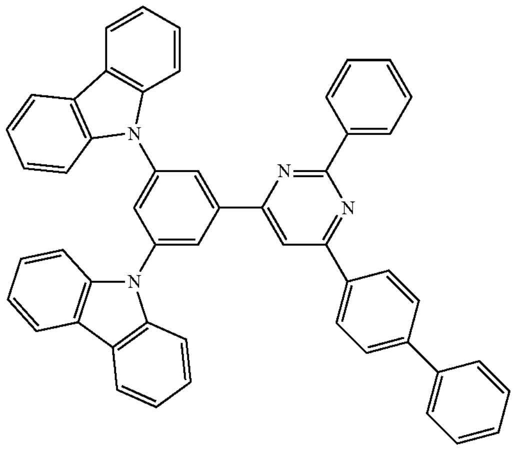

Chemical Formla 1005

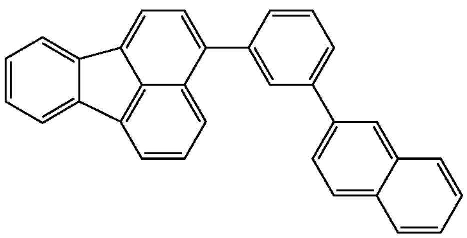

Chemical Formula 1006

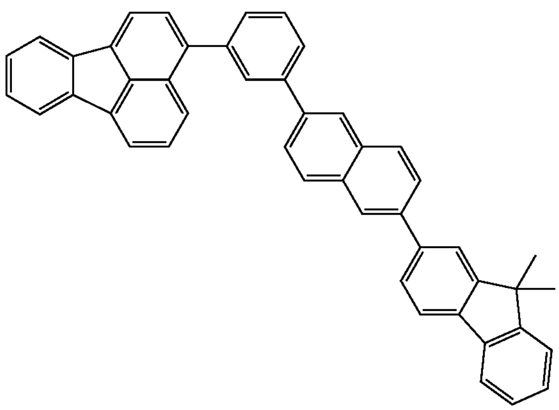

Chemical Formula 1007

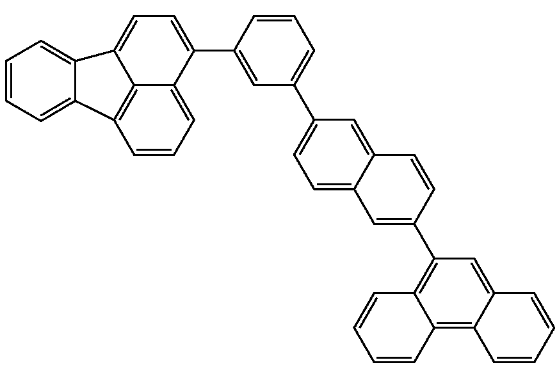

Using a vacuum deposition method or a spin-coating method, an electron transport layer 60 may be deposited on the hole barrier layer and may then be overlaid with an electron injection layer 70. A cathode metal is deposited on the electron injection layer 70 by thermal deposition in a vacuum to form a cathode 80, thus obtaining an organic EL diode. Here, the cathode may be made of lithium (Li), magnesium (Mg), aluminum (Al), aluminum-lithium (Al—Li), calcium (Ca), magnesium-indium (Mg—In), or magnesium-silver (Mg—Ag). For a top-emitting OLED, a transparent cathode made of ITO or IZO may be employed.

In some embodiments of the present disclosure, the light-emitting layer particularly ranges in thickness from 50 to 2,000 Å, and comprises a host and a dopant wherein the heterocyclic compound is used as the host and a conventional material and particularly a phosphorescent dopant material may be used as the dopant.

Also, the light-emitting layer may further comprise various dopant and host materials in addition to the dopant and the host.

Further, one or more layers selected from among a hole injection layer, a hole transport layer, a functional layer capable of both hole injection and hole transport, an electron barrier layer, a light-emitting layer, a hole barrier layer, an electron transport layer, and an electron injection layer may be deposited using a single-molecule deposition process or a solution process. Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present disclosure.

SYNTHESIS EXAMPLES

Synthesis Example 1: Synthesis of Compound 1

Synthesis Example 1-1: Synthesis of Intermediate 1-a

Intermediate 1-a was synthesized as illustrated in the following Reaction Scheme 1:

[Reaction Scheme 1]

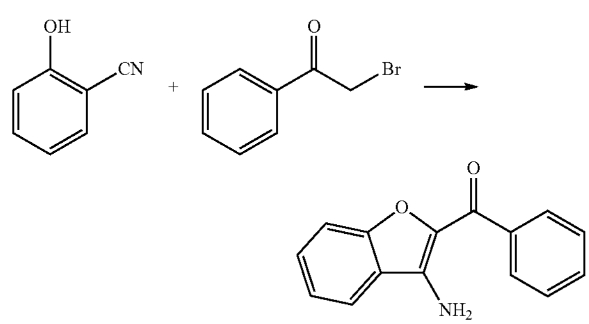

<Intermediate 1-a>

In a 2-L round bottom flask reactor, a mixture of 2-cyanophenol (24.5 g, 206 mmol), 2-bromoacetophenone (40.9 g, 206 mmol), potassium carbonate (85.3 g, 617 mmol), and acetone (980 mL) was stirred at 60° C. for 12 hrs. After completion of the reaction, the reaction solution was cooled to room temperature and filtered with acetone. The filtrate was concentrated, followed by recrystallization to afford intermediate 1-a (37 g, 76%).

Synthesis Example 1-2: Synthesis of Intermediate 1-b

Intermediate 1-b was synthesized as illustrated in the following Reaction Scheme 2.

[Reaction Scheme 2]

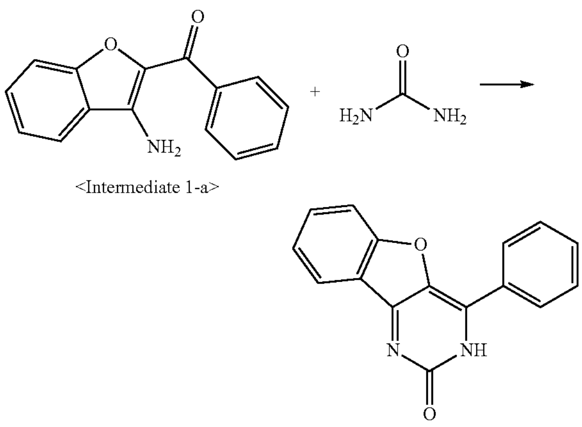
<Intermediate 1-a>
<Intermediate 1-b>

In a 500-mL round-bottom flask reactor, a mixture of Intermediate 1-a (37 g, 156 mmol), urea (16.9 g, 281 mmol), and acetic acid (185 mL) was stirred under reflux for 12 hrs. After completion of the reaction, the reaction solution was added with an excess of water to form precipitates which were filtered. The filtrate was hot slurried with methanol, filtered, hot slurried again with toluene, filtered, and dried to afford Intermediate 1-b. (24 g, 59%)

Synthesis Example 1-3: Synthesis of Intermediate 1-c

Intermediate 1-c was synthesized as illustrated in the following Reaction Scheme 3:

[Reaction Scheme 3]

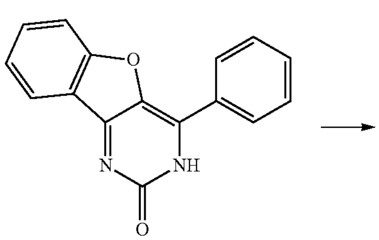
<Intermediate 1-b>

-continued

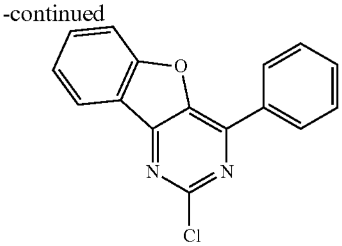
<Intermediate 1-c>

In a 500-mL round-bottom flask reactor, Intermediate 1-b (15 g, 44 mmol) and phosphorus oxychloride (150 mL) was stirred under reflux for 3 hrs. After completion of the reaction, the reaction solution was slowly added to an excess of water at 0° C. to form precipitates which were then filtered. Separation by column chromatography gave Intermediate 1-c. (21 g, 82%)

Synthesis Example 1-4: Synthesis of Intermediate 1-d

Intermediate 1-d was synthesized as illustrated in the following Reaction Scheme 4:

[Reaction Scheme 4]

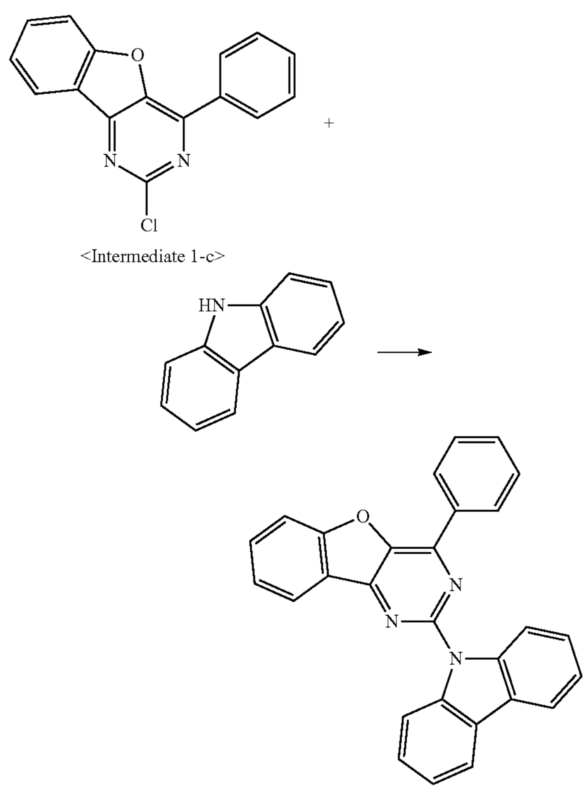
<Intermediate 1-c>
<Intermediate 1-d>

In a 250 mL round-bottom flask reactor, carbazole (10 g, 60 mmol) was stirred, together with dimethylform amide (100 mL), and then together with 60% sodium hydride (0.8 g, 105 mmol) for 1 hr. Intermediate 1-c (4.1 g, 15 mmol) was dissolved in dimethylformamide (80 mL) and then added to the reaction solution for 1 hr before stirring for 3 hrs. After completion of the reaction, the reaction mixture was poured into an excess of water to induce crystallization. Subsequently, filtration and recrystallization gave Intermediate 1-d. (8.3 g, 57%)

Synthesis Example 1-5: Synthesis of Intermediate 1-e

Intermediate 1-e was synthesized as illustrated in the following Reaction Scheme 5:

[Reaction Scheme 5]

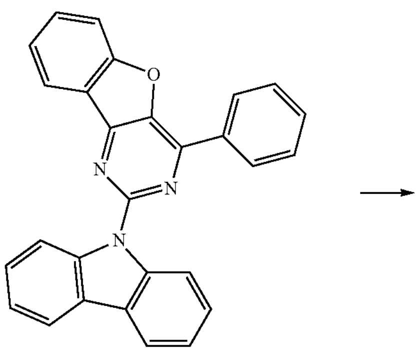

<Intermediate 1-d>

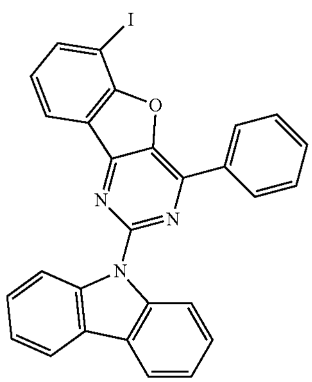

<Intermediate 1-e>

In a dry 1-L round-bottom flask reactor, Intermediate 1-d (52 g, 126 mmol) was dissolved in tetrahydrofuran (520 mL) under a nitrogen stream and slowly added with drops of 1.6 M n-butyl lithium (155 mL, 247 mmol) while stirring at −78° C. At the same temperature, stirring was continued for 1 hr after the dropwise addition was completed. Thereafter, drops of trimethyl borate (30.8 g, 297 mmol) were slowly added, and stirred for 1 hr at room temperature. After completion of the reaction, 2 N HCl (200 mL) was dropwise added at room temperature, and stirred for 30 min. Following extraction with ethylacetate and water, the organic layer was concentrated at a reduced pressure and recrystallized to afford Intermediate 1-e. (24 g, 35%)

Synthesis Example 1-6: Synthesis of Intermediate 1-f

Intermediate 1-f was synthesized as illustrated in the following Reaction Scheme 6:

[Reaction Scheme 6]

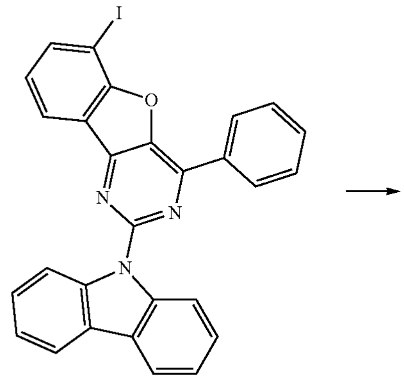

[Intermediate 1-e]

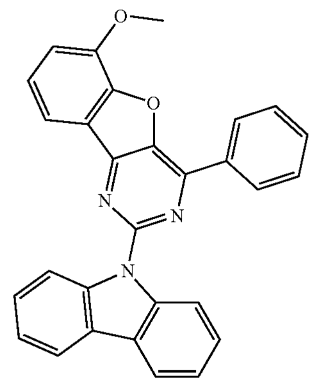

[Intermediate 1-f]

In a 500-mL round-bottom flask reactor, a mixture of Intermediate 1-e (70 g, 130 mmol), sodium methoxide (33.6 g, 622 mmol), copper bromide (6 g, 25 mmol), dimethylformamide (420 mL), and methanol (140 mL) was stirred under reflux. After completion of the reaction, the reaction mixture was extracted with dichloromethane and water and the organic layer thus formed was separated and purified by column chromatography to afford Intermediate 1-f. (42 g, 73%)

Synthesis Example 1-7: Synthesis of Intermediate 1-g

Intermediate 1-g was synthesized as illustrated in the following Reaction Scheme 7:

[Reaction Scheme 7]

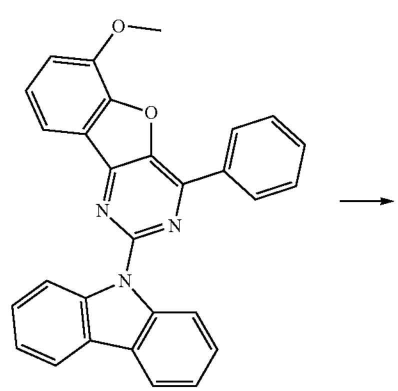

[Intermediate 1-f]

-continued

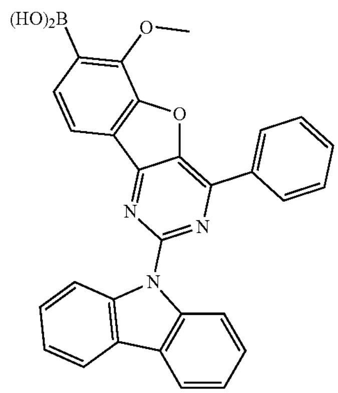

[Intermediate 1-g]

In a dry 1-L round-bottom flask reactor, Intermediate 1-f (42 g, mmol) was dissolved in tetrahydrofuran (420 ml) under nitrogen stream, and then and slowly added with drops of 1.6 M n-butyl lithium (155 mL, 247 mmol) while stirring at −78° C. At the same temperature, stirring was continued for 1 hr after the dropwise addition was completed. Subsequently, drops of trimethyl borate (30.8 g, 297 mmol) were slowly added, and stirred for 1 hr at room temperature. After completion of the reaction, 2 N HCl (200 mL) was dropwise added at room temperature, and stirred for 30 min. Following extraction with ethylacetate and water, the organic layer was concentrated at a reduced pressure and recrystallized to afford Intermediate 1-g. (34 g, 74%)

Synthesis Example 1-8: Synthesis of Intermediate 1-h

Intermediate 1-h was synthesized as illustrated in the following Reaction Scheme 8:

[Reaction Scheme 8]

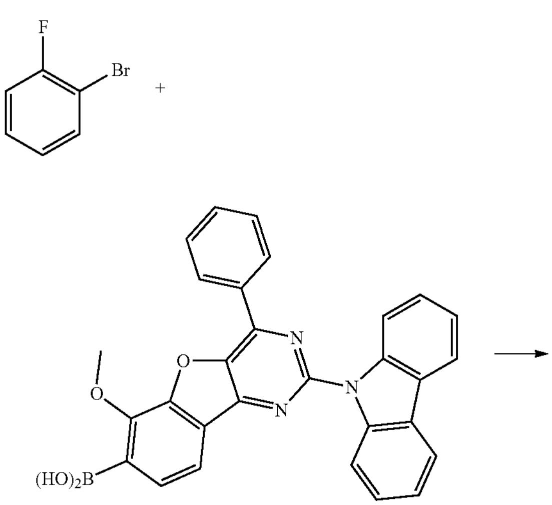

[Intermediate 1-g]

-continued

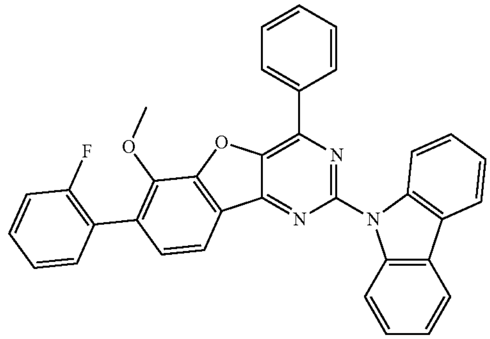

[Intermediate 1-h]

In a 300-mL round-bottom flask reactor, a mixture of bromo-2-fluorobenzene (31.7 g, 181 mmol), Intermediate 1-g (20 g, 41 mmol), potassium carbonate (26.4 g, 191 mmol), tetrakistriphenylphosphine palladium (2.2 g, 2 mmol), water (80 mL), toluene (150 mL), and 1,4-dioxane (150 mL) was stirred under reflux for 12 hrs. After completion of the reaction, the reaction mixture was layer separated, and the organic layer was concentrated at a reduced pressure. Column chromatographic separation yielded Intermediate 1-h. (15 g, 68%)

Synthesis Example 1-9: Synthesis of Intermediate 1-i

Intermediate 1-i was synthesized as illustrated in the following Reaction Scheme 9:

[Reaction Scheme 9]

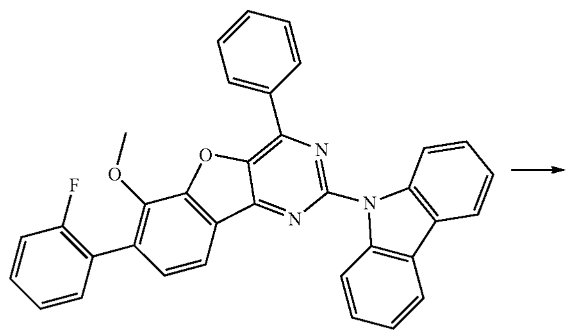

<Intermediate 1-h>

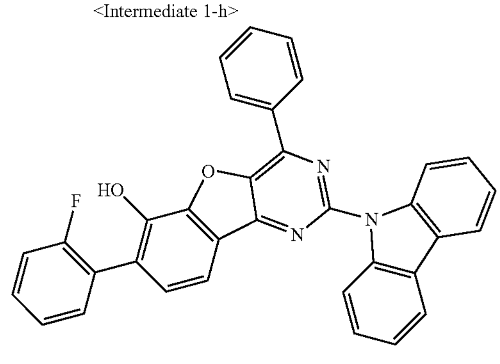

<Intermediate 1-i>

In a 1-L round-bottom flask reactor, Intermediate 1-h (26 g, 49 mmol), a mixture of acetic acid (150 mL) and hydrogen bromide (250 mL) was stirred under reflux for 24 hrs. After completion of the reaction, the addition of an excess of water induced precipitation and the solid was filtered. Separation by column chromatography afforded Intermediate 1-i. (10.5 g, 42%)

Synthesis Example 1-10: Synthesis of Compound 1

Compound 1 was synthesized as illustrated in the following Reaction Scheme 10:

[Reaction Scheme 5]

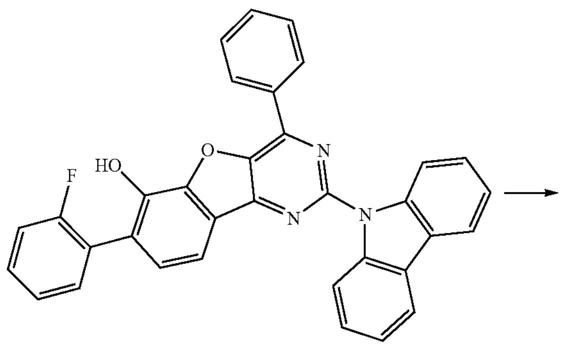

<Intermediate 1-i>

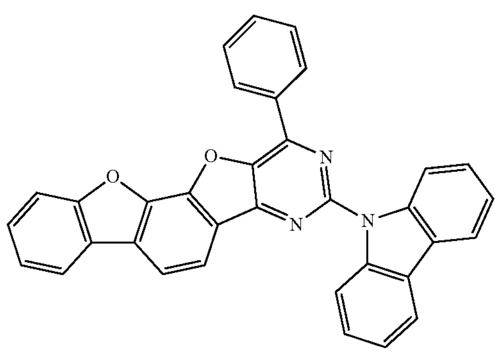

<Compound 1>

In a 250-mL round-bottom flask reactor, a mixture of Intermediate 1-i (8 g, 15 mmol), potassium carbonate (4.8 g, 34 mmol), and 1-methyl-2-pyrrolidone (100 mL) was stirred under reflux for 12 hrs. After completion of the reaction, a solid was precipitated in an excess of water. Column chromatographic separation afforded Compound 1. (4.2 g, 55%)

MS (MALDI-TOF): m/z 501.15[M+]

Synthesis Example 2: Synthesis of Compound 6

Synthesis Example 2-1: Synthesis of Intermediate 2-a

Intermediate 2-a was synthesized as illustrated in the following Reaction Scheme 11:

[Reaction Scheme 11]

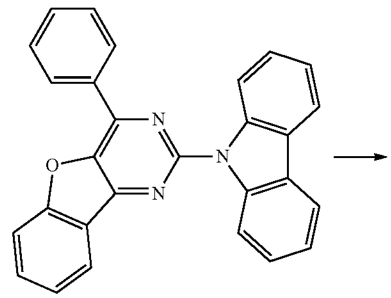

<Intermediate 1-d>

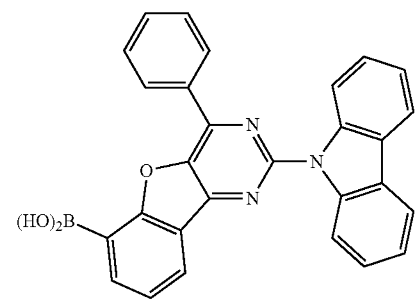

<Intermediate 2-a>

Intermediate 2-a was synthesized in the same manner as in Synthesis Example 1-7, with the exception of using Intermediate 1-d instead of Intermediate 1-f. (52.3 g, 71%)

Synthesis Example 2-2: Synthesis of Intermediate 2-b

Intermediate 2-b was synthesized as illustrated in the following Reaction Scheme 12:

[Reaction Scheme 12]

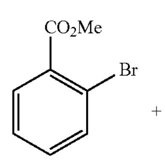

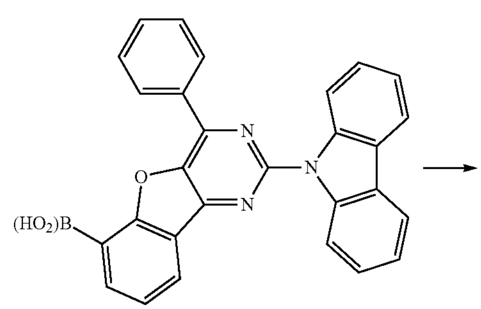

<Intermediate 2-a>

-continued

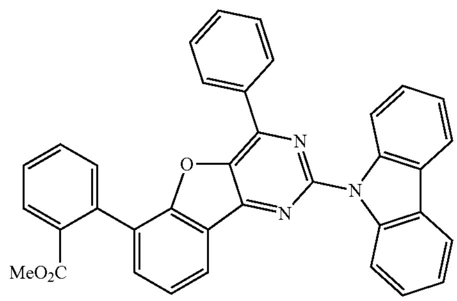

<Intermediate 2-b>

Intermediate 2-b was synthesized in the same manner as in Synthesis Example 1-8, with the exception of using bromo-2-fluorobenzene and Intermediate 2-a instead of 2-bromobenzoate and Intermediate 1-g, respectively. (25.6 g, 71%)

Synthesis Example 2-3: Synthesis of Compound 6

Compound 6 was synthesized as illustrated in the following Reaction Scheme 13:

[Reaction Scheme 13]

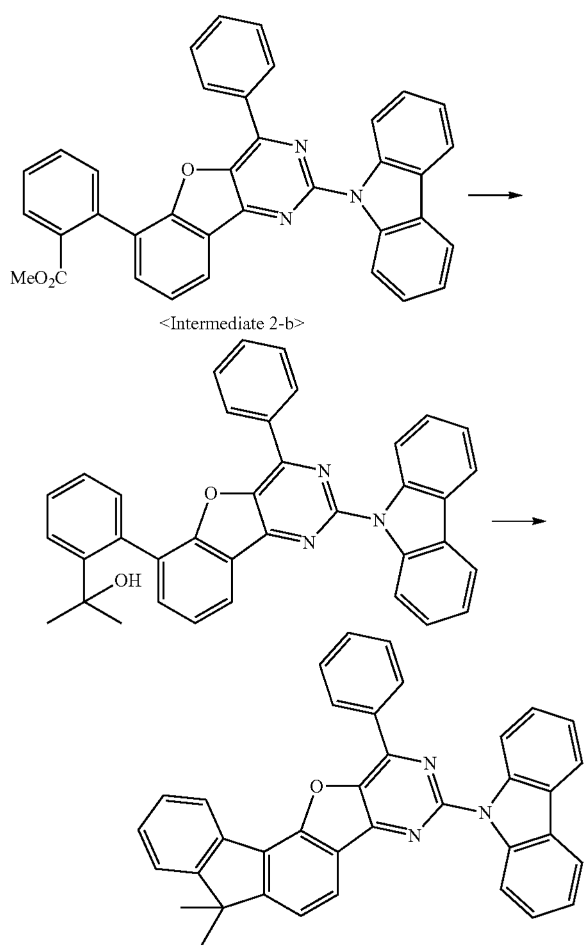

<Intermediate 2-b>

<Compound 6>

In a dry 300-mL round-bottom flask reactor, Intermediate 2-b (15 g, 28 mmol) and tetrahydrofuran (100 mL) were placed, and methyl magnesium bromide (10 mL, 300 mmol) was dropwise added at 0° C. Then, the mixture was stirred for 3 hrs at room temperature. After completion of the reaction, 2 N HCl (100 mL) was added at 0° C. and stirred for 30 min. The organic layer formed by layer separation with ethyl acetate was concentrated, and stirred, together with acetic acid (100 mL) and HCl (10 mL), under reflux for 10 hrs. After completion of the reaction, the reaction mixture was added with an excess of water, stirred for 30 min, filtered, and isolated by column chromatography to afford Compound 6. (3.6 g, 25%)

MS (MALDI-TOF): m/z 527.2[M+]

Synthesis Example 3: Synthesis of Compound 13

Synthesis Example 3-1: Synthesis of Intermediate 3-a

Intermediate 3-a was synthesized as illustrated in the following Reaction Scheme 14:

[Reaction Scheme 14]

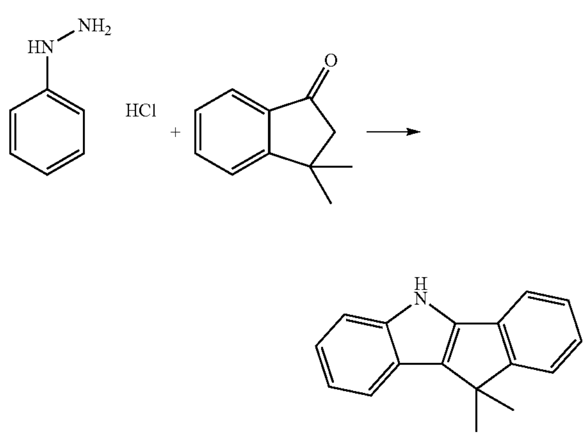

<Intermediate 3-a>

In a 2-L round-bottom flask reactor, acetic acid (600 mL) and HCl (30 mL) were added to 3,3-dimethyl-2,3-dihydro-1H-inden-1-one (60 g, 375 mmol) and phenylhydrazine hydrochloride (87.5 g, 605 mmol) and stirred under reflux for 12 hrs. After completion of the reaction, the reaction mixture was extracted with methylene chloride and water, and the organic layer thus formed was concentrated at a reduced pressure, and purified using column chromatography to afford Intermediate 3-a. (57 g, 65%)

Synthesis Example 3-2: Synthesis of Intermediate 3-b

Intermediate 3-b was synthesized as illustrated in the following Reaction Scheme 15:

[Reaction Scheme 15]

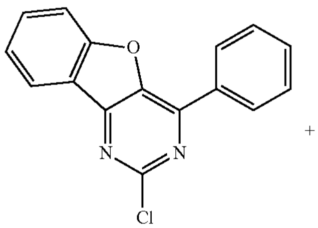

<Intermediate 1-c>

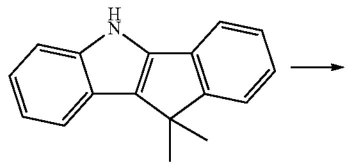

<Intermediate 3-a>

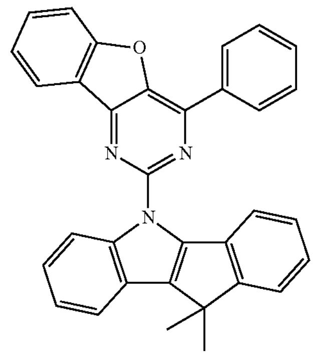

<Intermediate 3-b>

In a dry 500-mL round-bottom flask reactor, a mixture of Intermediate 1-c (30 g, 107 mmol), Intermediate 3-a (26 g, 111 mmol), tris(dibenzylideneacetone) dipalladium (0.39 g, 0.43 mmol), tert-butyl phosphoniumtetrafluoroborate (0.5 g, 1.7 mmol), sodium tert-butoxide (33.23 g, 345.82 mmol), and xylene (100 mL) was stirred for 10 hrs under reflux in a nitrogen atmosphere. After completion of the reaction, the reaction mixture in a hot state was filtered at a reduced pressure. Following drying at a reduced pressure, column chromatographic separation gave Intermediate 3-b. (31 g, 61%)

Synthesis Example 3-3: Synthesis of Intermediate 3-c

Intermediate 3-c was synthesized as illustrated in the following Reaction Scheme 16:

[Reaction Scheme 16]

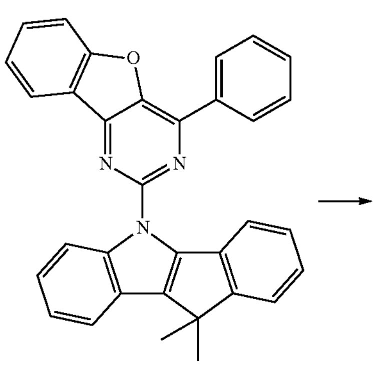

<Intermediate 3-b>

-continued

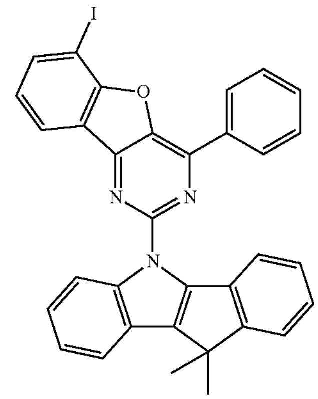

<Intermediate 3-c>

Intermediate 3-c was synthesized in the same manner as in Synthesis Example 1-5, with the exception of using Intermediate 3-b instead of Intermediate 1-d. (23.7 g, 72.1%)

Synthesis Example 3-4: Synthesis of Intermediate 3-d

Intermediate 3-d was synthesized as illustrated in the following Reaction Scheme 17:

[Reaction Scheme 17]

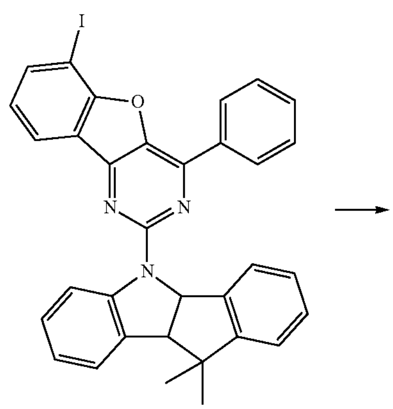

<Intermediate 3-c>

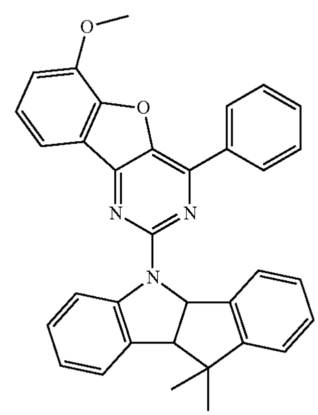

<Intermediate 3-d>

Intermediate 3-d was synthesized in the same manner as in Synthesis Example 1-6, with the exception of using Intermediate 3-c instead of Intermediate 1-e. (18.3 g 67.4%)

Synthesis Example 3-5: Synthesis of Intermediate 3-e

Intermediate 3-e was synthesized as illustrated in the following Reaction Scheme 18:

[Reaction Scheme 18]

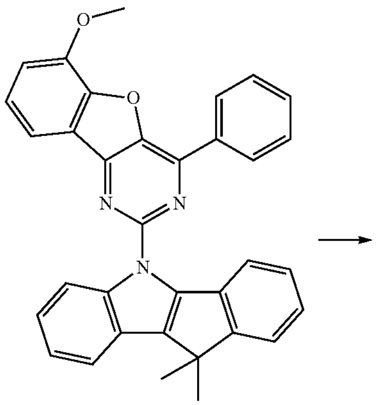

<Intermediate 3-d>

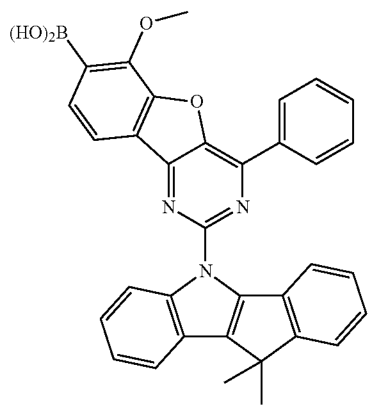

<Intermediate 3-e>

Intermediate 3-e was synthesized in the same manner as in Synthesis Example 1-7, with the exception of using Intermediate 3-d instead of Intermediate 1-f. (16.4 g, 74.2%)

Synthesis Example 3-6: Synthesis of Intermediate 3-f

Intermediate 3-f was synthesized as illustrated in the following Reaction Scheme 19:

[Reaction Scheme 19]

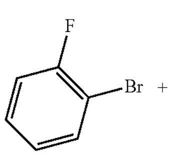

-continued

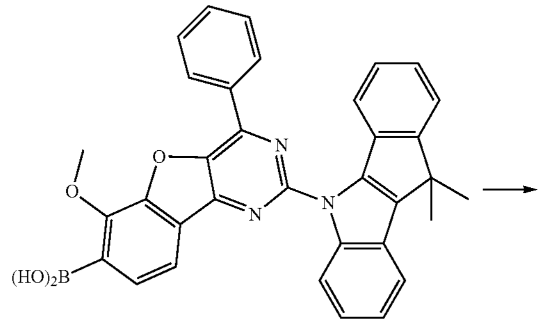

<Intermediate 3-e>

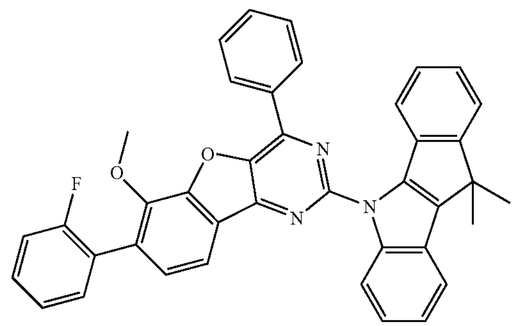

<Intermediate 3-f>

Intermediate 3-f was synthesized in the same manner as in Synthesis Example 1-8, with the exception of using Intermediate 3-e instead of Intermediate 1-g. (15.3 g, 77.4%)

Synthesis Example 3-7: Synthesis of Intermediate 3-g

Intermediate 3-g was synthesized as illustrated in the following Reaction Scheme 20:

[Reaction Scheme 20]

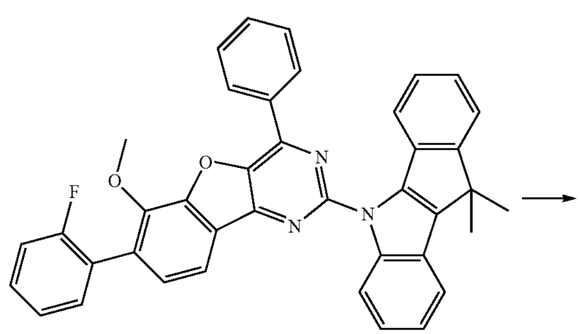

<Intermediate 3-f>

-continued

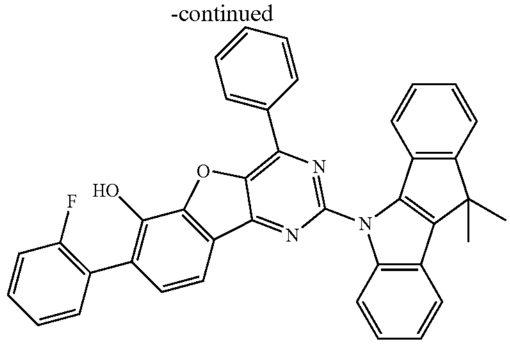

<Intermediate 3-g>

Intermediate 3-g was synthesized in the same manner as in Synthesis Example 1-9, with the exception of using Intermediate 3-f instead of Intermediate 1-h. (10.5 g, 64.2%)

Synthesis Example 3-8: Synthesis of Compound 13

Compound 13 was synthesized as illustrated in the following Reaction Scheme 21:

[Reaction Scheme 21]

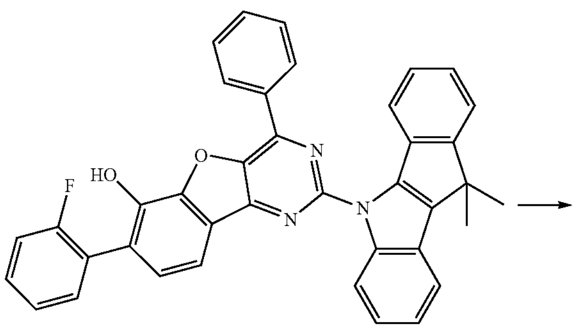

<Intermediate 3-g>

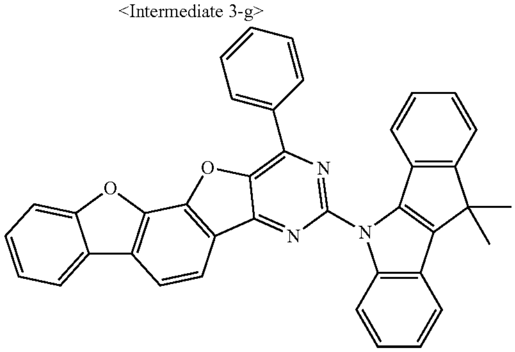

<Compound 13>

Compound 13 was synthesized in the same manner as in Synthesis Example 1-10, with the exception of using Intermediate 3-g instead of Intermediate 1-i. (3.5 g, 52.1%)

MS (MALDI-TOF): m/z 567.19[M+]

Synthesis Example 4: Synthesis of Compound 21

Synthesis Example 4-1: Synthesis of Intermediate 4-a

Intermediate 4-a was synthesized as illustrated in the following Reaction Scheme 22:

[Reaction Scheme 22]

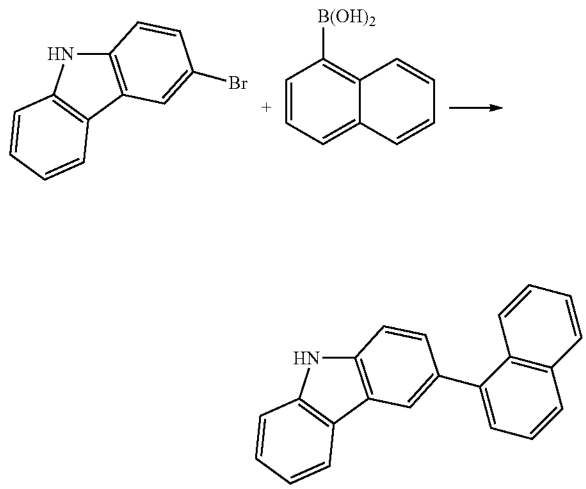

<Intermediate 4-a>

Intermediate 4-a was synthesized in the same manner as in Synthesis Example 1-8, with the exception of using 3-bromocarbazole and 1-naphthalene bromic acid instead of Intermediate 1-g and bromo-2-fluorobenzene, respectively. (15.3 g, 67.4%)

Synthesis Example 4-2: Synthesis of Intermediate 4-b

Intermediate 4-b was synthesized as illustrated in the following Reaction Scheme 23:

[Reaction Scheme 23]

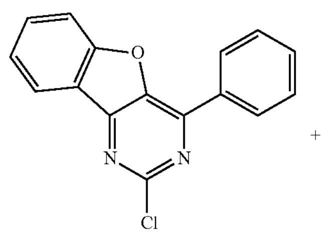

<Intermediate 1-c>

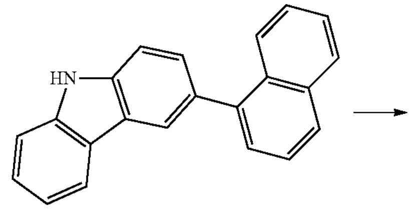

<Intermediate 4-a>

-continued

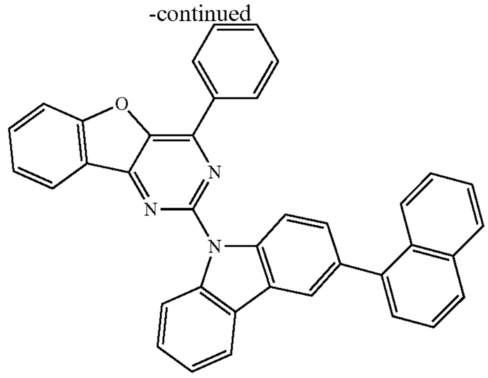

<Intermediate 4-b>

Intermediate 4-b was synthesized in the same manner as in Synthesis Example 1-4, with the exception of using Intermediate 4-a instead of carbazole. (31.5 g, 75.3%)

Synthesis Example 4-3: Synthesis of Intermediate 4-c

Intermediate 4-c was synthesized as illustrated in the following Reaction Scheme 24:

[Reaction Scheme 24]

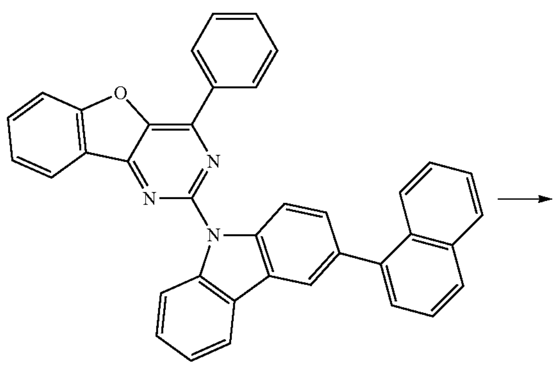

<Intermediate 4-b>

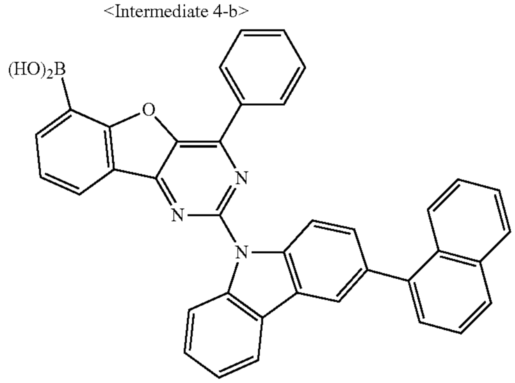

<Intermediate 4-c>

Intermediate 4-c was synthesized in the same manner as in Synthesis Example 1-7, with the exception of using Intermediate 4-b instead of Intermediate 1-f. (52.3 g, 71%)

Synthesis Example 4-4: Synthesis of Intermediate 4-d

Intermediate 4-d was synthesized as illustrated in the following Reaction Scheme 25:

[Reaction Scheme 25]

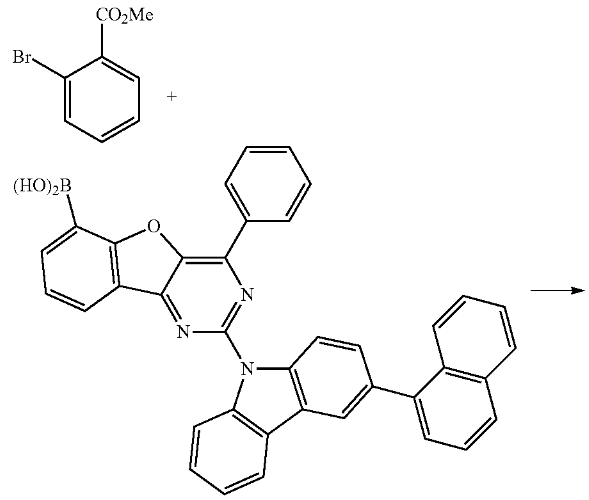

<Intermediate 4-c>

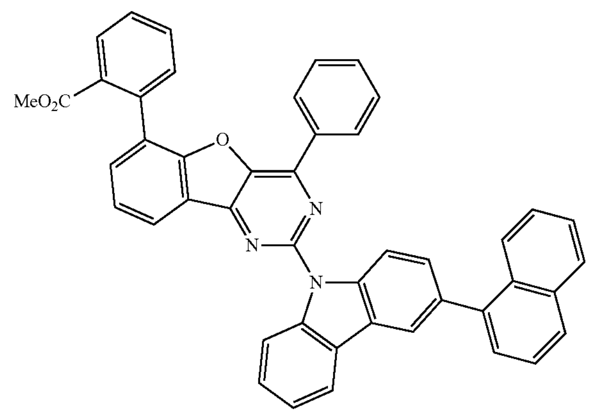

<Intermediate 4-d>

Intermediate 4-d was synthesized in the same manner as in Synthesis Example 1-8, with the exception of using 2-bromobenzoate and Intermediate 4-c instead of bromo-2-fluorobenzene and Intermediate 1-g, respectively. (45.6 g, 71%)

Synthesis Example 4-5: Synthesis of Compound 21

Compound 21 was synthesized as illustrated in the following Reaction Scheme 26:

[Reaction Scheme 26]

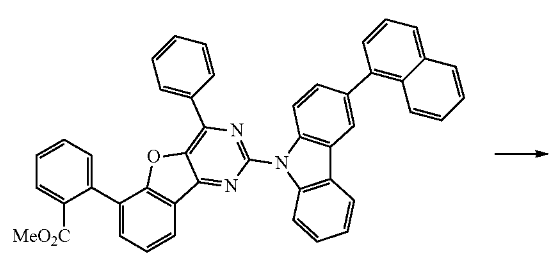

<Intermediate 4-d>

-continued

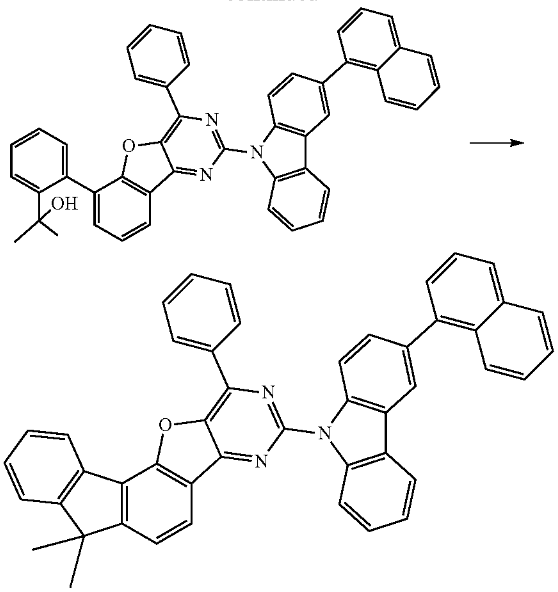

<Compound 21>

Compound 21 was synthesized in the same manner as in Synthesis Example 2-3, with the exception of using Intermediate 4-d instead of Intermediate 2-b. (4.6 g, 41.1%)

MS (MALDI-TOF): m/z 653.25[M+]

Synthesis Example 5: Synthesis of Compound 33

Synthesis Example 5-1: Synthesis of Intermediate 5-a

Intermediate 5-a was synthesized as illustrated in the following Reaction Scheme 27:

[Reaction Scheme 27]

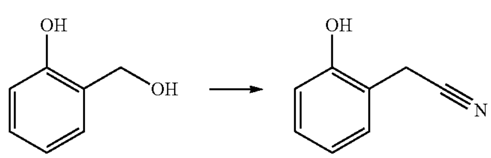

<Intermediate 5-a>

In a 2-L round-bottom flask reactor, a mixture of 2-hydroxy methylphenol (100 g, 806 mmol), sodium cyanide (43.4 g, 886 mmol), and dimethylformamide (1000 mL) was stirred at 120° C. for 4 hrs. After completion of the reaction, extraction was conducted with water and ethylacetate. Concentration and column chromatographic separation afforded Intermediate 5-a. (90 g, 84%)

Synthesis Example 5-2: Synthesis of Intermediate 5-b

Intermediate 5-b was synthesized as illustrated in the following Reaction Scheme 28:

[Reaction Scheme 28]

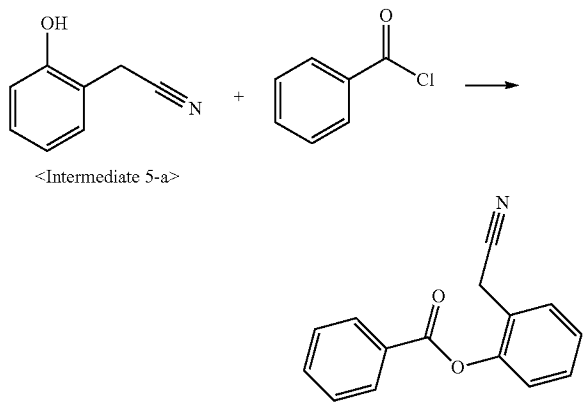

<Intermediate 5-a>

<Intermediate 5-b>

In a 2-L round-bottom flask reactor, Intermediate 5-a (90 g, 676 mmol), 4-dimethylaminopyridine (68.8 g, 338 mmol), triethylamine (137 g, 1352 mmol) and methylene chloride (900 mL) were placed, and benzole chloride (82.4 g, 676 mmol) was dropwise added at 0° C., after which stirring was continued for 4 hrs at room temperature. After completion of the reaction, concentration and column chromatographic separation afforded Intermediate 5-b. (40 g, 25%)

Synthesis Example 5-3: Synthesis of Intermediate 5-c

Intermediate 5-c was synthesized as illustrated in the following Reaction Scheme 29:

[Reaction Scheme 29]

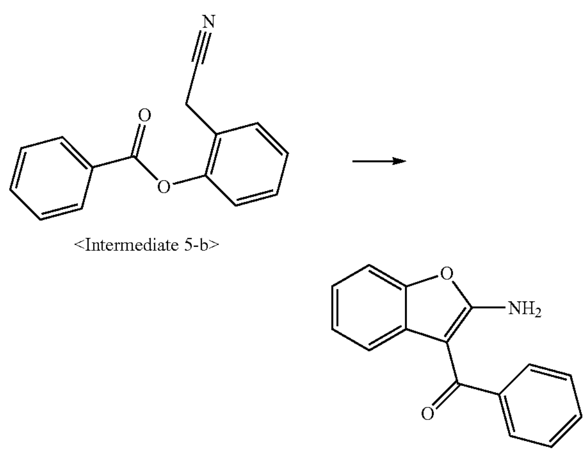

<Intermediate 5-b>

<Intermediate 5-c>

In a dry 1-L round-bottom flask reactor, a mixture of Intermediate 5-b (40 g, 169 mmol), tricyclohexyl phosphine (9.5 g, 34 mmol), zinc powder (1.9 g, 17 mmol), palladium acetate (3.8 g, 17 mmol), and dimethylformamide (400 mL) was stirred for 12 hrs under reflux in a nitrogen atmosphere. After completion of the reaction, the reaction mixture was added to an excess of water to form a brown precipitate. Filtration and column chromatographic separation afforded Intermediate 5-c. (20 g, 50%)

Synthesis Example 5-4: Synthesis of Intermediate 5-d

Intermediate 5-d was synthesized as illustrated in the following Reaction Scheme 30:

[Reaction Scheme 30]

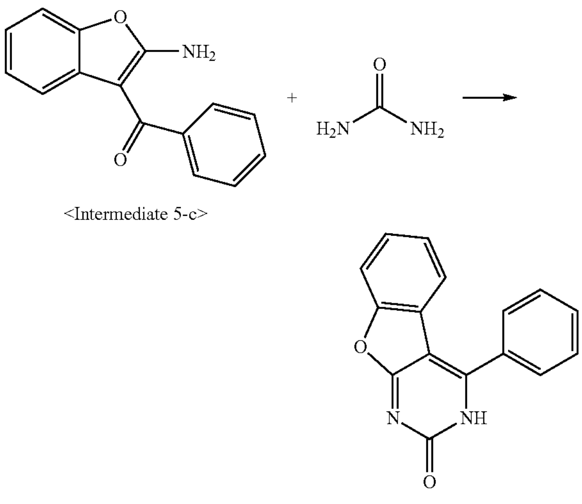

<Intermediate 5-c>

<Intermediate 5-d>

Intermediate 5-d was synthesized in the same manner as in Synthesis Example 1-2, with the exception of using Intermediate 5-c instead of Intermediate 1-a. (35 g, 62.1%)

Synthesis Example 5-5: Synthesis of Intermediate 5-e

Intermediate 5-e was synthesized as illustrated in the following Reaction Scheme 31:

[Reaction Scheme 31]

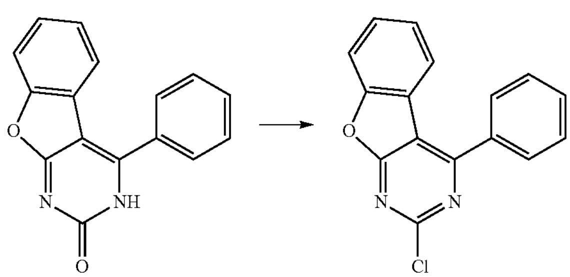

<Intermediate 5-d> <Intermediate 5-e>

Intermediate 5-e was synthesized in the same manner as in Synthesis Example 1-3, with the exception of using Intermediate 5-d instead of Intermediate 1-b. (27 g, 76.6%)

Synthesis Example 5-6: Synthesis of Intermediate 5-f

Intermediate 5-f was synthesized as illustrated in the following Reaction Scheme 32:

[Reaction Scheme 32]

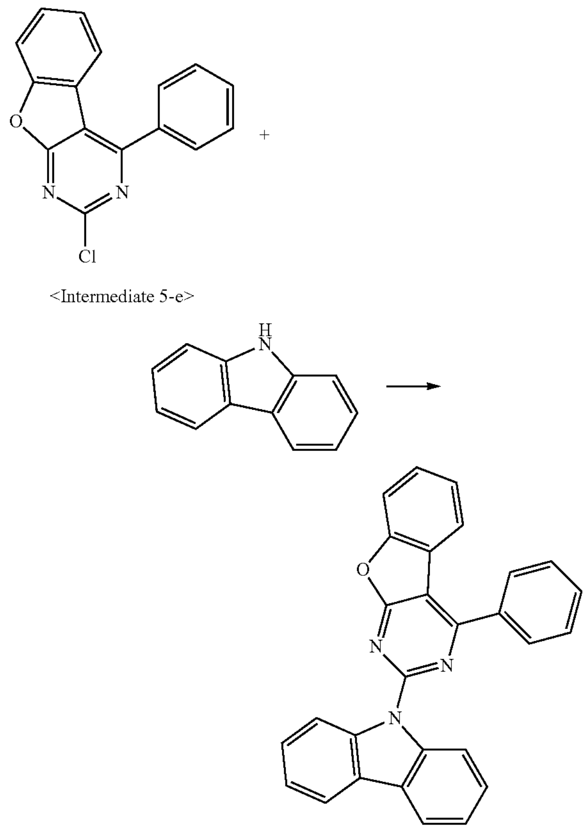

<Intermediate 5-e>

<Intermediate 5-f>

Intermediate 5-f was synthesized in the same manner as in Synthesis Example 1-4, with the exception of using Intermediate 5-e instead of Intermediate 1-c. (25.5 g, 75.3%)

Synthesis Example 5-7: Synthesis of Intermediate 5-g

Intermediate 5-g was synthesized as illustrated in the following Reaction Scheme 33:

[Reaction Scheme 33]

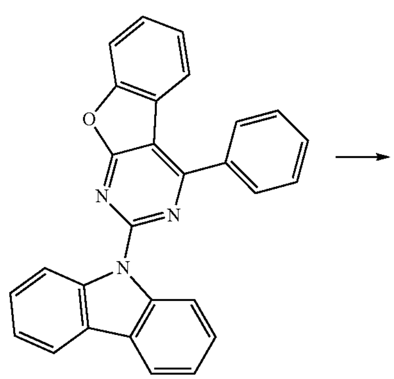

<Intermediate 5-f>

-continued

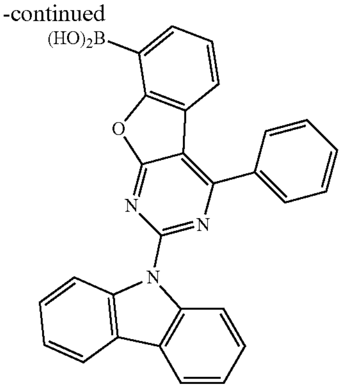

<Intermediate 5-g>

Intermediate 5-g was synthesized in the same manner as in Synthesis Example 1-7, with the exception of using Intermediate 5-f instead of Intermediate 1-f. (22.3 g, 71%)

Synthesis Example 5-8: Synthesis of Intermediate 5-h

Intermediate 5-h was synthesized as illustrated in the following Reaction Scheme 34:

[Reaction Scheme 34]

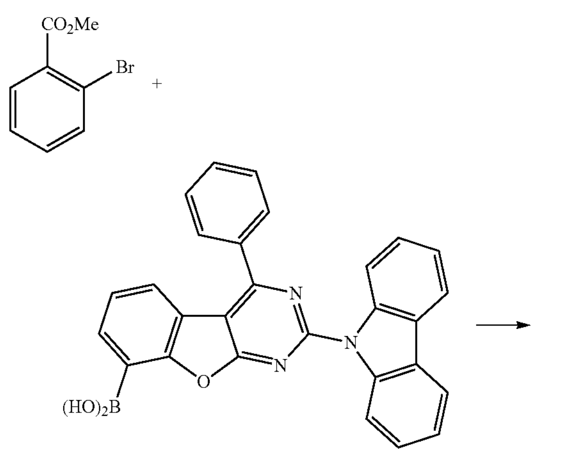

<Intermediate 5-g>

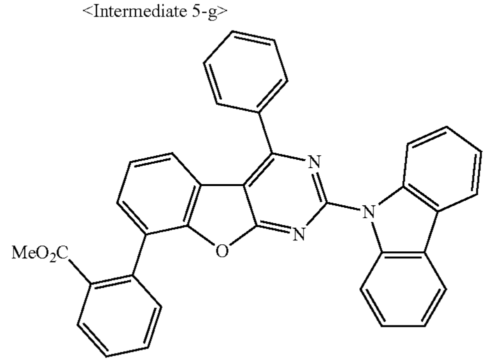

<Intermediate 5-h>

Intermediate 5-h was synthesized in the same manner as in Synthesis Example 1-8, with the exception of using 2-bromobenzoate and Intermediate 5-g instead of bromo-2-fluorobenzene and Intermediate 1-g, respectively. (20.6 g, 71%)

Synthesis Example 5-9: Synthesis of Compound 33

Compound 33 was synthesized as illustrated in the following Reaction Scheme 35:

[Reaction Scheme 35]

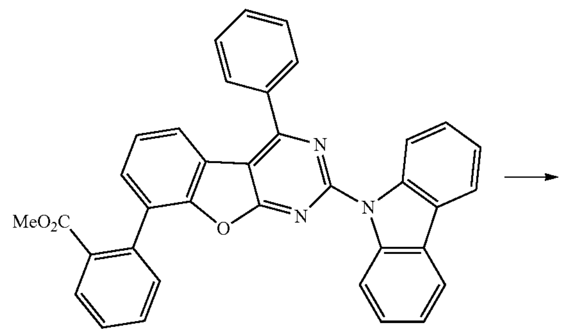

<Intermediate 5-h>

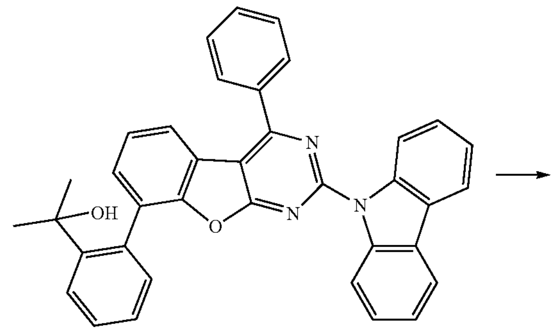

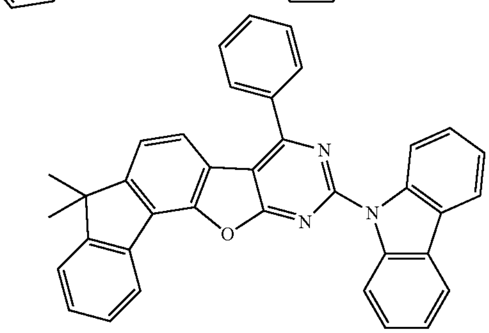

<Compound 33>

Compound 33 was synthesized in the same manner as in Synthesis Example 2-3, with the exception of using Intermediate 5-h instead of Intermediate 2-b. (3.7 g, 45.1%)

MS (MALDI-TOF): m/z 527.2[M+]

Synthesis Example 6: Synthesis of Compound 44

Synthesis Example 6-1: Synthesis of Intermediate 6-a

Intermediate 6-a was synthesized as illustrated in the following Reaction Scheme 36:

[Reaction Scheme 36]

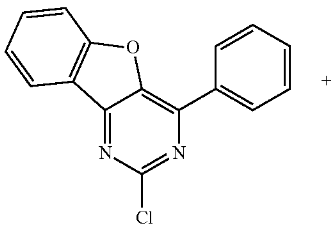

<Intermediate 1-c>

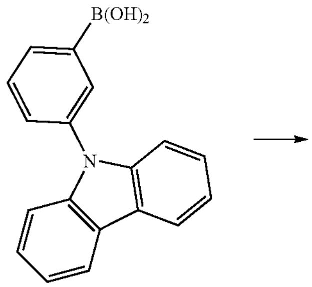

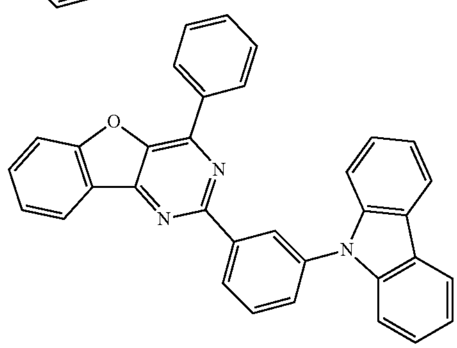

<Intermediate 6-a>

Intermediate 6-a was synthesized in the same manner as in Synthesis Example 1-8, with the exception of using Intermediate 1-c and (3-(9H-carbazol-9-yl)phenyl)boronic acid instead of Intermediate 1-c and Intermediate 1-g, respectively. (32.2 g, 68%)

Synthesis Example 6-2: Synthesis of Intermediate 6-b

Intermediate 6-b was synthesized as illustrated in the following Reaction Scheme 37:

[Reaction Scheme 37]

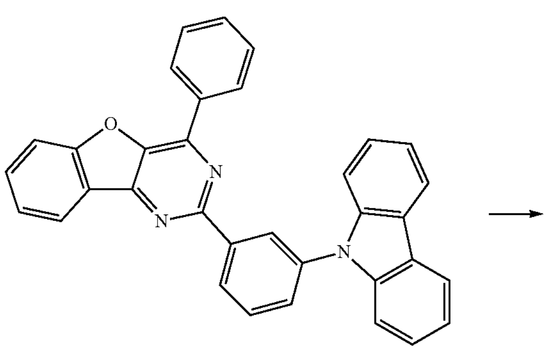

<Intermediate 6-a>

-continued

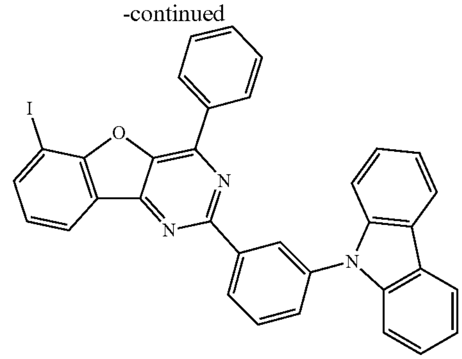

<Intermediate 6-b>

Intermediate 6-b was synthesized in the same manner as in Synthesis Example 1-5, with the exception of using Intermediate 6-a instead of Intermediate 1-d. (29.8 g, 72.1%)

Synthesis Example 6-3: Synthesis of Intermediate 6-c

Intermediate 6-c was synthesized as illustrated in the following Reaction Scheme 38:

[Reaction Scheme 38]

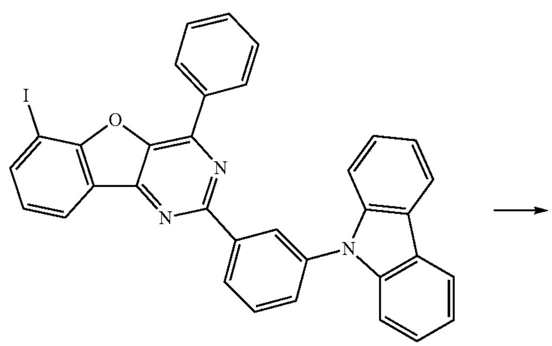

<Intermediate 6-b>

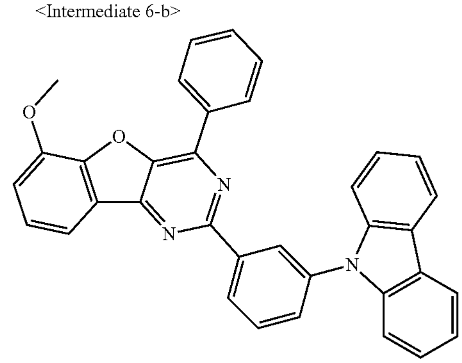

<Intermediate 6-c>

Intermediate 6-c was synthesized in the same manner as in Synthesis Example 1-6, with the exception of using Intermediate 6-b instead of Intermediate 1-e. (24 g, 67.4%)

Synthesis Example 6-4: Synthesis of Intermediate 6-d

Intermediate 6-d was synthesized as illustrated in the following Reaction Scheme 39:

[Reaction Scheme 39]

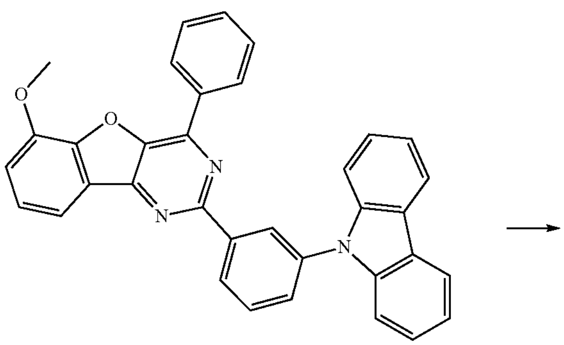

<Intermediate 6-c>

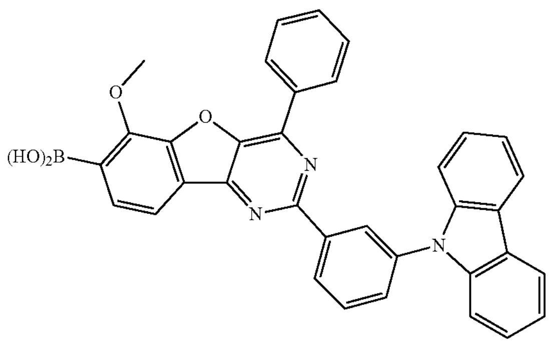

<Intermediate 6-d>

Intermediate 6-d was synthesized in the same manner as in Synthesis Example 1-7, with the exception of using Intermediate 6-c instead of Intermediate 1-f. (20.8 g, 78.2%)

Synthesis Example 6-5: Synthesis of Intermediate 6-e

Intermediate 6-e was synthesized as illustrated in the following Reaction Scheme 40:

[Reaction Scheme 40]

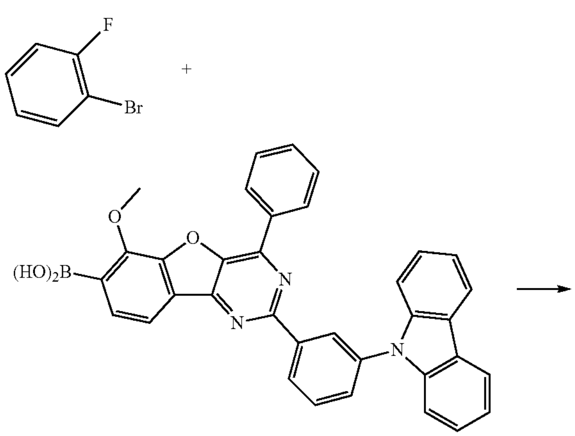

<Intermediate 6-d>

-continued

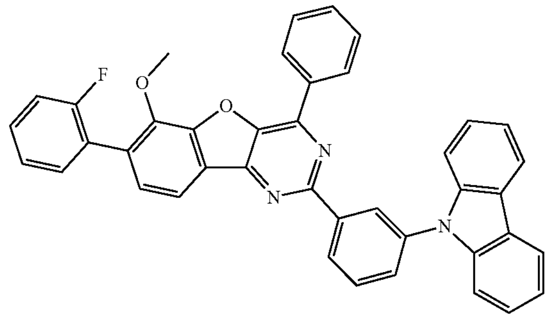

<Intermediate 6-e>

Intermediate 6-e was synthesized in the same manner as in Synthesis Example 1-8, with the exception of using Intermediate 6-d instead of Intermediate 1-g. (18.6 g, 67.4%)

Synthesis Example 6-6: Synthesis of Intermediate 6-f

Intermediate 6-f was synthesized as illustrated in the following Reaction Scheme 41:

[Reaction Scheme 41]

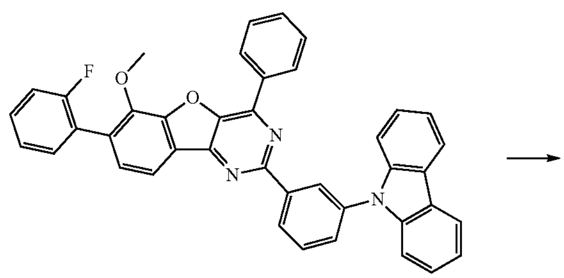

<Intermediate 6-e>

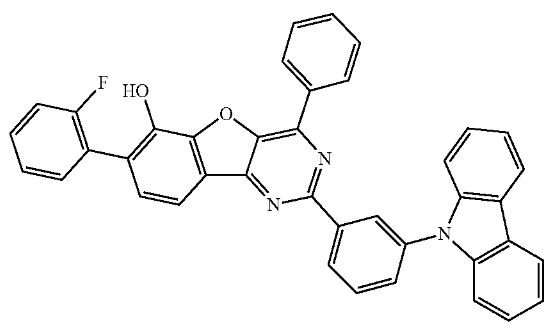

<Intermediate 6-f>

Intermediate 6-f was synthesized in the same manner as in Synthesis Example 1-9, with the exception of using Intermediate 6-e instead of Intermediate 1-h. (10.5 g, 63.2%)

Synthesis Example 6-7: Synthesis of Compound 44

Compound 44 was synthesized as illustrated in the following Reaction Scheme 42:

[Reaction Scheme 42]

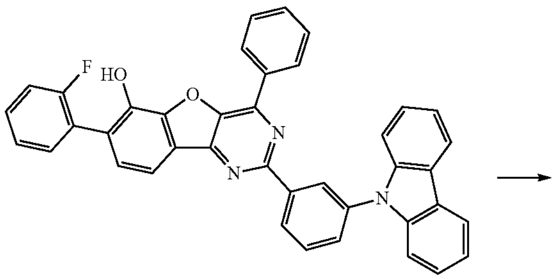

<Intermediate 6-f>

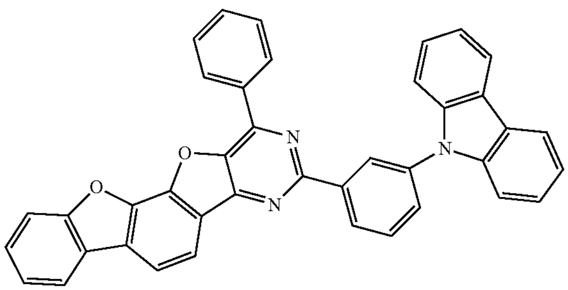

<Compound 44>

Compound 44 was synthesized in the same manner as in Synthesis Example 1-10, with the exception of using Intermediate 6-f instead of Intermediate 1-10. (3.4 g, 42.1%)

MS (MALDI-TOF): m/z 577.18[M+]

Synthesis Example 7: Synthesis of Compound 52

Synthesis Example 7-1: Synthesis of Intermediate 7-a

Intermediate 7-a was synthesized as illustrated in the following Reaction Scheme 43:

[Reaction Scheme 43]

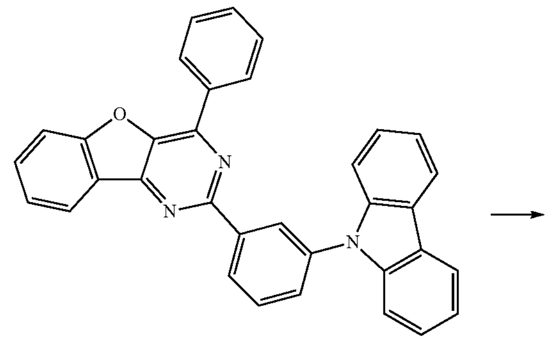

<Intermediate 6-a>

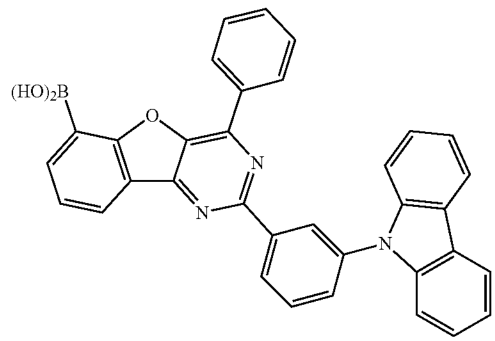

<Intermediate 7-a>

Intermediate 7-a was synthesized in the same manner as in Synthesis Example 1-7, with the exception of using Intermediate 6-a instead of Intermediate 1-f. (29 g, 81%)

Synthesis Example 7-2: Synthesis of Intermediate 7-b

Intermediate 7-b was synthesized as illustrated in the following Reaction Scheme 44:

[Reaction Scheme 44]

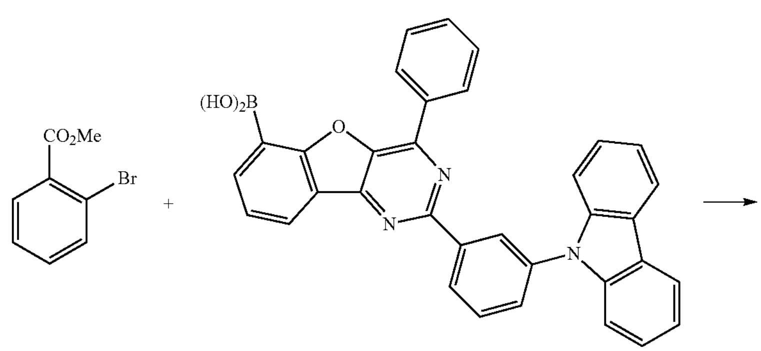

<Intermediate 7-a>

-continued

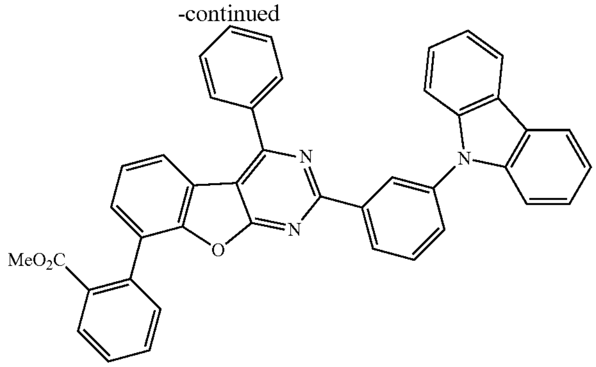

<Intermediate 7-b>

Intermediate 7-b was synthesized in the same manner as in Synthesis Example 1-8, with the exception of using 2-bromobenzoate and intermediate 7-a instead of bromo-2-fluorobenzene and Intermediate 1-f, respectively. (24.6 g, 74%)

Synthesis Example 7-3: Synthesis of Compound 52

Compound 52 was synthesized as illustrated in the following Reaction Scheme 45:

[Reaction Scheme 45]

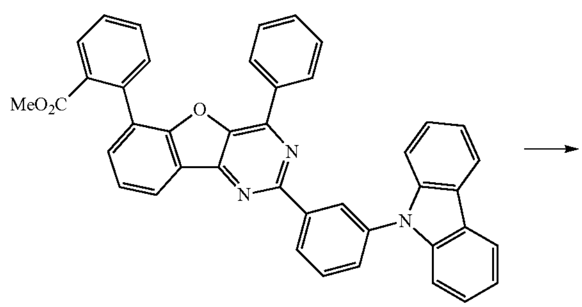

<Intermediate 7-b>

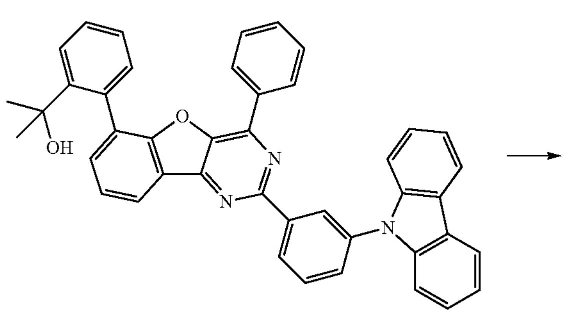

-continued

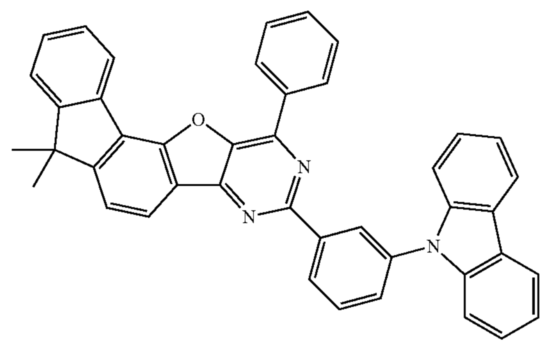

<Compound 52>

Compound 52 was synthesized in the same manner as in Synthesis Example 2-3, with the exception of using Intermediate 7-b instead of Intermediate 2-b. (3.7 g, 45.1%)

MS (MALDI-TOF): m/z 603.23[M+]

Synthesis Example 8: Synthesis of Compound 85

Synthesis Example 8-1: Synthesis of Intermediate 8-a

Intermediate 8-a was synthesized as illustrated in the following Reaction Scheme 46:

[Reaction Scheme 46]

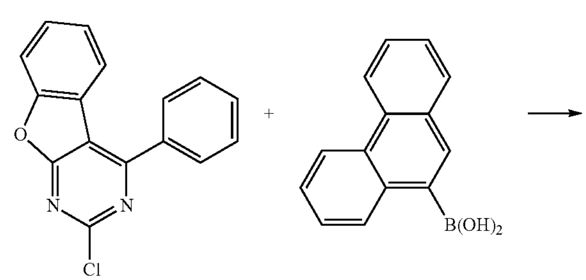

<Intermediate 5-e>

-continued

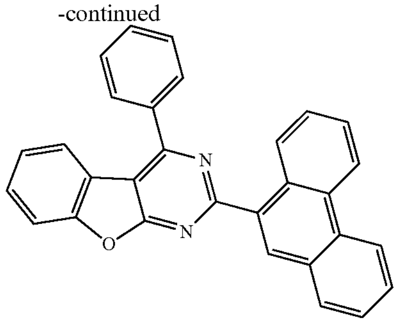

<Intermediate 8-a>

Intermediate 8-a was synthesized in the same manner as in Synthesis Example 1-8, with the exception of using Intermediate 5-e and phenanthreneboronic acid instead of bromo-2-fluorobenzene and Intermediate 1-g, respectively. (37.8 g, 73%)

Synthesis Example 8-2: Synthesis of Intermediate 8-b

Intermediate 8-b was synthesized as illustrated in the following Reaction Scheme 47:

[Reaction Scheme 47]

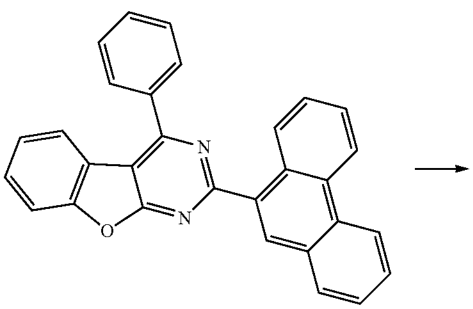

<Intermediate 8-a>

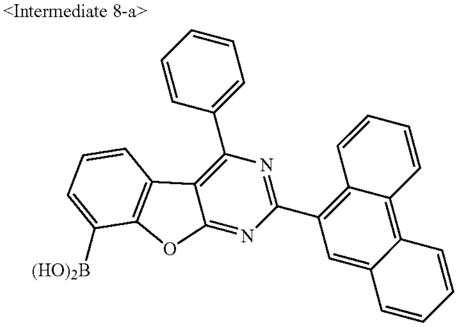

<Intermediate 8-b>

Intermediate 8-b was synthesized in the same manner as in Synthesis Example 1-7, with the exception of using Intermediate 1-f instead of Intermediate 8-a. (32.3 g, 81%)

Synthesis Example 8-3: Synthesis of Intermediate 8-c

Intermediate 8-c was synthesized as illustrated in the following Reaction Scheme 48:

[Reaction Scheme 48]

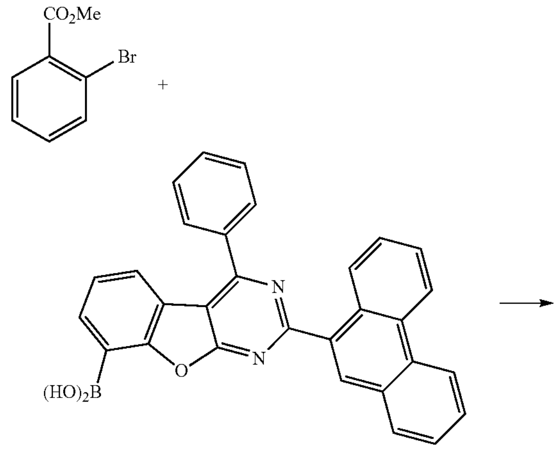

<Intermediate 8-b>

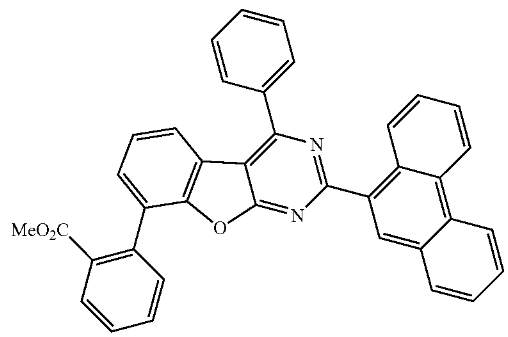

<Intermediate 8-c>

Intermediate 8-c was synthesized in the same manner as in Synthesis Example 1-8, with the exception of using 2-bromobenzoate and Intermediate 8-b instead of bromo-2-fluorobenzene and Intermediate 1-g, respectively. (16.4 g, 64%)

Synthesis Example 8-4: Synthesis of Compound 85

Compound 85 was synthesized as illustrated in the following Reaction Scheme 49:

[Reaction Scheme 49]

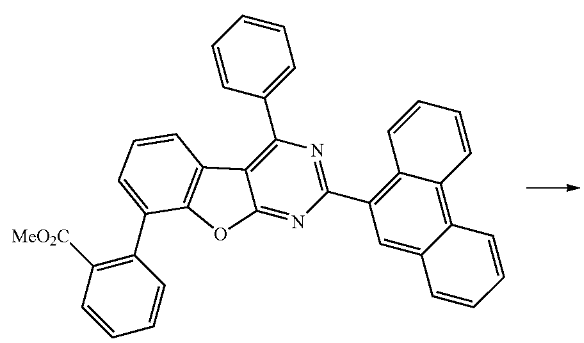

<Intermediate 8-c>

-continued

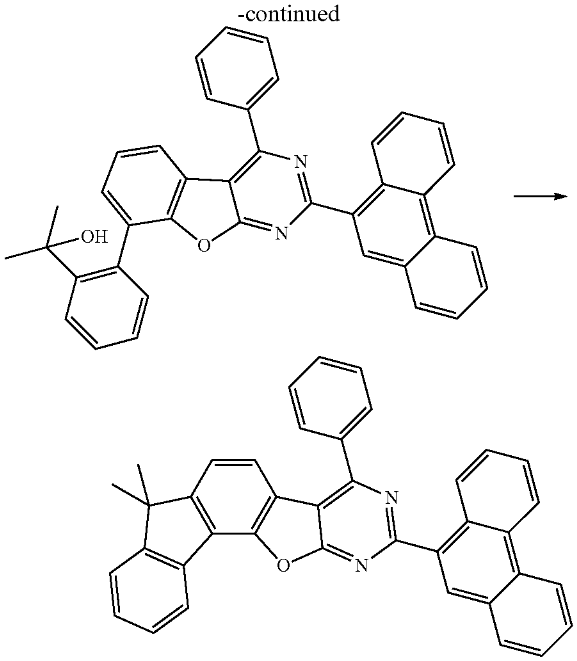

<Compound 85>

Compound 85 was synthesized in the same manner as in Synthesis Example 2-3, with the exception of using Intermediate 8-c instead of Intermediate 2-b. (4.2 g, 42.1%)

MS (MALDI-TOF): m/z 538.2[M+]

Synthesis Example 9: Synthesis of Compound 93

Synthesis Example 9-1: Synthesis of Intermediate 9-a

Intermediate 9-a was synthesized as illustrated in the following Reaction Scheme 50:

[Reaction Scheme 50]

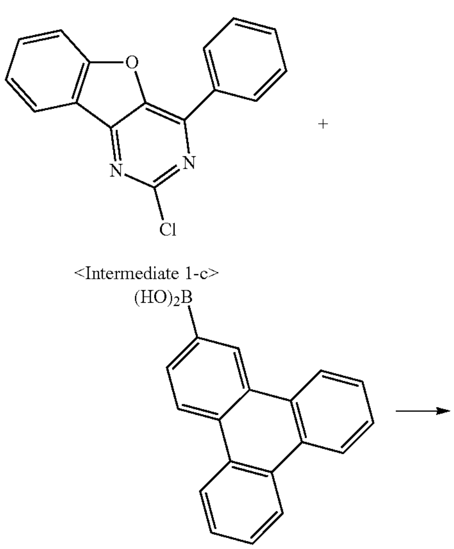

-continued

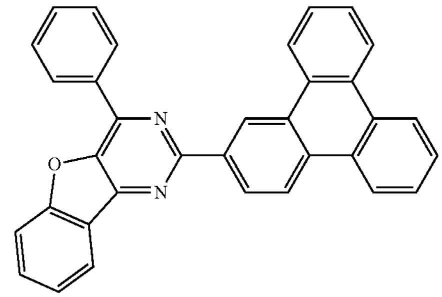

<Intermediate 9-a>

Intermediate 9-a was synthesized in the same manner as in Synthesis Example 1-8, with the exception of using Intermediate 1-c and triphenyleneboronic acid instead of bromo-2-fluorobenzene and Intermediate 1-g, respectively. (37.8 g, 73%)

Synthesis Example 9-2: Synthesis of Intermediate 9-b

Intermediate 9-b was synthesized as illustrated in the following Reaction Scheme 51:

[Reaction Scheme 51]

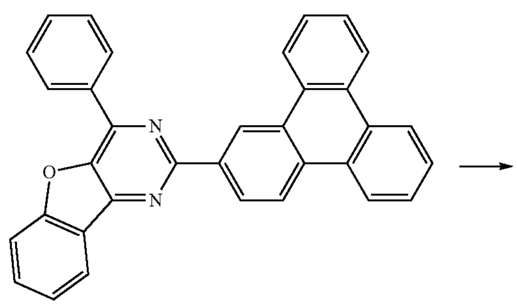

<Intemediate 9-a>

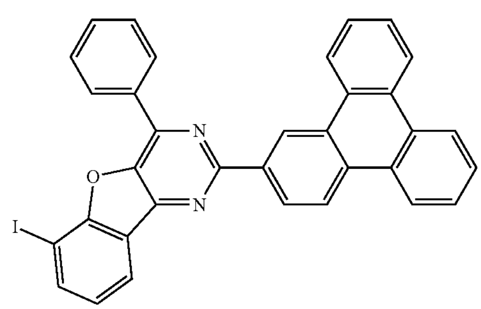

<Intemediate 9-b>

Intermediate 9-b was synthesized in the same manner as in Synthesis Example 1-5, with the exception of using Intermediate 9-a instead of Intermediate 1-d. (31.2 g, 72.1%)

Synthesis Example 9-3: Synthesis of Intermediate 9-c

Intermediate 9-c was synthesized as illustrated in the following Reaction Scheme 52:

[Reaction Scheme 52]

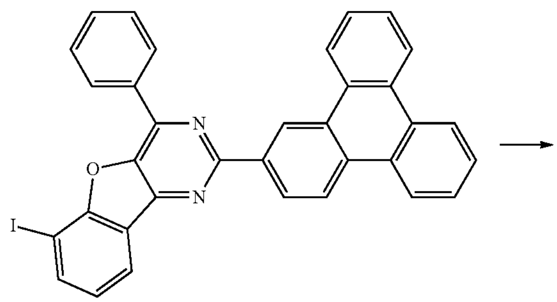

<Intermediate 9-b>

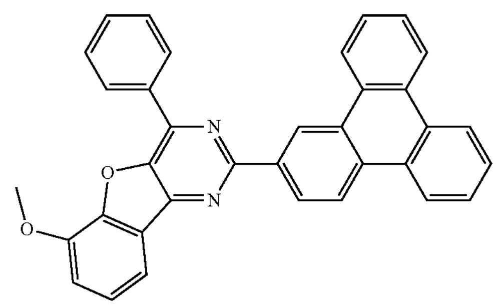

<Intermediate 9-c>

Intermediate 9-c was synthesized in the same manner as in Synthesis Example 1-6, with the exception of using Intermediate 9-b instead of Intermediate 1-e. (27.2 g, 67.4%)

Synthesis Example 9-4: Synthesis of Intermediate 9-d

Intermediate 9-d was synthesized as illustrated in the following Reaction Scheme 53:

[Reaction Scheme 53]

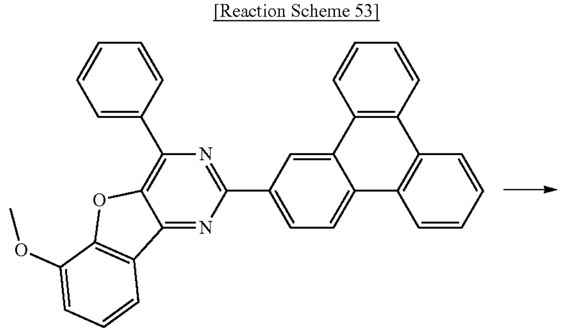

<Intemediate 9-c>

-continued

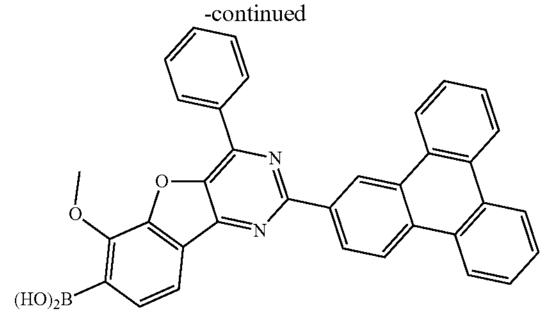

<Intemediate 9-d>

Intermediate 9-d was synthesized in the same manner as in Synthesis Example 1-7, with the exception of using Intermediate 9-c instead of Intermediate 1-f. (19.3 g, 74.2%)

Synthesis Example 9-5: Synthesis of Intermediate 9-e

Intermediate 9-e was synthesized as illustrated in the following Reaction Scheme 54:

[Reaction Scheme 54]

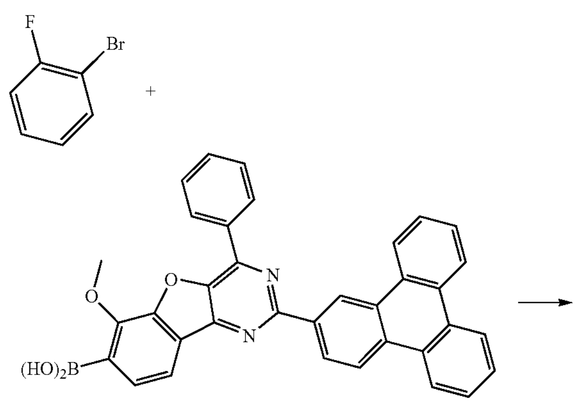

<Intermediate 9-d>

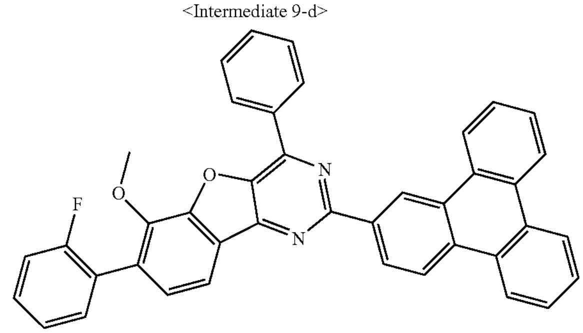

<Intermediate 9-e>

Intermediate 9-e was synthesized in the same manner as in Synthesis Example 1-8, with the exception of using Intermediate 9-d instead of Intermediate 1-g. (15 g, 64%)

Synthesis Example 9-6: Synthesis of Intermediate 9-f

Intermediate 9-f was synthesized as illustrated in the following Reaction Scheme 55:

[Reaction Scheme 55]

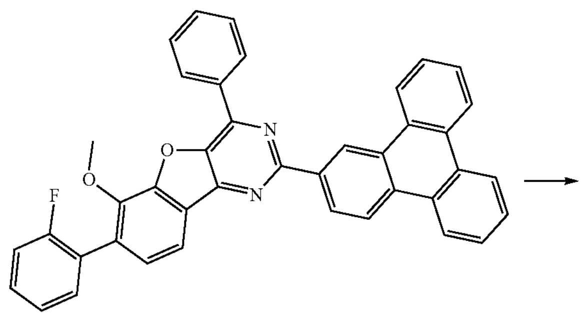

<Intemediate 9-d>

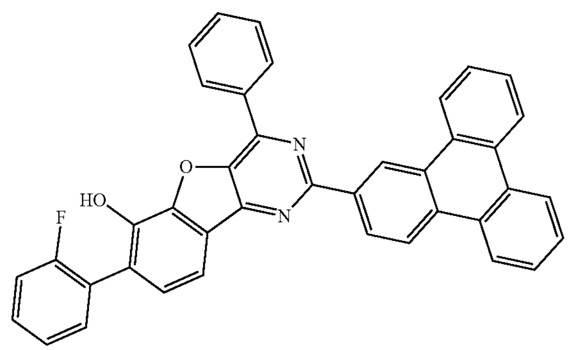

<Intemediate 9-f>

Intermediate 9-f was synthesized in the same manner as in Synthesis Example 1-9, with the exception of using Intermediate 9-e instead of Intermediate 1-h. (10.5 g, 65.2%)

Synthesis Example 9-7: Synthesis of Compound 93

Compound 93 was synthesized as illustrated in the following Reaction Scheme 56:

[Reaction Scheme 56]

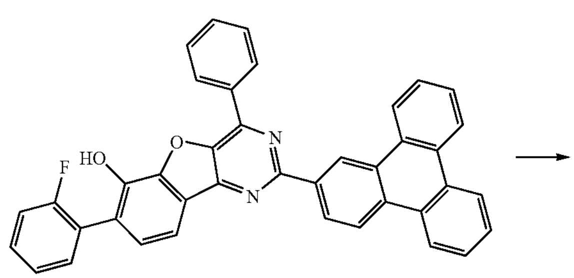

<Intermediate 9-f>

-continued

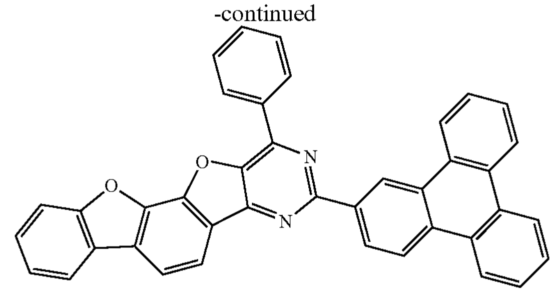

<Compound 93>

Compound 93 was synthesized in the same manner as in Synthesis Example 1-10, with the exception of using Intermediate 9-f instead of Intermediate 1-i. (3.7 g, 42.1%)

MS (MALDI-TOF): m/z 562.17[M+]

Synthesis Example 10: Synthesis of Compound 101

Synthesis Example 10-1: Synthesis of Intermediate 10-a

Intermediate 10-a was synthesized as illustrated in the following Reaction Scheme 57:

[Reaction Scheme 57]

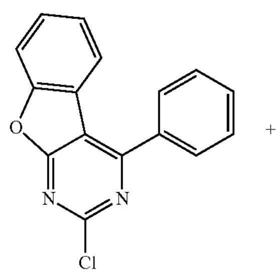

<Intermediate 5-e>

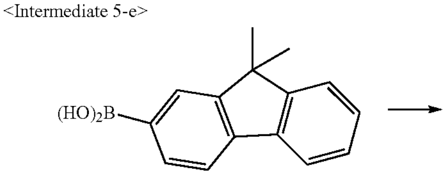

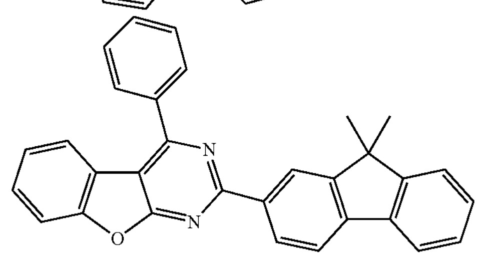

<Intermediate 10-a>

Intermediate 10-a was synthesized in the same manner as in Synthesis Example 1-8, with the exception of using Intermediate 5-e and 9,9-dimethyl-9H-fluoren-2-yl boronic acid instead of bromo-2-fluorobenzene and Intermediate 1-g, respectively. (41 g, 73%)

Synthesis Example 10-2: Synthesis of Intermediate 10-b

Intermediate 10-b was synthesized as illustrated in the following Reaction Scheme 58:

[Reaction Scheme 58]

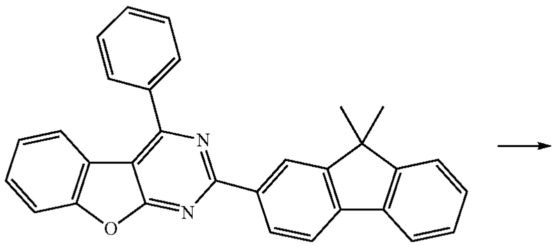

<Intermediate 10-a>

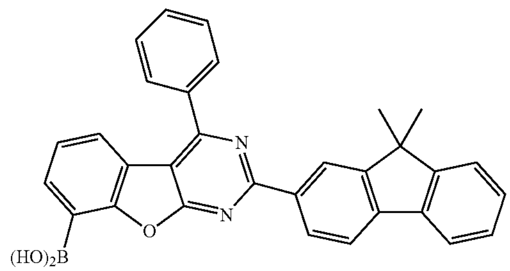

<Intermediate 10-b>

Intermediate 10-b was synthesized in the same manner as in Synthesis Example 1-7, with the exception of using Intermediate 10-a instead of Intermediate 1-f. (36.7 g, 71.2%)

Synthesis Example 10-3: Synthesis of Intermediate 10-c

Intermediate 10-c was synthesized as illustrated in the following Reaction Scheme 59:

[Reaction Scheme 59]

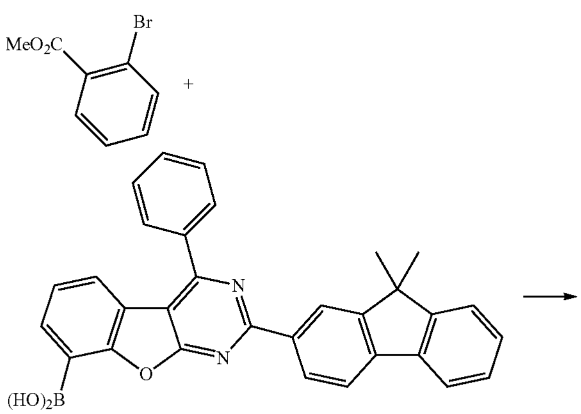

<Intermediate 10-b>

-continued

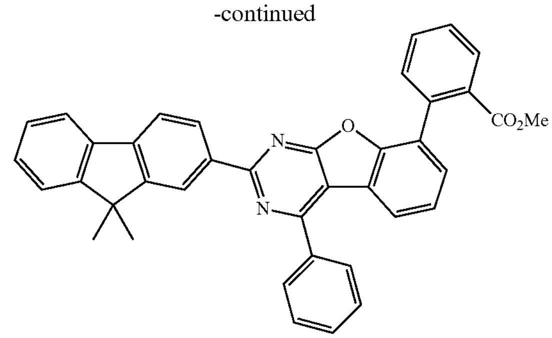

<Intermediate 10-c>

Intermediate 10-c was synthesized in the same manner as in Synthesis Example 1-8, with the exception of using 2-bromobenzoate and Intermediate 10-b instead of bromo-2-fluorobenzene and Intermediate 1-g, respectively. (29.3 g, 72.3%)

Synthesis Example 10-4: Synthesis of Compound 101

Compound 101 was synthesized as illustrated in the following Reaction Scheme 60:

[Reaction Scheme 60]

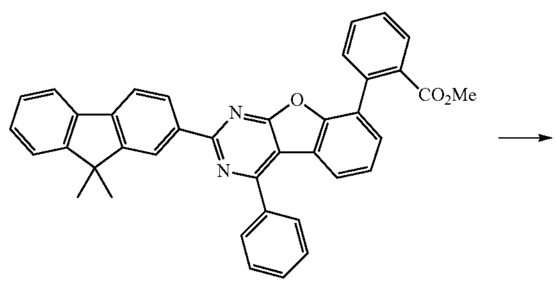

<Intermediate 10-c>

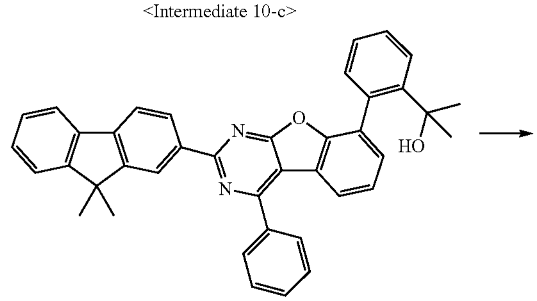

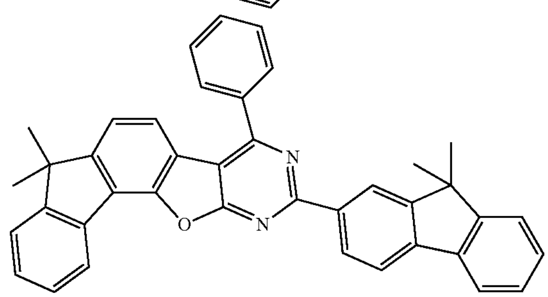

<Compound 101>

Compound 101 was synthesized in the same manner as in Synthesis Example 2-3, with the exception of using Intermediate 10-c instead of Intermediate 2-b. (3.5 g, 52.1%)

MS (MALDI-TOF): m/z 554.24[M+]

Synthesis Example 11: Synthesis of Compound 3

Synthesis Example 11-1: Synthesis of Compound 3

Compound 3 was synthesized as illustrated in Reaction Schemes 1-10.

<Compound 3>

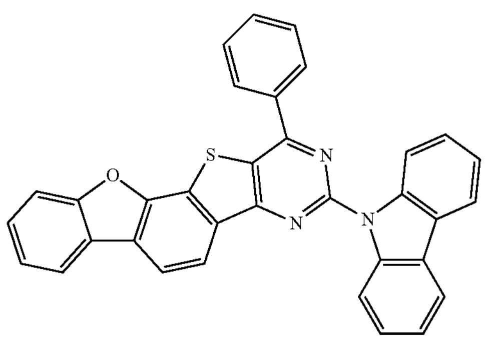

Compound 3 was synthesized in the same manner as in Synthesis Examples 1-1 to 1-10, with the exception of using 2-cyanothiophenol instead of 2-cyanophenol in Synthesis Example 1-1. (4.2 g, 62.1%)

MS (MALDI-TOF): m/z 517.12[M+]

Synthesis Example 12: Synthesis of Compound 92

Synthesis Example 12-1: Synthesis of Intermediate 12-a

Intermediate 12-a was synthesized as illustrated in Reaction Schemes 1-3.

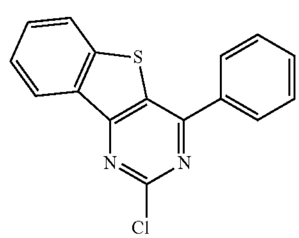 [SMILES: Clc1nc(-c2ccccc2)c2sc3ccccc3c2n1]

<Intermediate 12-a>

Intermediate 12-a was synthesized in the same manner as in Synthesis Examples 1-1 to 1-3, with the exception of using 2-cyanothiophenol instead of 2-cyanophenol in Synthesis Example 1-1. (21 g, 72.9%)

Synthesis Example 12-2: Synthesis of Intermediate 12-b

Intermediate 12-b was synthesized as illustrated in the following Reaction Scheme 61:

[Reaction Scheme 61]

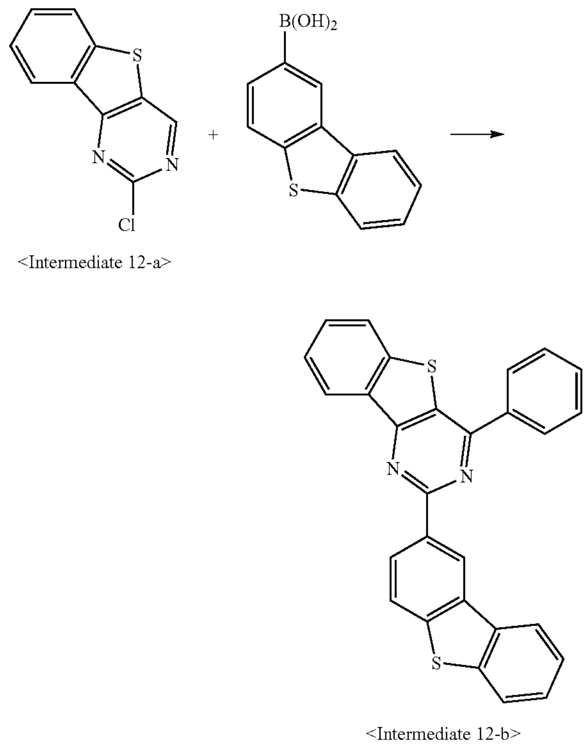

Intermediate 12-b was synthesized in the same manner as in Synthesis Example 1-4, with the exception of using Intermediate 12-a and dibenzothiophen-2-yl boronic acid instead of Intermediate 1-c and carbazole, respectively. (10.9 g, 66.5%)

Synthesis Example 12-3: Synthesis of Compound 92

Compound 92 was synthesized as illustrated in Reaction Scheme 11-13.

<Compound 92>

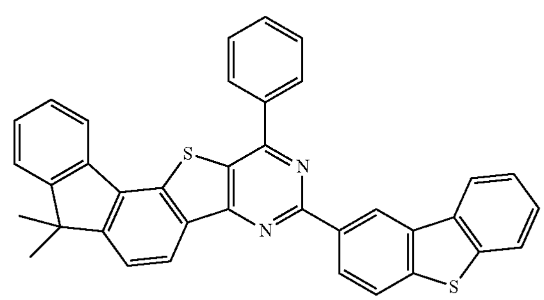

Compound 92 was synthesized in the same manner as in Synthesis Example 2-1, with the exception of using Intermediate 12-b instead of Intermediate 1-d. (6.7 g, 58.2%)

MS (MALDI-TOF): m/z 560.14[M+]

EXAMPLES

Examples 1 to 9 (Use of Light-Emitting Layer)

Fabrication of Organic Light-Emitting Diode

An ITO glass substrate was patterned to have a translucent area of 2 mm×2 mm and cleansed. The ITO glass substrate was mounted in a vacuum chamber that was then set to have a base pressure of $1\times10^{-6}$ torr. On the ITO glass substrate, films were formed of HATCN (50 Å), NPD (850 Å), the compounds synthesized in the present disclosure (phosphorescent host)+green phosphorescent dopant (GD, 7%) for a light-emitting layer (400 Å), ET:Liq=1:1 (300 Å), Liq (10 Å), and Al (1,000 Å) in that order. The organic light-emitting diodes thus obtained were measured at 0.4 mA for luminescence properties.

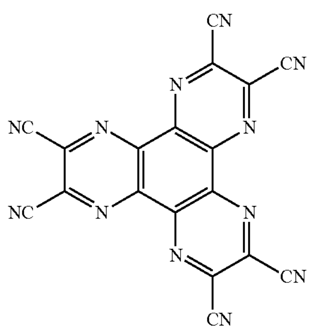

<HATCN>

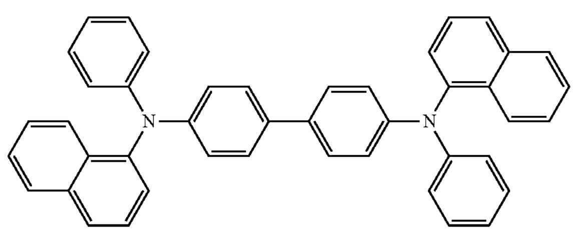

<α-NPD>

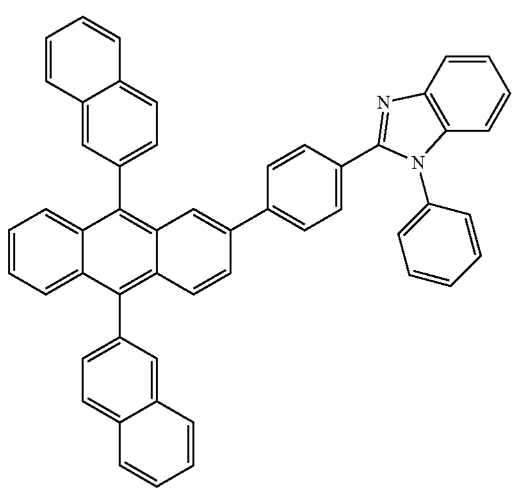

<ET>

-continued

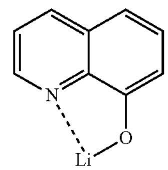

<Liq>

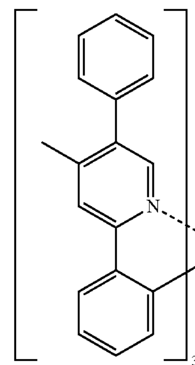

<GD>

Comparative Example 1

An organic light-emitting diode of Comparative Example 1 was fabricated in the same manner as the Examples, with the exception that CBP, conventionally used as a phosphorescent host material, was employed instead of the compounds synthesized in the present disclosure. The structure of CBP is as follows.

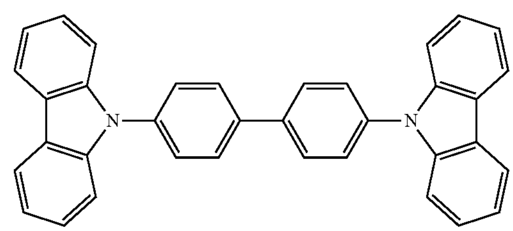

<CBP>

The organic light-emitting diodes fabricated in Examples 1 to 9 and Comparative Example 1 were measured for voltage, current density, luminance, color coordinates, and lifespan, and the results are summarized in Table 1, below. In Table 1, T95 refers to the time taken for the initial luminance (6000 cd/m2) to decrease by 5%.

TABLE 1

| | Host | V | Cd/A | CIEx | CIEy | T95 (Hr) |
|---|---|---|---|---|---|---|
| C. Example 1 | CBP | 6.2 | 38 | 0.297 | 0.624 | 5 |
| Example 1 | Cpd. 1 | 4.3 | 56 | 0.339 | 0.628 | 85 |
| Example 2 | Cpd. 6 | 4.2 | 54 | 0.334 | 0.632 | 90 |
| Example 3 | Cpd. 13 | 4.3 | 56 | 0.335 | 0.631 | 80 |
| Example 4 | Cpd. 21 | 4.0 | 55 | 0.334 | 0.633 | 75 |
| Example 5 | Cpd. 33 | 4.1 | 57 | 0.333 | 0.632 | 80 |
| Example 6 | Cpd. 44 | 4.2 | 56 | 0.334 | 0.631 | 85 |
| Example 7 | Cpd. 52 | 4.3 | 53 | 0.335 | 0.631 | 75 |
| Example 8 | Cpd. 3 | 4.4 | 58 | 0.335 | 0.634 | 81 |
| Example 9 | Cpd. 92 | 4.2 | 56 | 0.333 | 0.632 | 88 |

As is understood from the data of Table 1, the organic compounds synthesized according to the present disclosure allowed organic light-emitting diodes to exhibit far higher light emission efficiency, a lower driving voltage, and a longer lifespan than did the conventional phosphorescent host material CBP.

Examples 10 to 14 (Evaluation of OLEDs Employing Combinations of Light-Emitting Layer Materials)

Example 10

Fabrication of Organic Light-Emiting Diode

An ITO glass substrate was patterned to have a translucent area of 2 mm×2 mm and cleansed. The ITO glass substrate was mounted in a vacuum chamber that was then set to have a base pressure of 1×10−6 torr. On the ITO glass substrate, films were formed of HATCN (50 Å) and NPD (900 Å) in that order. A light-emitting layer (400 Å) was formed of a host mixture of Compound 117 synthesized according to the present disclosure and Compound 85, a second host compound represented by Chemical Formula B, at a weight ratio of 5:5, and a green phosphorescent dopant (GD) in an amount of 7% based on the total weight of the host mixture. Then, ET:Liq=1:1 (300 Å), Liq (10 Å), and Al (1,000 Å) were sequentially formed in that order. The organic light-emitting diodes thus obtained were measured at 0.4 mA for luminescence properties.

Example 11

An organic light-emitting diode was fabricated in the same manner as in Example 10, with the exception that Compounds 118 and 93 were used, instead of Compounds 117 and 85, to form a light-emitting layer.

Example 12

An organic light-emitting diode was fabricated in the same manner as in Example 10, with the exception that Compounds 119 and 101 were used, instead of Compounds 117 and 85, to form a light-emitting layer.

Example 13

An organic light-emitting diode was fabricated in the same manner as in Example 10, with the exception that Compounds 118 and 44, instead of Compounds 117 and 85, were used at a weight ratio of 3:7 to form a light-emitting layer.

Example 14

An organic light-emitting diode was fabricated in the same manner as in Example 10, with the exception that Compound 119 and Compound 92 were employed at a weight ratio of 7:3, instead of Compound 117 and Compound 85, for a light-emitting layer.

Comparative Examples 2 to 4

Organic light-emitting diodes were fabricated in the same manner as in Examples 8 to 10, with the exception that the light-emititng layer having the same thickness was formed of only the second host and the dopant without using the heterocyclic compounds represented by Chemical Formula A.

The organic EL diodes fabricated in Examples 8 to 10 and Comparative Examples 2 to 4 were measured for voltage, current density, luminance, color coordinates, and lifespan, and the results are summarized in Table 2, below. In Table 2, T95 refers to the time taken for the initial luminance (6000 cd/m2) to decrease by 5%.

TABLE 2

| | 2nd Host | 1st Host | Wt. Ratio of Hosts | V | Cd/A | CIEx | CIEy | T95 (Hrs) |
|---|---|---|---|---|---|---|---|---|
| Example 10 | Cpd. 117 | Cpd. 85 | 5:5 | 4.0 | 57 | 0.337 | 0.628 | 170 |
| Example 11 | Cpd. 118 | Cpd. 93 | 5:5 | 3.9 | 55 | 0.322 | 0.629 | 160 |
| Example 12 | Cpd. 119 | Cpd. 101 | 5:5 | 3.9 | 56 | 0.330 | 0.626 | 190 |
| Example 13 | Cpd. 118 | Cpd. 44 | 3:7 | 4.4 | 61 | 0.339 | 0.633 | 207 |
| Example 14 | Cpd. 119 | Cpd. 92 | 7:3 | 3.8 | 53 | 0.331 | 0.628 | 151 |
| C. Example 2 | Cpd. 117 | | 1 | 6.2 | 10.1 | 0.333 | 0.609 | 8 |
| C. Example 3 | Cpd. 118 | | 1 | 6.0 | 11.2 | 0.325 | 0.620 | 7 |
| C. Example 4 | Cpd. 119 | | 1 | 6.5 | 9.2 | 0.326 | 0.621 | 5 |

As is understood from the data of Table 2, the organic light-emitting diodes of Examples 10 to 14 exhibited excellent driving voltage, efficiency and lifespan, compared to those of Comparative Examples 2 to 4.

Fabrication of Organic Light-Emitting Diode (Use of Electron Transport Layer)

Examples 15 to 17

Under the same condition as in Example 1, organic light-emitting diodes were fabricated with some exceptions. HATCN (50 Å) and NPD (650 Å) were formed in that order on an ITO which was then doped with the following blue host (BH)+5% of blue dopant (BD) to form a light-emitting layer 200 Å thick. Then, Compound 85, 93, or 101 synthesized according to the present disclosure and Liq were deposited at a ratio of 1:1 to form an electron transport layer 300 Å thick, on which an electron injection layer of Liq (10 Å) was formed and then covered with an Al layer (1000 Å). The organic light-emitting diodes thus obtained were measured at 0.4 mA for luminescence properties.

Structures of [BD], [BH], and [Liq] are as follows.

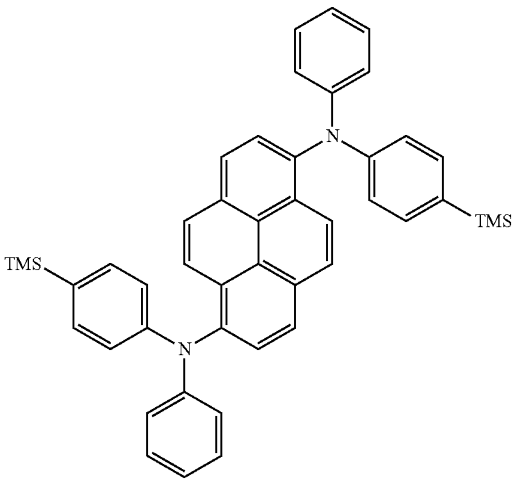

[BD]

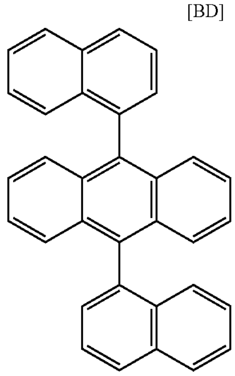

[BH]

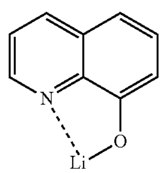

[Liq]

Comparative Example 5

An organic light-emitting diode of Comparative Example 5 was fabricated in the same conditions as in the Examples, with the exception that ET, a general electron transport material, was used, instead of the compounds according to the present disclosure, in Example 1.

The organic EL diodes fabricated in Examples 15 to 17 and Comparative Example 5 were measured for voltage, current density, luminance, color coordinates, and lifespan, and the results are summarized in Table 3, below. In Table 3, T95 refers to the time taken for the initial luminance (2000 cd/m2) to decrease by 5%.

TABLE 3

| | ETL | V | Cd/A | CIEx | CIEy | T95(Hrs) |
|---|---|---|---|---|---|---|
| C. Example 5 | ET | 4.3 | 6.5 | 0.133 | 0.129 | 10 |
| Example 15 | Cpd. 85 | 3.6 | 8.1 | 0.132 | 0.130 | 35 |
| Example 16 | Cpd. 93 | 3.7 | 8.2 | 0.133 | 0.128 | 32 |
| Example 17 | Cpd. 101 | 3.8 | 8.3 | 0.132 | 0.126 | 28 |

As is understood from the data of Table 3, the organic compounds synthesized according to the present disclosure exhibited higher efficiency, lower driving voltage, and longer lifespan, compared to ET, a conventional material widely used for an electron transport layer.

Exhibiting excellent emission efficiency with long lifespan and low driving volgate properties, as described hitherto, the heterocyclic compounds of the present disclosure, when used as phosphorescent host or electron transport materials, allow for the fabrication of stable and excellent diodes.

The present invention may be variously modified and include various exemplary embodiments in which specific exemplary embodiments will be described in detail hereinbelow. However, it shall be understood that the specific exemplary embodiments are not intended to limit the present invention thereto and cover all the modifications, equivalents and substitutions which belong to the idea and technical scope of the present invention.

What is claimed is:

1. A heterocyclic compound represented by the following Chemical Formula A-1 or Chemical Formula A-2:

[Chemical Formula A-1]

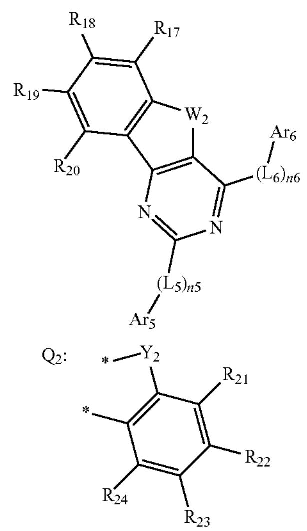

[Chemical Formula A-2]

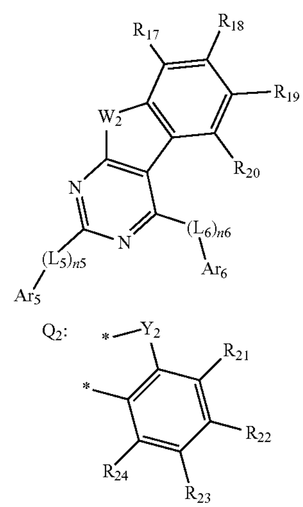

wherein, two adjacent substituents of R17 to R20 each represent a single bond occupying respective positions * of Structural Formula Q2, W2 is any one selected from among O, S, and CR25R26, Y2 is any one selected from among O, S, and CR27R28, linkers L5 and L6 are the same or different and are each independently selected from among a single bond, a substituted or unsubstituted alkylene of 1 to 60 carbon atoms, a substituted or unsubstituted cycloalkylene of 3 to 60 carbon atoms, a substituted or unsubstituted arylene of 6 to 60 carbon atoms, and a substituted or unsubstituted heteroarylene of 2 to 60 carbon atoms, n5 and n6 are each an integer of 0 to 3, with a proviso that when each of them is 2 or greater, corresponding L5 and L6 may each be the same or different, Ar5 and Ar6 are the same or different and are each independently selected from among hydrogen, deuterium, a substituted or unsubstituted alkyl of 1 to 30 carbon atoms, a substituted or unsubstituted aryl of 6 to 40 carbon atoms, and a substituted or unsubstituted heteroaryl of 2 to 30 carbon atoms, R17 to R28 are the same or different and are each independently selected from among hydrogen, deuterium, a substituted or unsubstituted alkyl of 1 to 30 carbon atoms, a substituted or unsubstituted cycloalkyl of 3 to 30 carbon atoms, a substituted or unsubstituted aryl of 5 to 50 carbon atoms, a substituted or unsubstituted heteroaryl of 3 to 50 carbon atoms bearing O, N, or S as a heteroatom, a substituted or unsubstituted alkylsilyl of 1 to 24 carbon atoms, a substituted or unsubstituted arylsilyl of 6 to 24 carbon atoms, a nitrile, a nitro, and a halogen, with the proviso that adjacent substituents may form a fused aliphatic, aromatic, aliphatic heterocyclic or aromatic heterocyclic ring, wherein the term 'substituted' in the expression 'substituted or unsubstituted' used in Chemical Formula A-1 and Chemical Formula A-2 means having at least one substituent selected from the group consisting of a deuterium, a cyano, a halogen, a nitro, an alkyl of 1 to 24 carbon atoms, a halogenated alkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkylsilyl of 1 to 24 carbon atoms, and an arylsilyl of 6 to 24 carbon atoms.

2. The heterocyclic compound of claim 1, wherein linkers L5 and L6 of Chemical Formula A-1 and Chemical Formula A-2 are the same or different and are each independently a single bond or a linker selected from among compounds represented by the following Structural Formulas 1 to 9:

[Structural Formula 1]

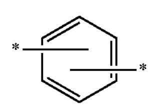

[Structural Formula 2]

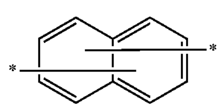

[Structural Formula 3]

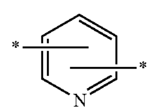

[Structural Formula 4]

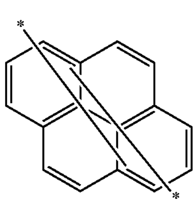

-continued

[Structural Formula 5]

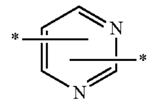

[Structural Formula 6]

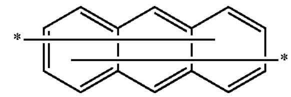

[Structural Formula 7]

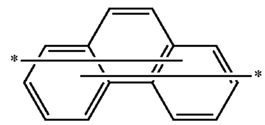

[Structural Formula 8]

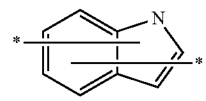

[Structural Formula 9]

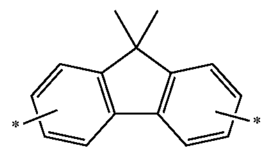

wherein each of the unsubstituted carbon atoms of the aromatic ring moiety in the linkers is bound with a hydrogen atom or a deuterium atom.

3. The heterocyclic compound of claim 1, wherein n5 and n6 of Chemical Formula A-1 and Chemical Formula A-2 are the same or different and are each 0 or 1.

4. The heterocyclic compound of claim 1, wherein one of Ar5 and Ar6 in Chemical Formula A-1 and Chemical Formula A-2 is a substituted or unsubstituted heteroaryl of 2 to 20 carbon atoms bearing a heteroatom selected from among O, S, and N.

5. The heterocyclic compound of claim 1, wherein R17 to R28 in Chemical Formula A-1 and Chemical Formula A-2 are the same or different and are each independently selected from among hydrogen, deuterium, a substituted or unsubstituted alkyl of 1 to 20 carbon atoms; a substituted or unsubstituted cycloalkyl of 3 to 20 carbon atoms; a substituted or unsubstituted aryl of 6 to 20 carbon atoms; and a substituted or unsubstituted heteroaryl of 2 to 20 carbon atoms.

6. The heterocyclic compound of claim 1, wherein one of Ar5 and Ar6 in Chemical Formulas A-1 and A-2 may be a substituent represented by one of the following Chemical Formulas A to E:

[Structural Formula A]

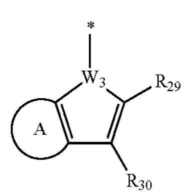

-continued

[Structural Formula B]

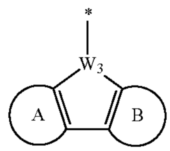

[Structural Formula C]

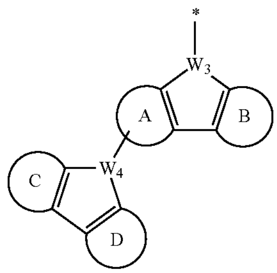

[Structural Formula D]

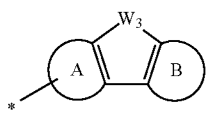

[Structural Formula E]

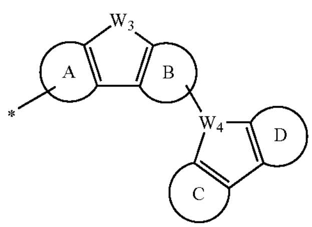

in Structural Formulas A, B, and C of which

W3 is N or C—R31, and W4 is N or C—R32, in Structural Formulas D and E of which

W3 is selected from among O, S, N—R31, and C—R32 (—R33), and W4 is selected from among O, S, N—R34, and C—R35(—R36), and in all Structural Formulas A to E of which, R29 to R36 may be the same or different and are each as defined above for R17 to R28, and, means a binding site at which linker L5 or L6 is bonded to the moiety linked thereto, cyclic moieties

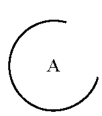

to

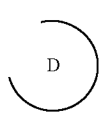

may be the same or different and are each a hydrocarbon ring of 4 to 20 carbon atoms capable of forming a 5- or 6-membered aliphatic or aromatic mono- or polycyclic ring.

7. The heterocyclic compound of claim 1, being represented by any one of the following Compounds 1 to 116:

[Compound 1]

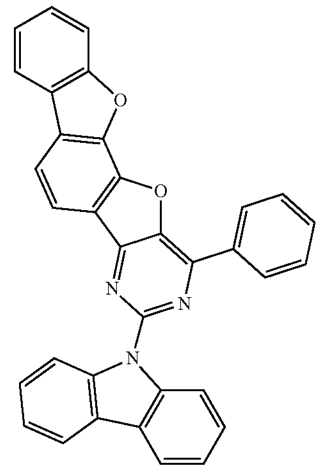

[Compound 2]

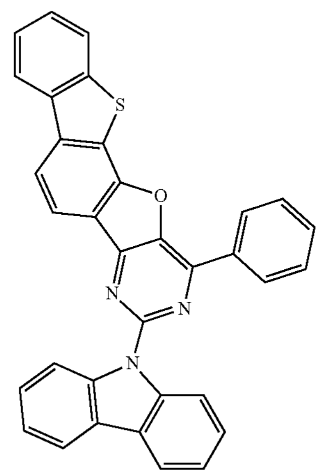

[Compound 3]

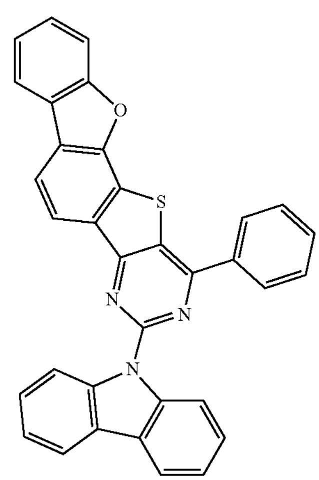

[Compound 4]
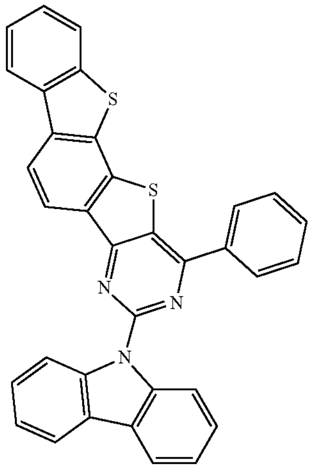
[Compound 5]
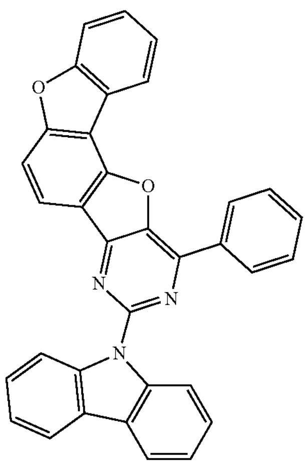
[Compound 6]
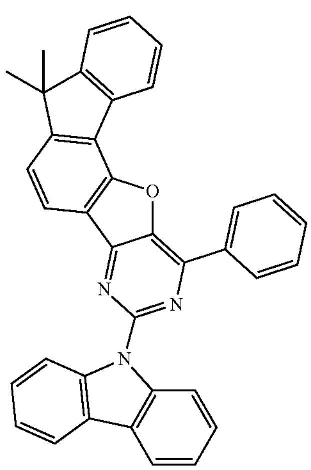
[Compound 7]
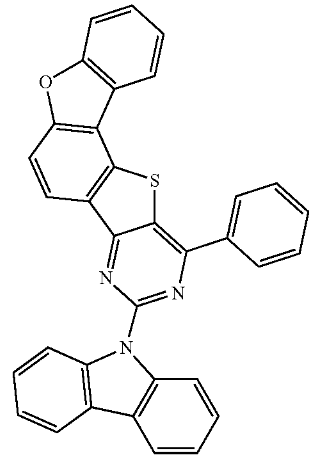
[Compound 8]
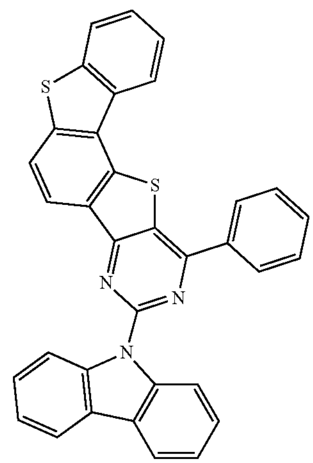
[Compound 9]
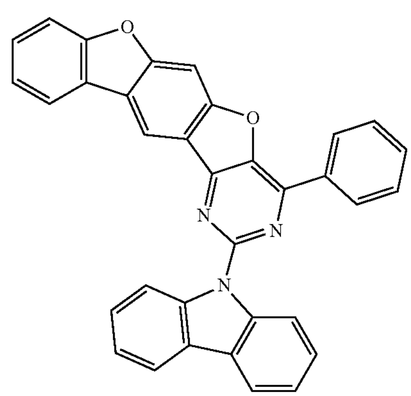

-continued
[Compound 10]
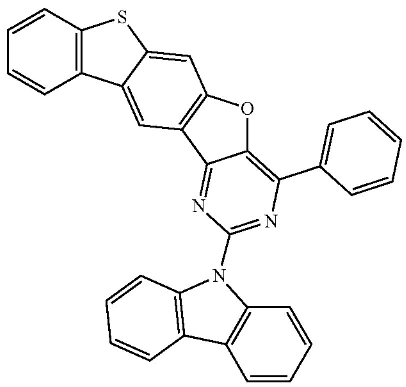
[Compound 11]
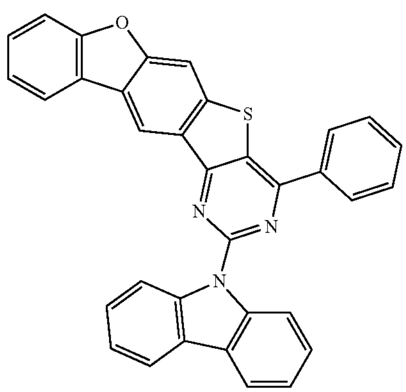
[Compound 12]
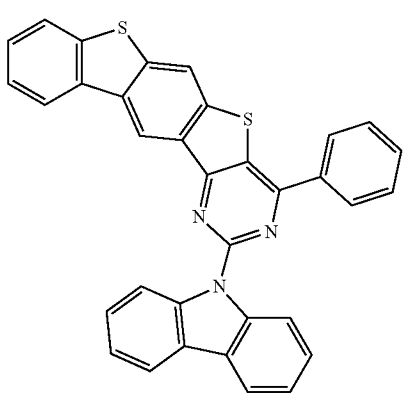
-continued
[Compound 13]
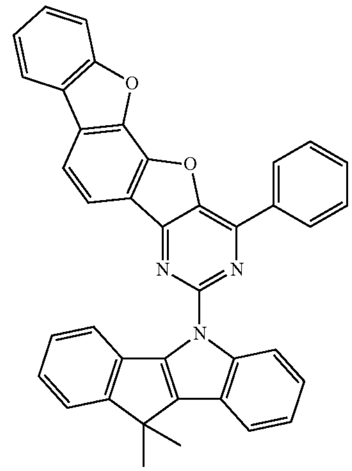
[Compound 14]
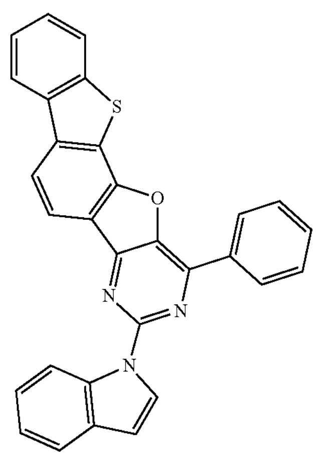
[Compound 15]
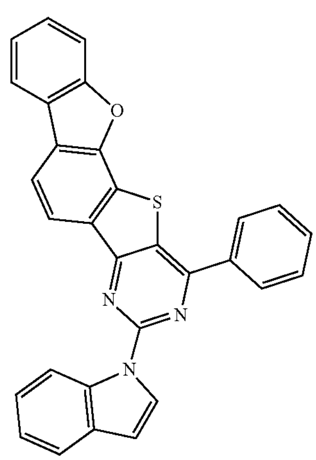

[Compound 16]
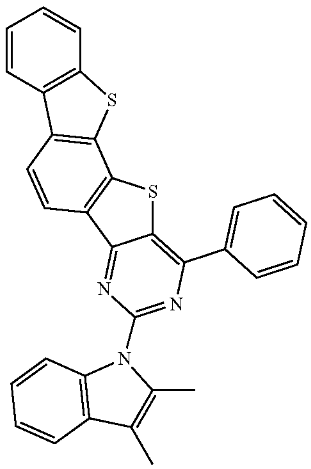
[Compound 17]
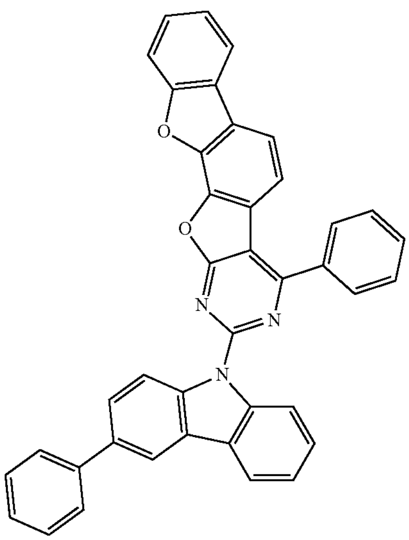
[Compound 18]
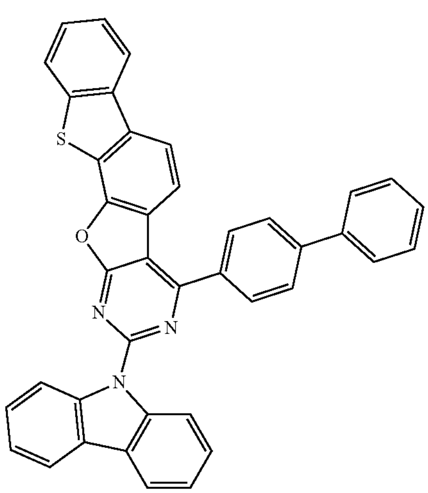
[Compound 19]
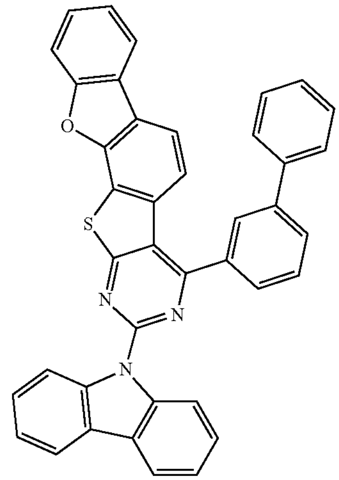
[Compound 20]
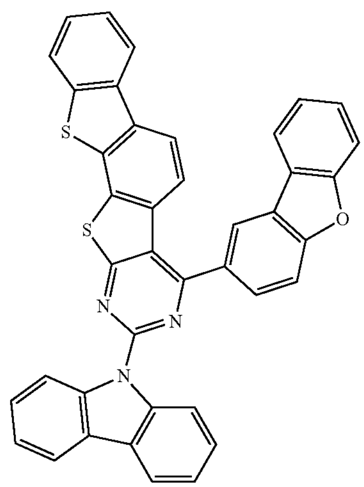
[Compound 21]
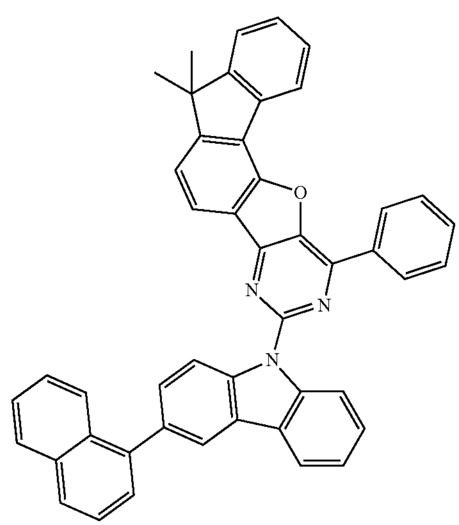

-continued
[Compound 22]
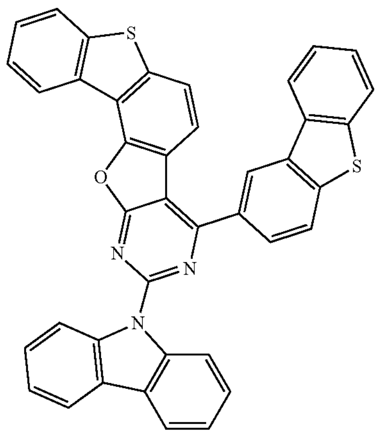
[Compound 23]
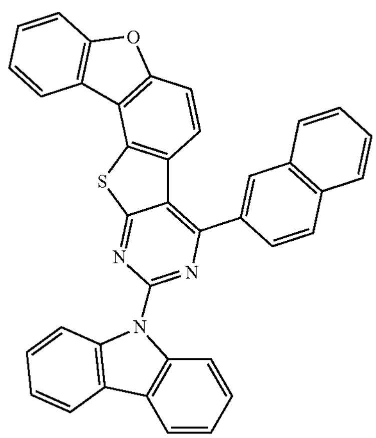
[Compound 24]
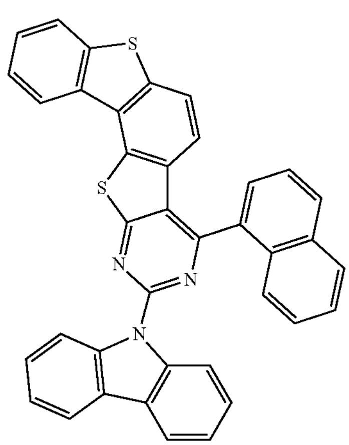
-continued
[Compound 25]
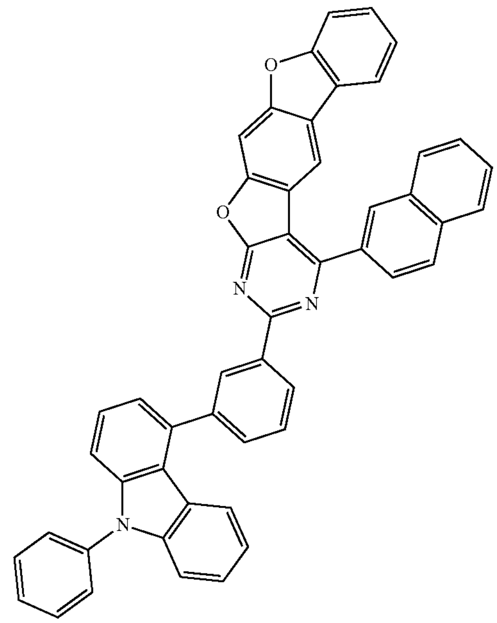
[Compound 26]
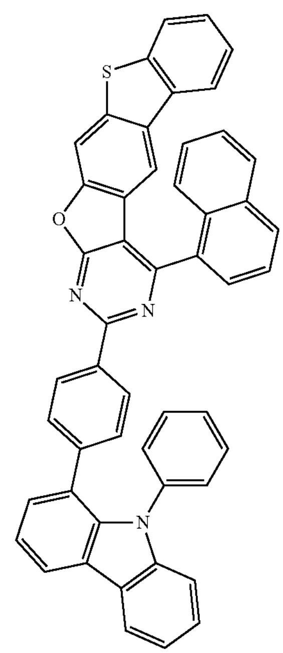

[Compound 27]
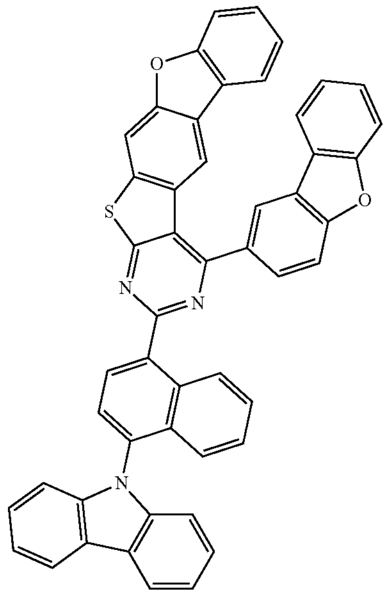
[Compound 28]
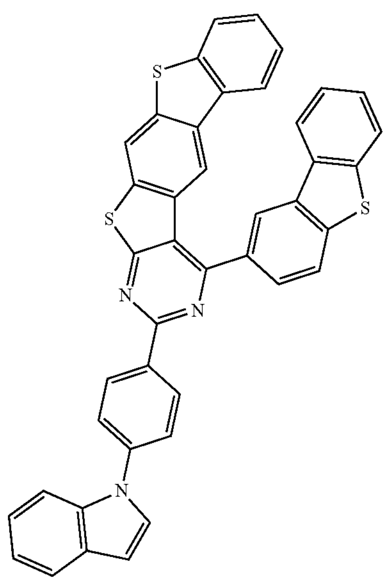
[Compound 29]
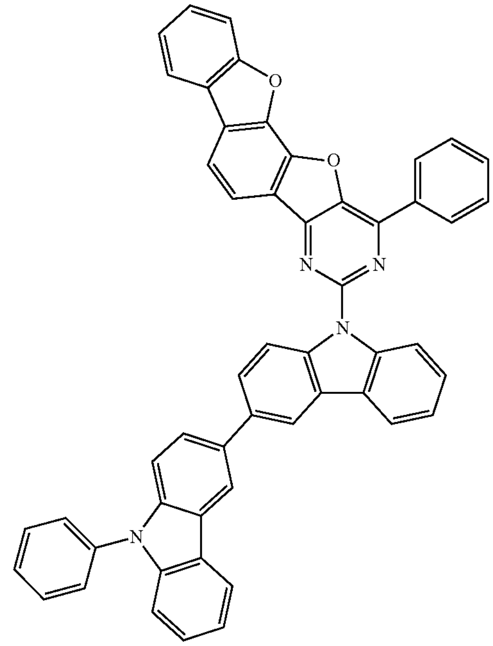
[Compound 30]
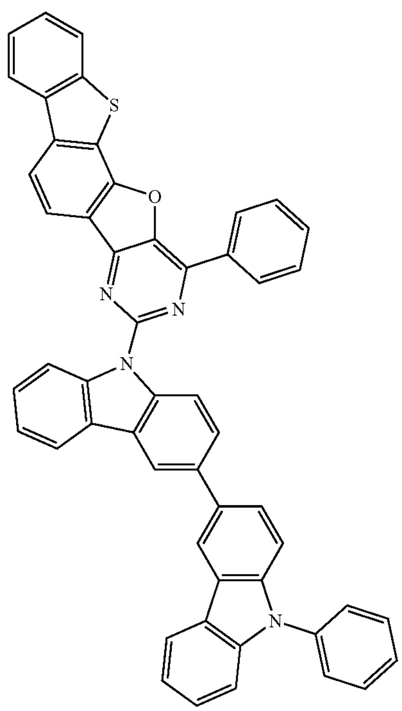

[Compound 31]
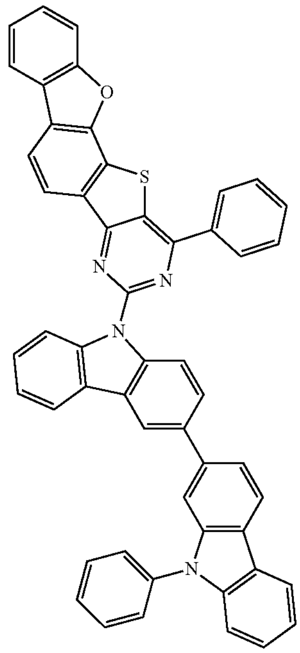
[Compound 32]
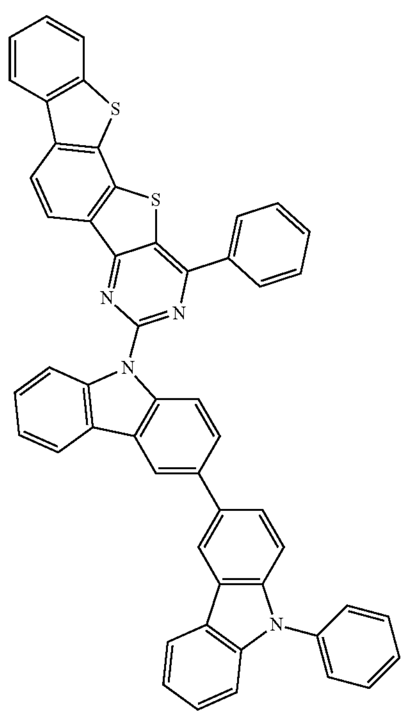
[Compound 33]
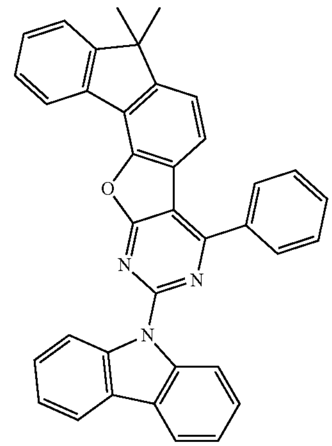
[Compound 34]
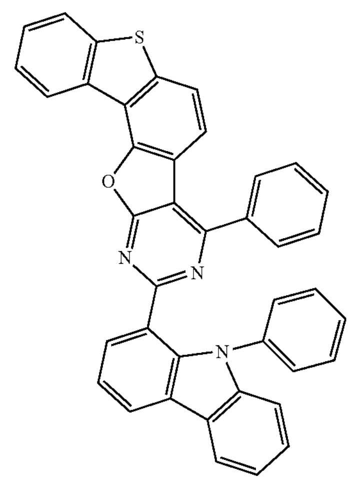
[Compound 35]
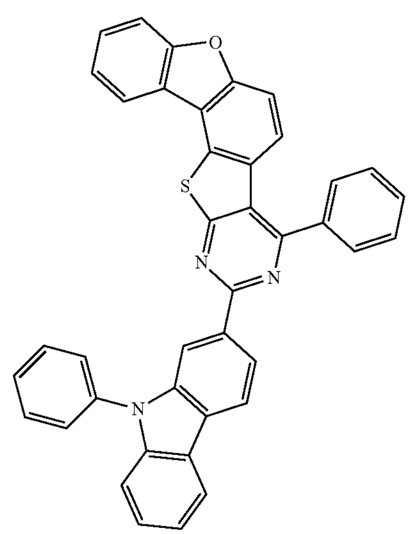

[Compound 36]
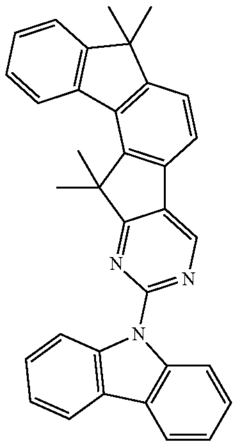
[Compound 38]
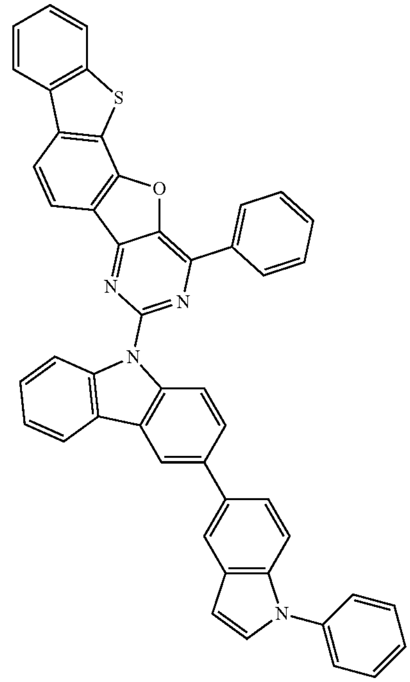
[Compound 37]
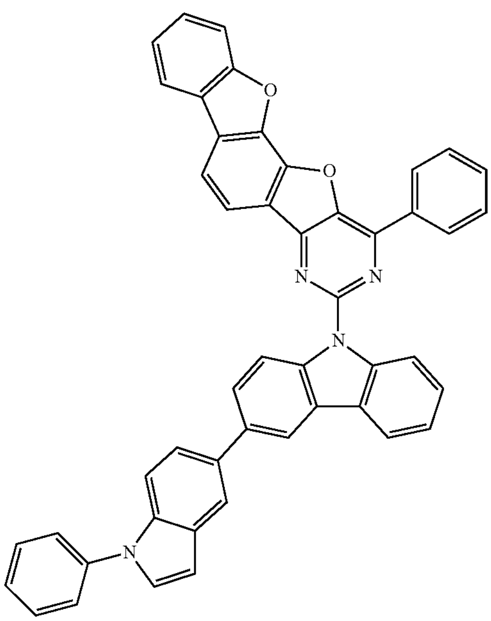
[Compound 39]
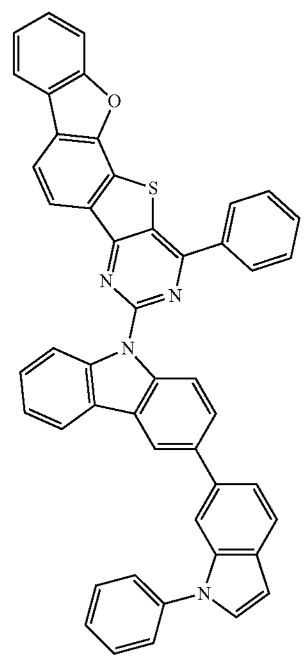

-continued
[Compound 40]
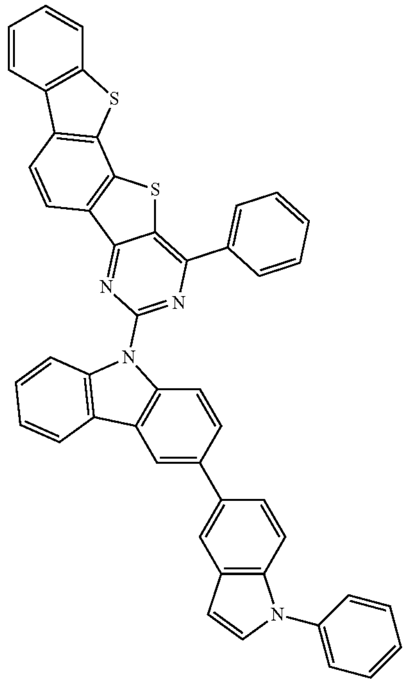
[Compound 41]
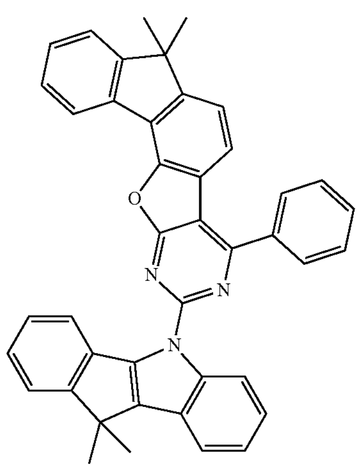
-continued
[Compound 42]
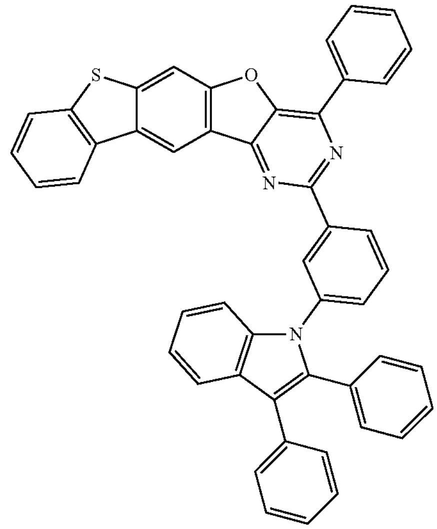
[Compound 43]
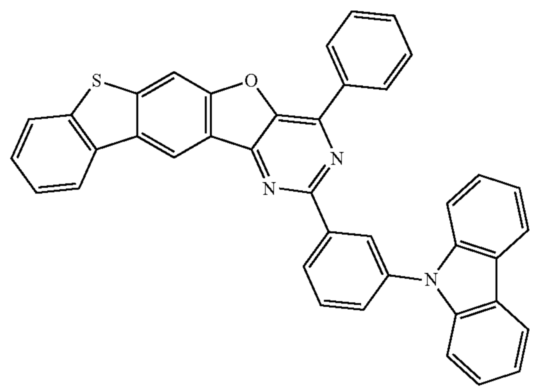
[Compound 44]
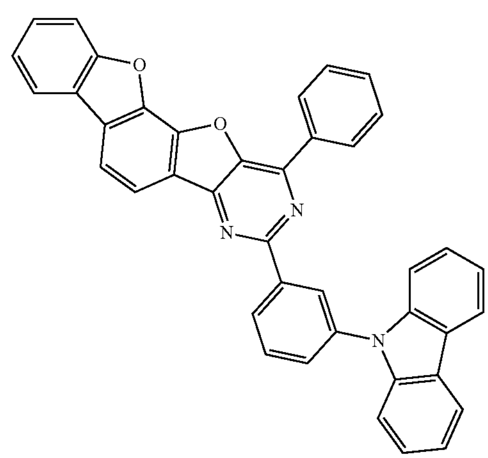

-continued
[Compound 45]
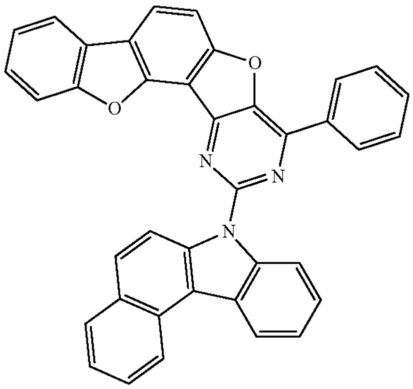
[Compound 46]
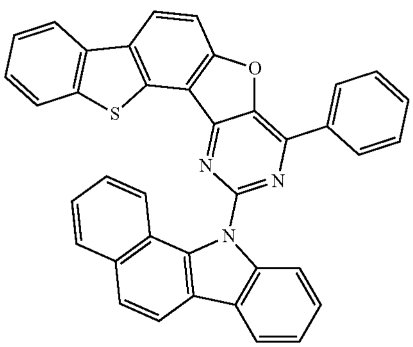
[Compound 47]
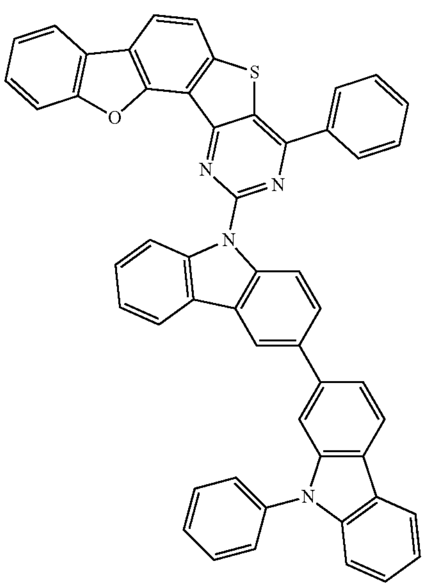
-continued
[Compound 48]
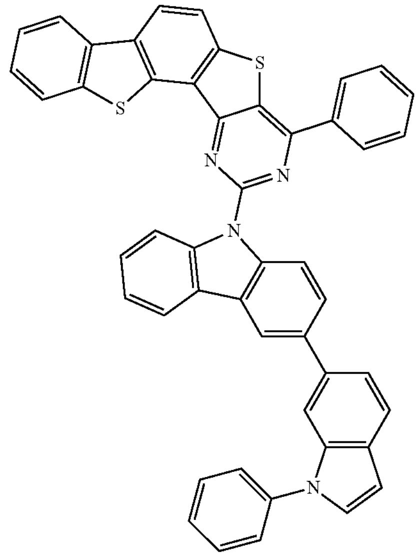
[Compound 49]
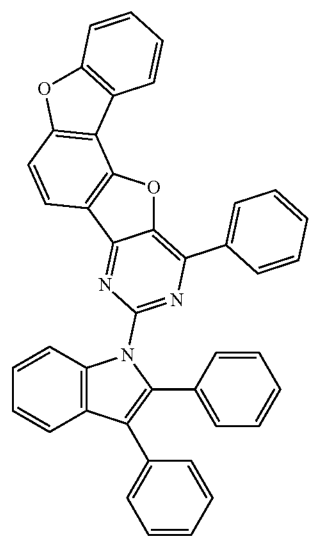
[Compound 50]
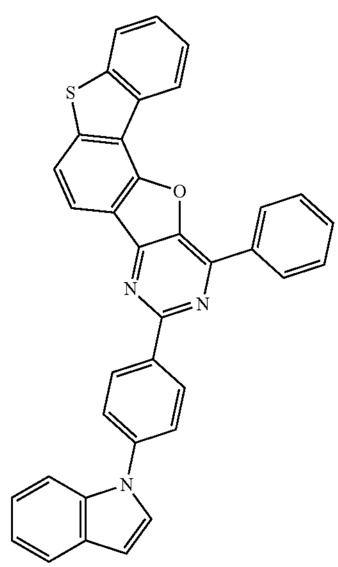

-continued
[Compound 51]
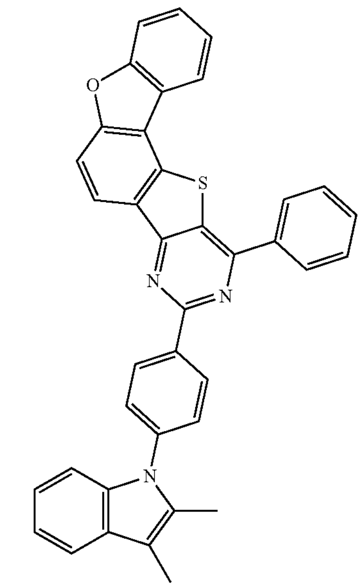
[Compound 52]
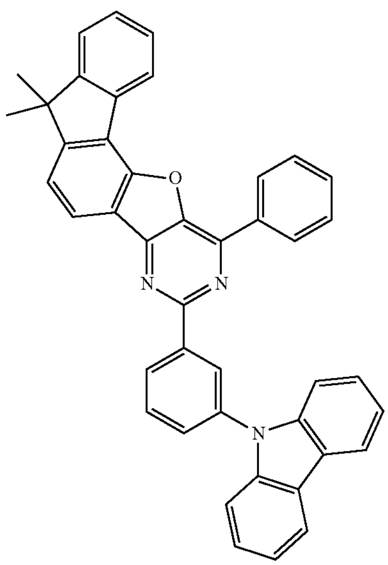
[Compound 53]
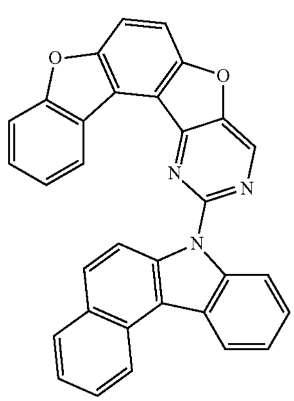
-continued
[Compound 54]
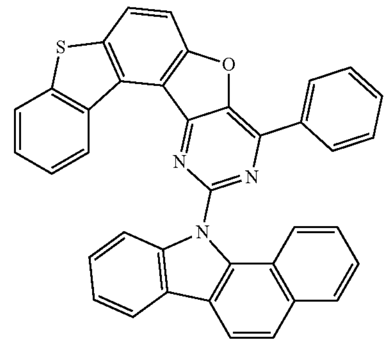
[Compound 55]
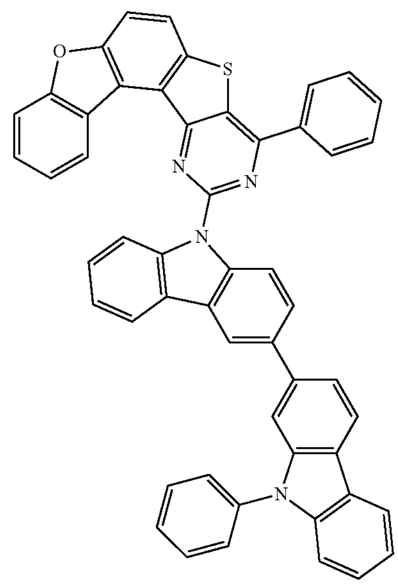
[Compound 56]
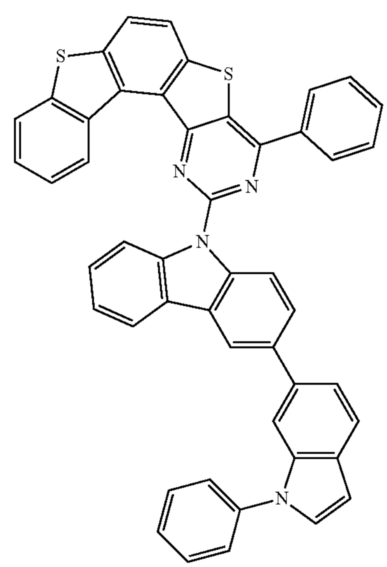

-continued
[Compound 57]
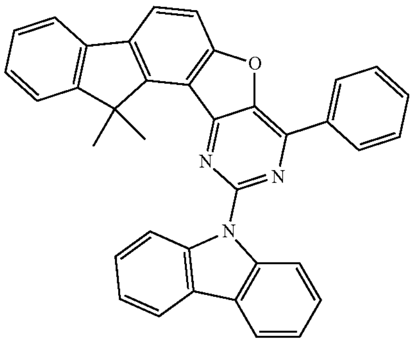
[Compound 58]
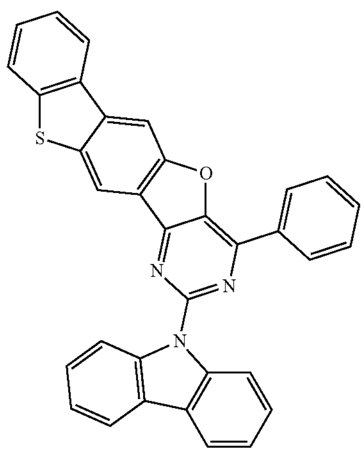
[Compound 59]
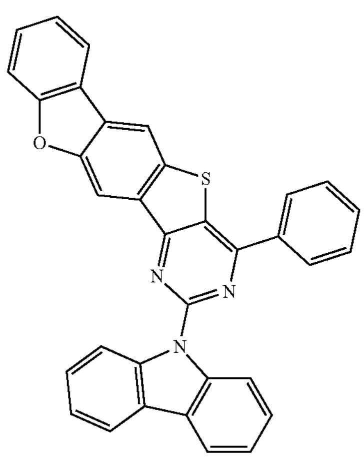
-continued
[Compound 60]
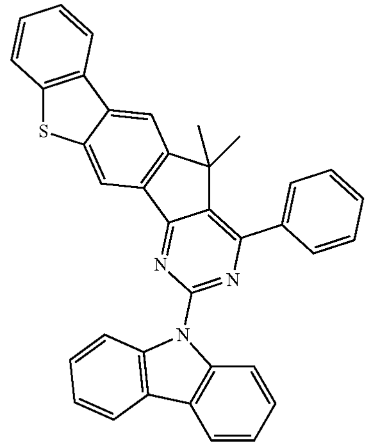
[Compound 61]
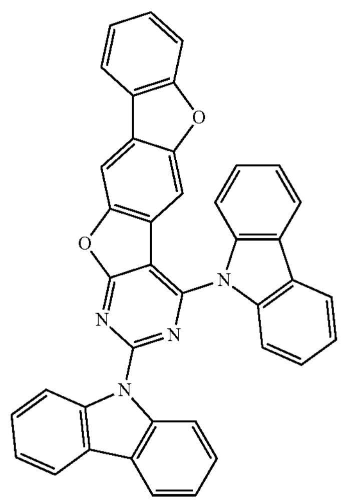
[Compound 62]
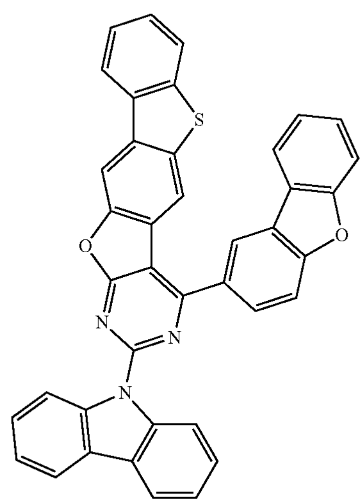

[Compound 63]
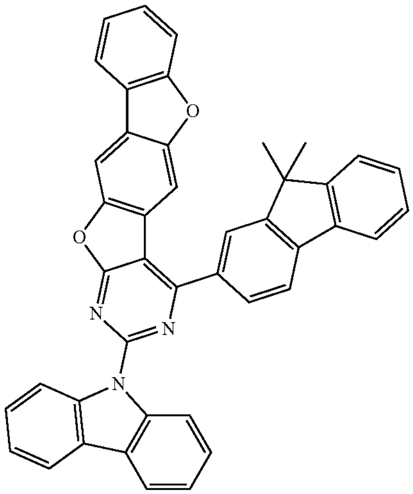
[Compound 64]
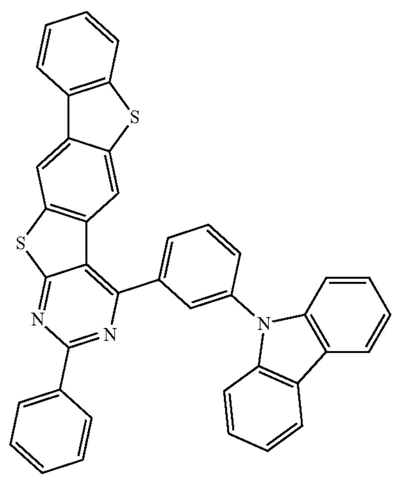
[Compound 65]
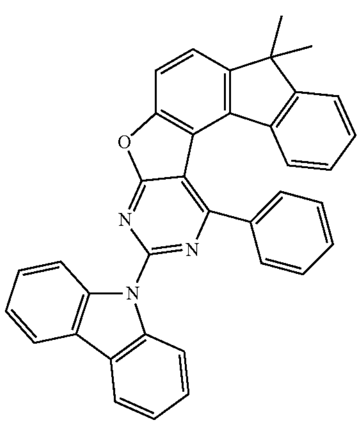
[Compound 66]
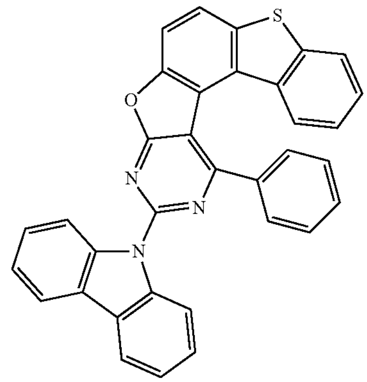
[Compound 67]
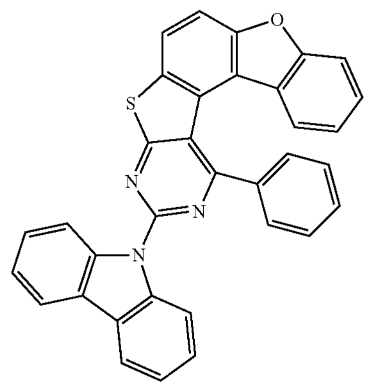
[Compound 68]
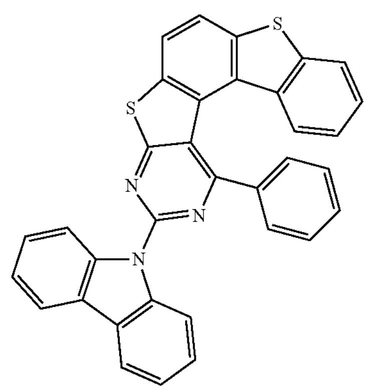
[Compound 69]
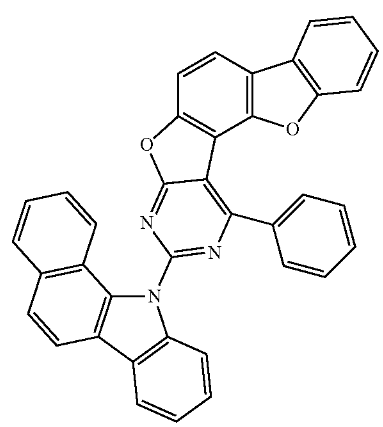

-continued
[Compound 70]
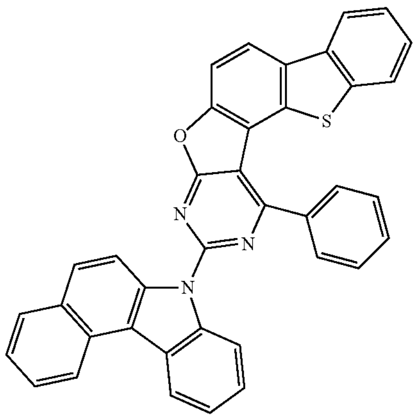
[Compound 71]
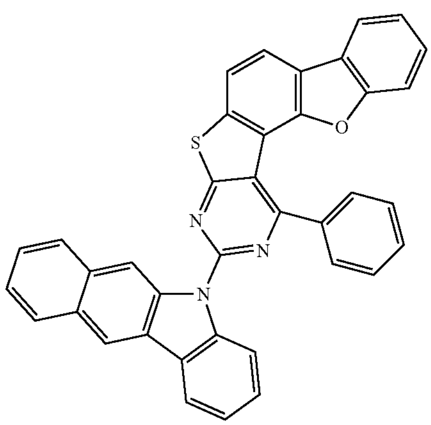
[Compound 72]
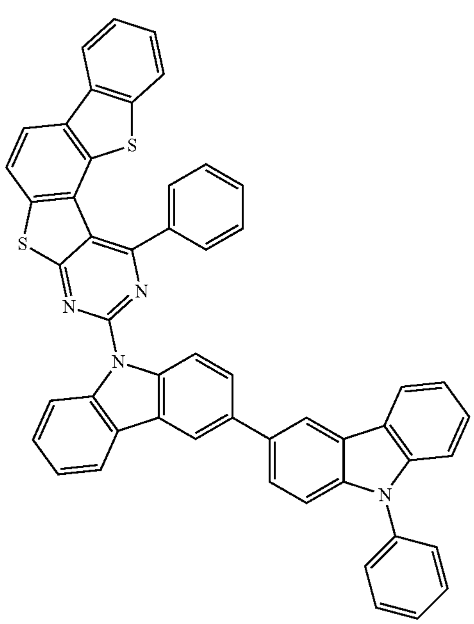
-continued
[Compound 73]
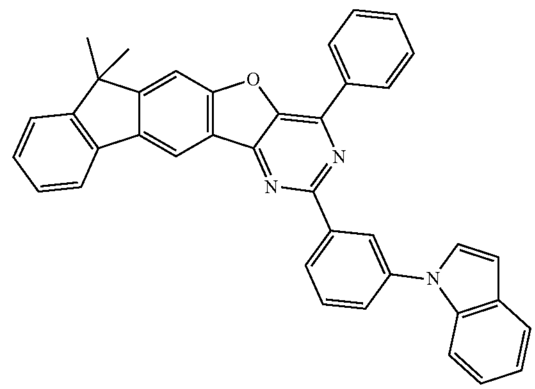
[Compound 74]
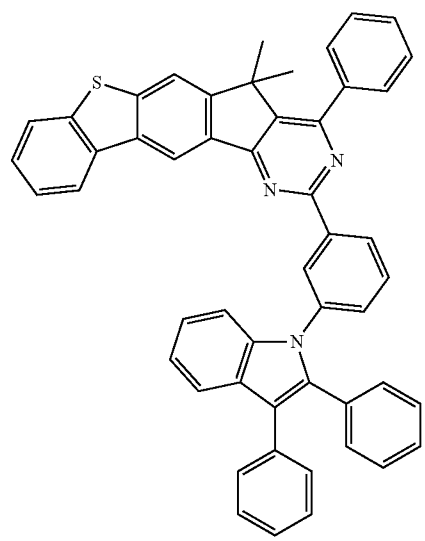
[Compound 75]
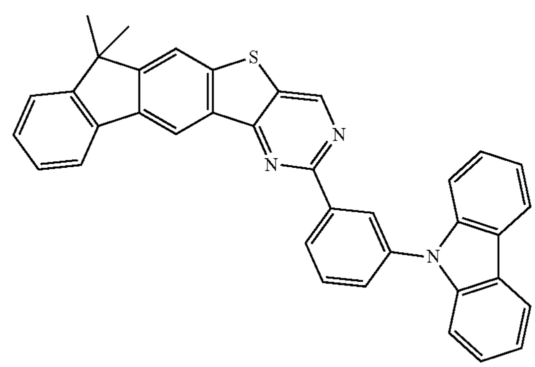

-continued
[Compound 76]
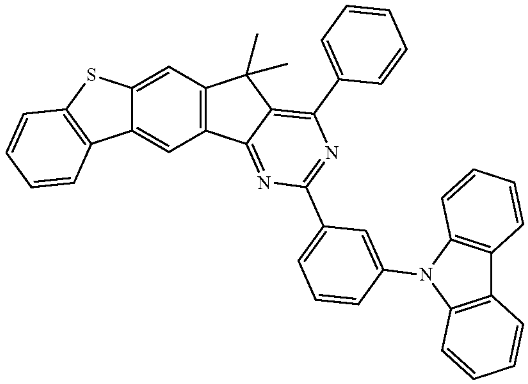
[Compound 77]
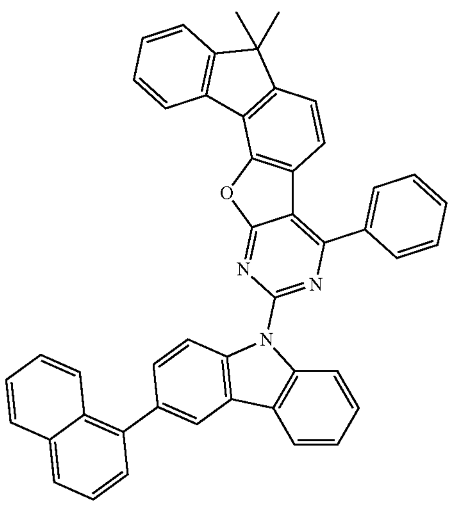
[Compound 78]
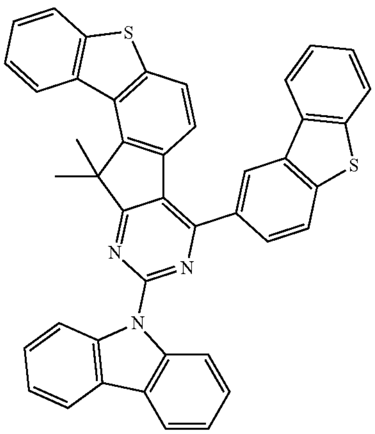
-continued
[Compound 79]
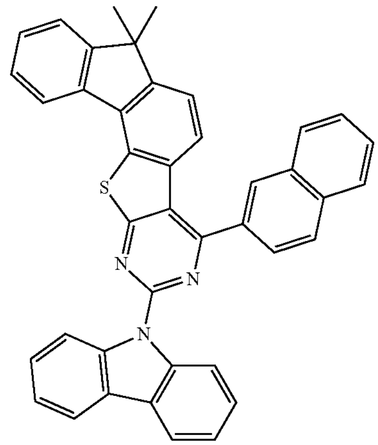
[Compound 80]
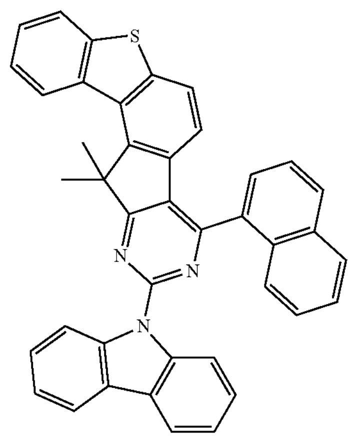
[Compound 81]
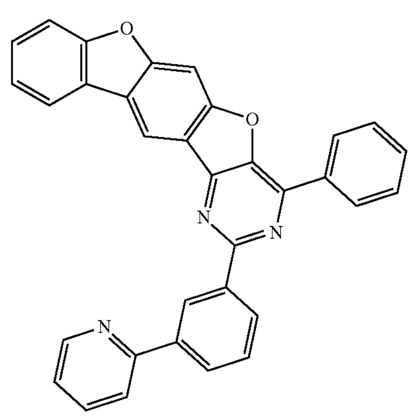

-continued
[Compound 82]
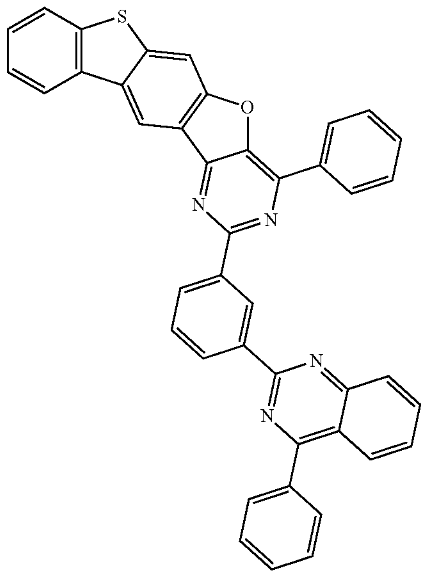
[Compound 83]
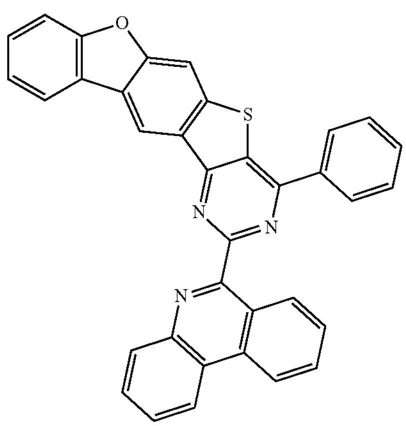
[Compound 84]
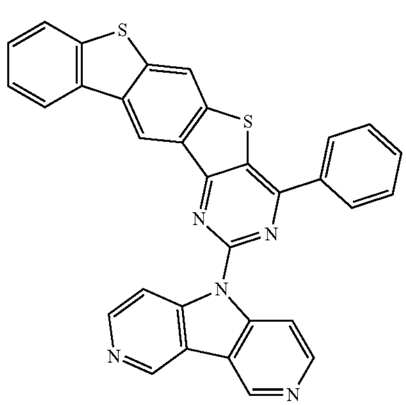
-continued
[Compound 85]
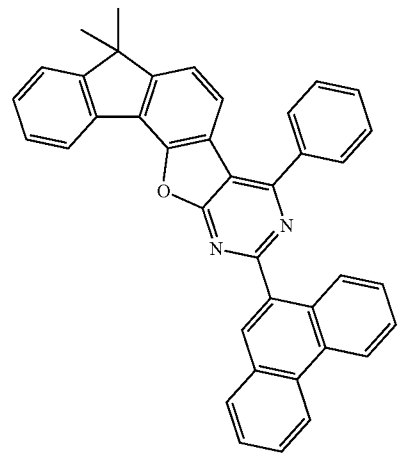
[Compound 86]
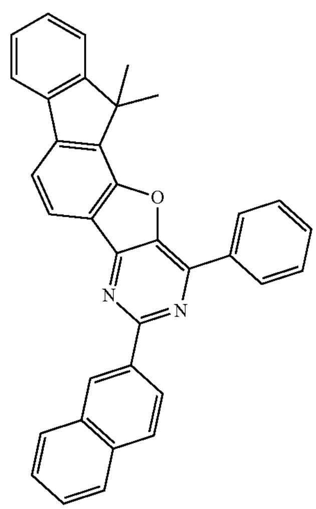
[Compound 87]
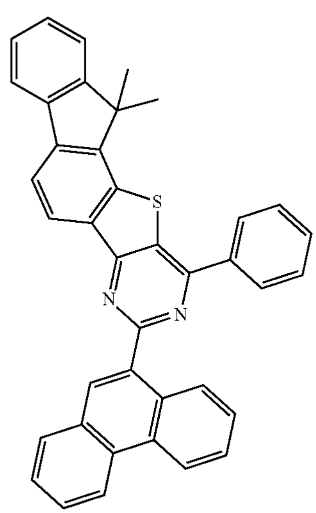

-continued
[Compound 88]
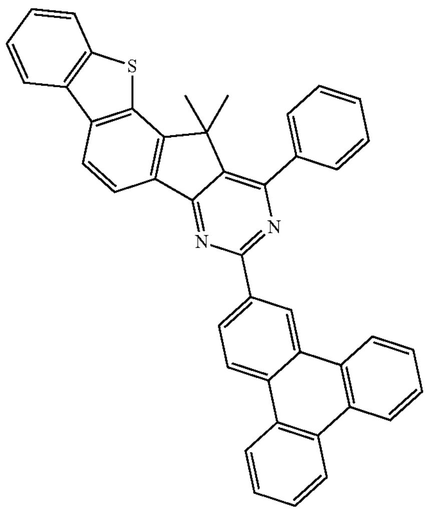
[Compound 89]
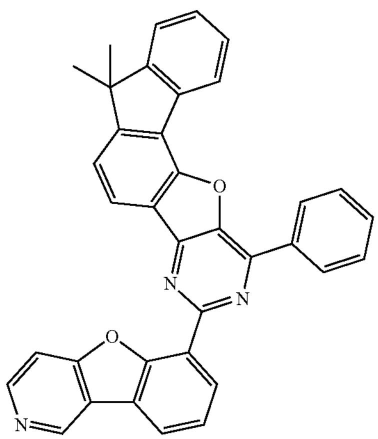
[Compound 90]
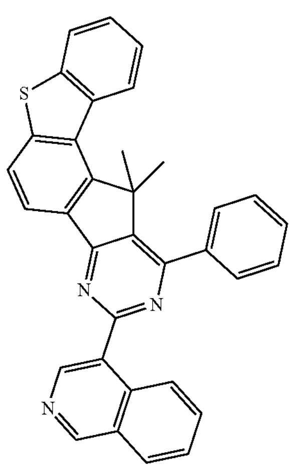
-continued
[Compound 91]
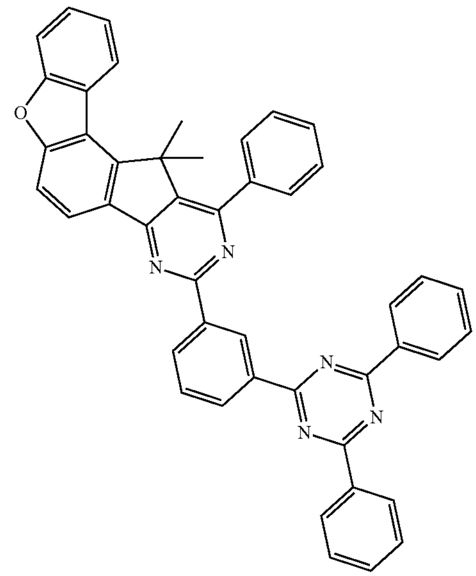
[Compound 92]
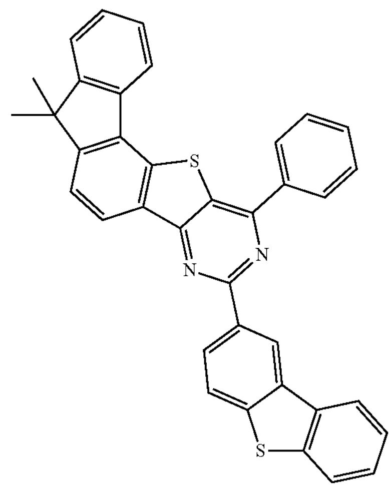
[Compound 93]
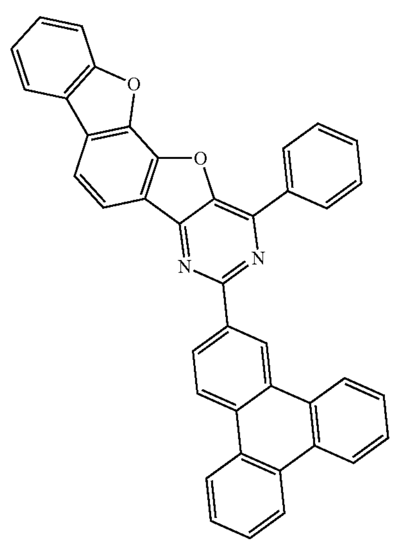

-continued
[Compound 94]
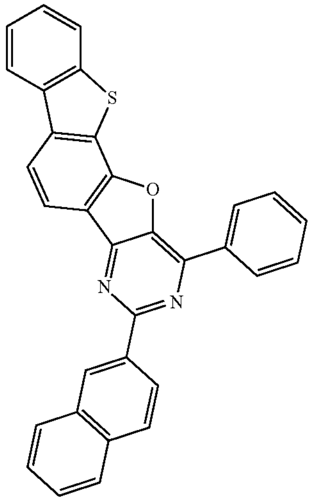
[Compound 95]
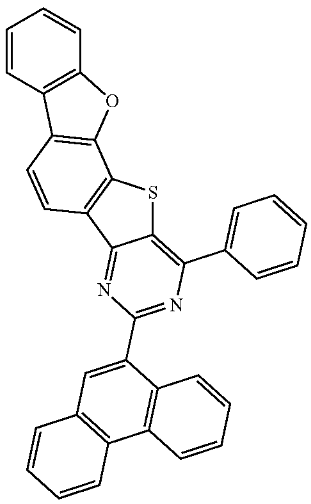
[Compound 96]
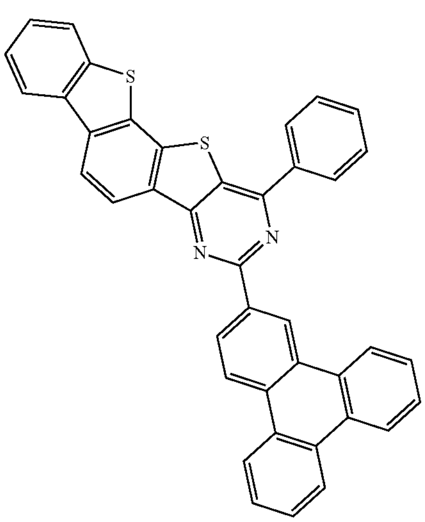
-continued
[Compound 97]
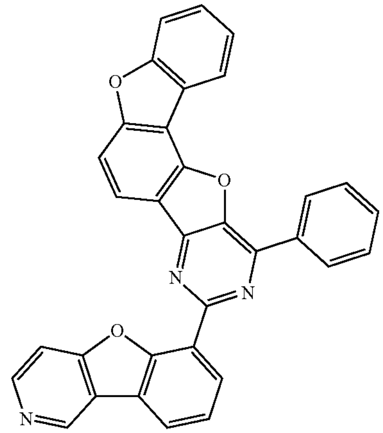
[Compound 98]
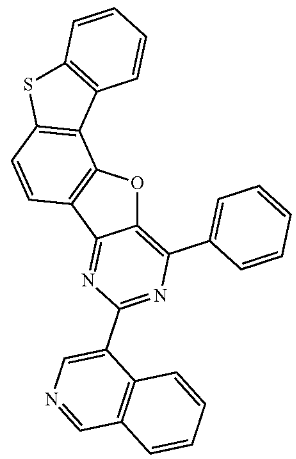
[Compound 99]
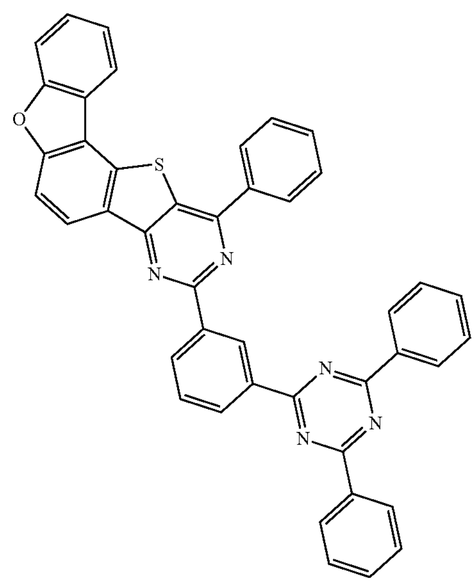

-continued
[Compound 100]
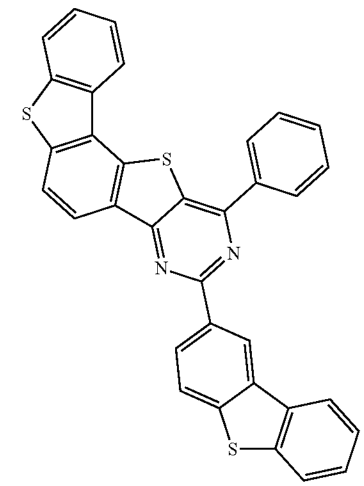
[Compound 101]
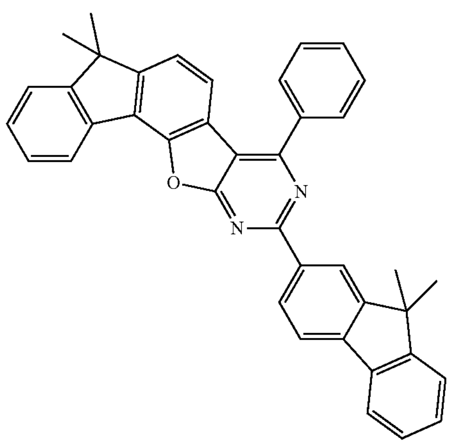
[Compound 102]
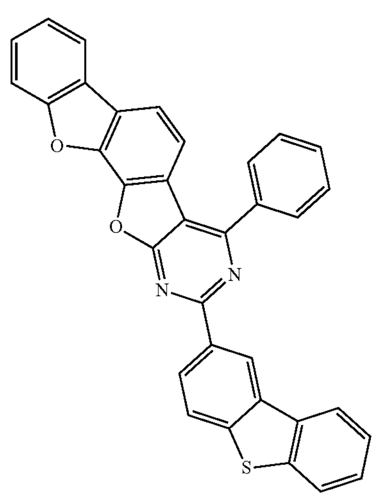
-continued
[Compound 103]
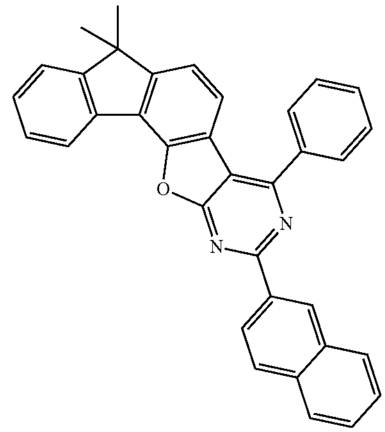
[Compound 104]
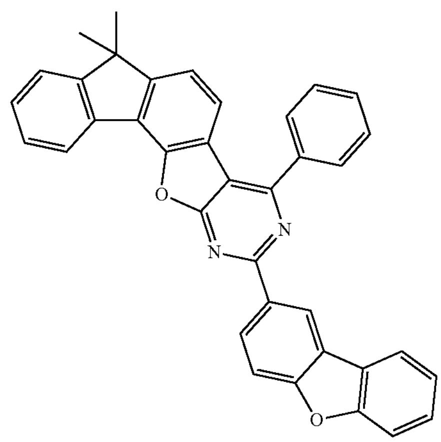
[Compound 105]
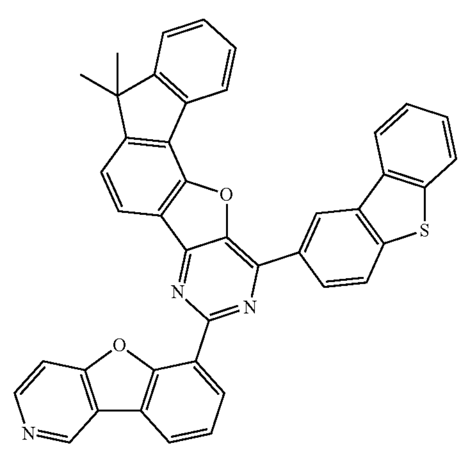

-continued
[Compound 106]
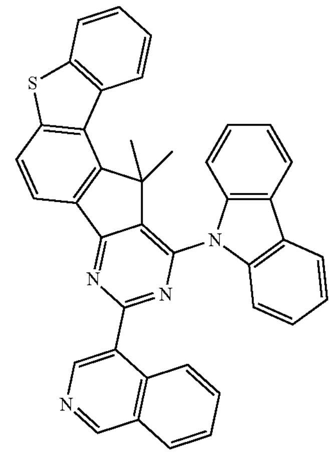
[Compound 107]
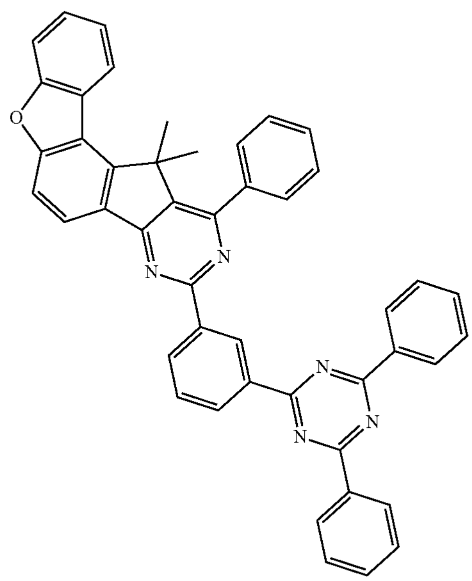
[Compound 108]
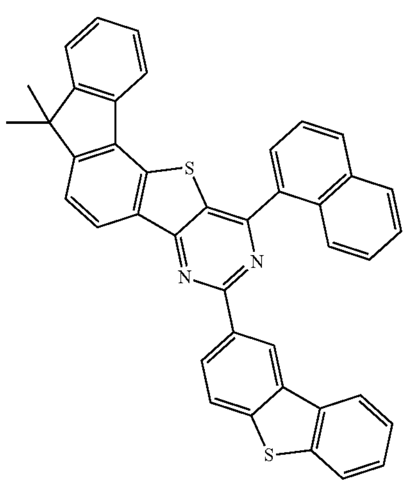
-continued
[Compound 109]
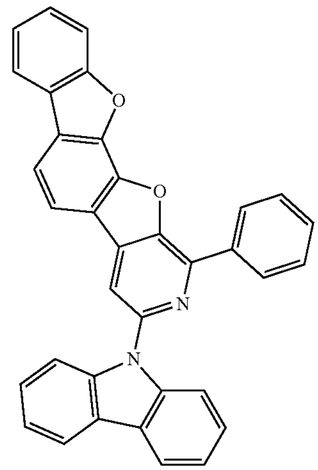
[Compound 110]
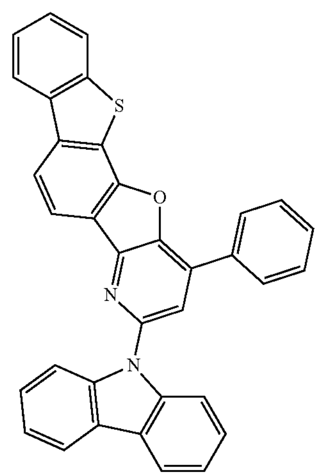
[Compound 111]
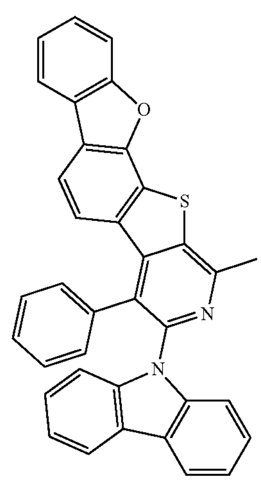

-continued

[Compound 112]

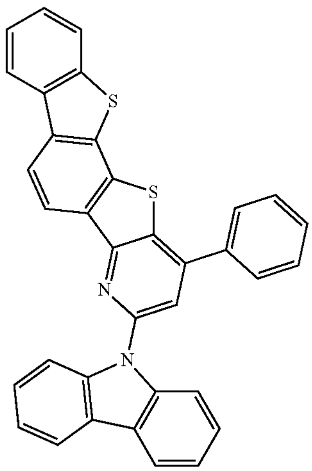

[Compound 113]

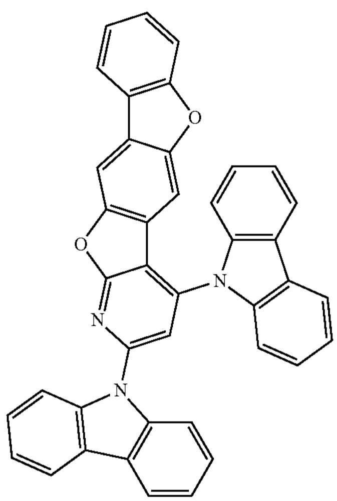

[Compound 114]

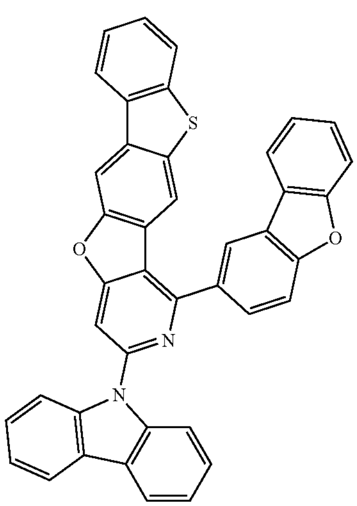

-continued

[Compound 115]

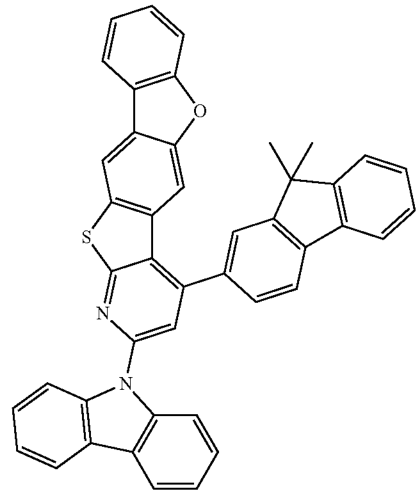

[Compound 116]

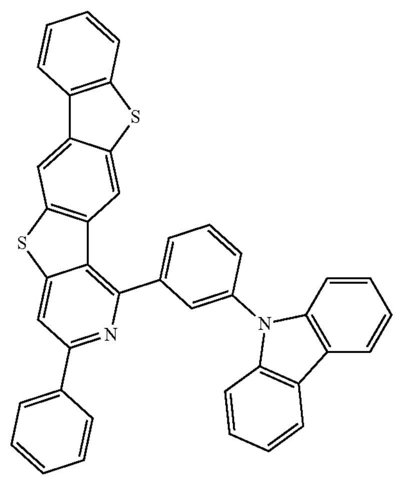

8. An organic light-emitting diode, comprising:

a first electrode;

a second electrode; and an organic layer interposed therebetween, wherein the organic layer comprises at least one compound of claim 1.

9. The organic light-emitting diode of claim 8, wherein the organic layer comprises at least one of a hole injection layer, a hole transport layer, a functional layer capable of both hole injection and hole transport, a light-emitting layer, an electron transport layer, and an electron injection layer.

10. The organic light-emitting diode of claim 9, wherein the organic layer interposed between the first electrode and the second electrode comprises a light-emitting layer composed of a host and a dopant, the heterocyclic compound serving as the host.

11. The organic light-emitting diode of claim 10, wherein the host further comprises a heterocyclic compound represented by the following Chemical Formula B:

[Chemical Formula B]

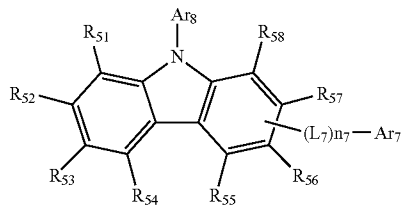

wherein,

L7 is a single bond or a linker selected from among a substituted or unsubstituted alkylene of 1 to 20 carbon atoms, a substituted or unsubstituted alkenylene of 2 to 20 carbon atoms, a substituted or unsubstituted alkynylene of 2 to 20 carbon atoms, a substituted or unsubstituted cycloalkylene of 3 to 20 carbon atoms, a substituted or unsubstituted heterocycloalkylene of 2 to 20 carbon atoms, a substituted or unsubstituted arylene of 6 to 20 carbon atoms, and a substituted or unsubstituted heteroarylene of 2 to 20 carbon atoms, n7 is an integer of 0 to 2, Ar7 and Ar8 may be the same or different and are each independent as defined above for Ar5 to Ar6, R51 to R58 may be the same or different and are each independent as defined above R17 to R28, and one of R55 to R58 is a single bond connected to L7.

12. The organic light-emitting diode of claim 11, wherein the heterocyclic compound represented by Chemical Formula B is any one selected from the group consisting of the following Compounds 117 to 136:

[Compound 117]

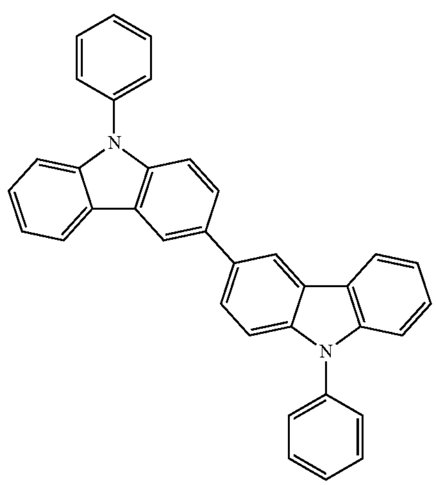

-continued

[Compound 118]

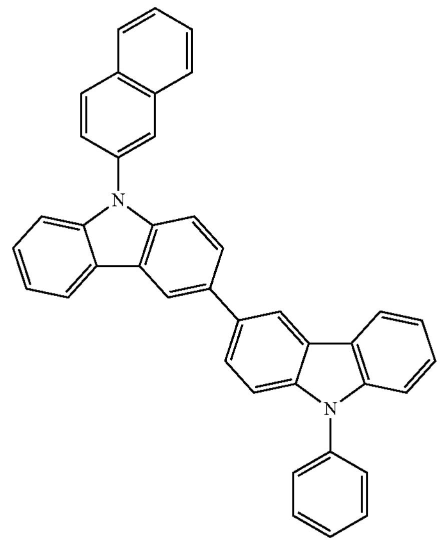

[Compound 119]

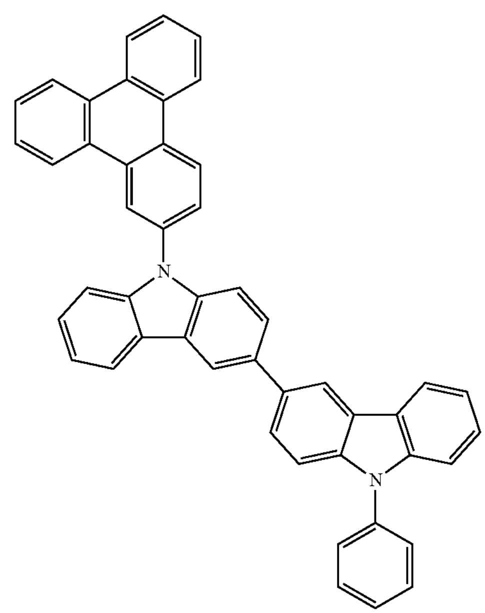

-continued
[Compound 120]
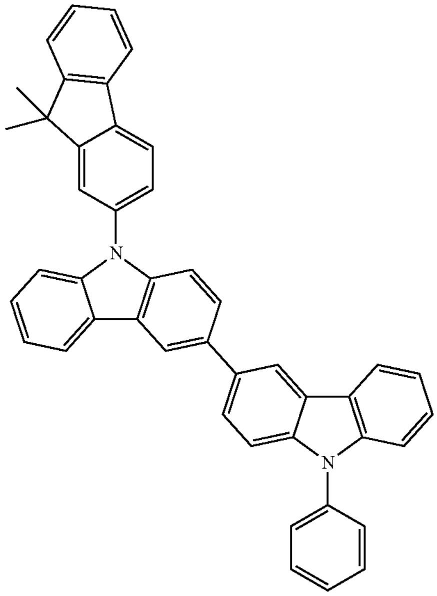
[Compound 121]
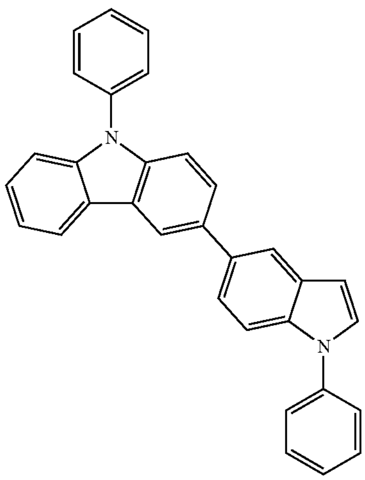
[Compound 122]
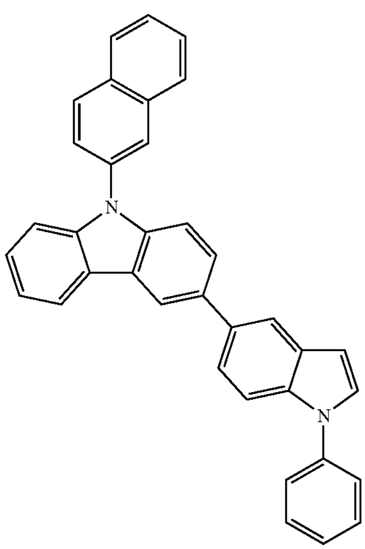
-continued
[Compound 123]
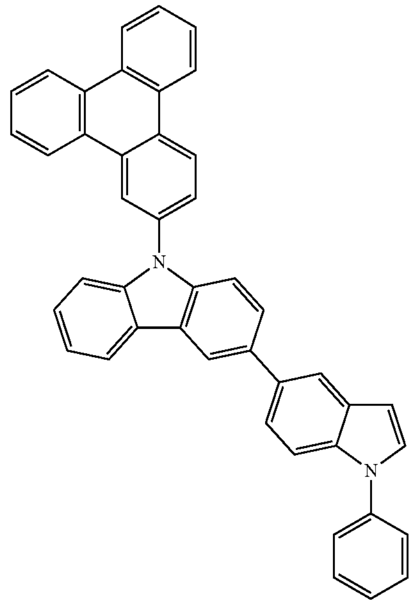
[Compound 124]
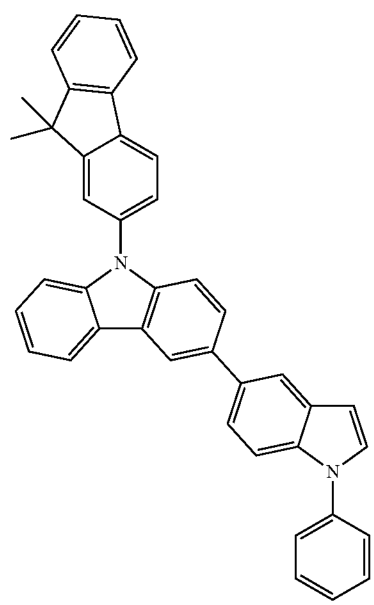

-continued
[Compound 125]
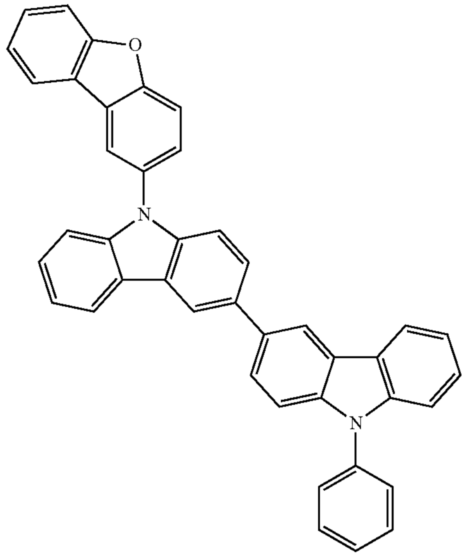
[Compound 126]
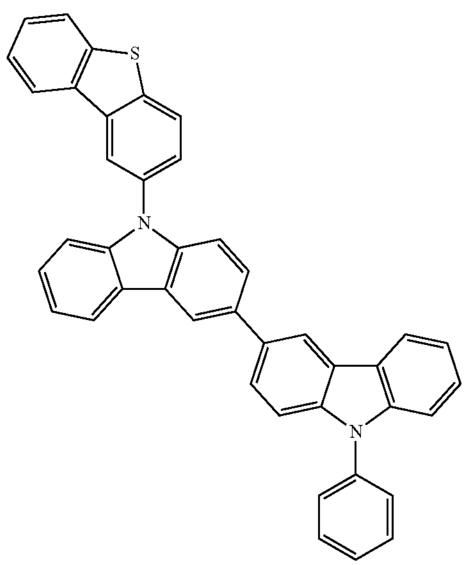
-continued
[Compound 127]
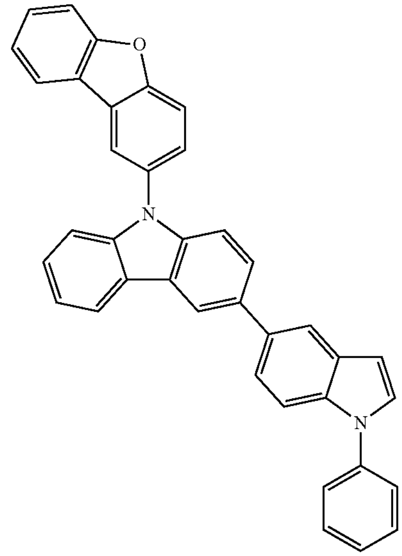
[Compound 128]
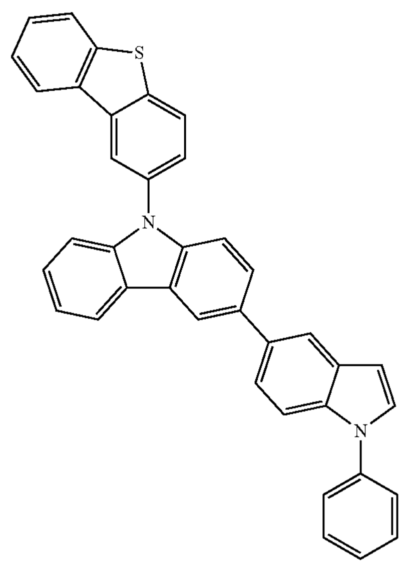

-continued
[Compound 129]
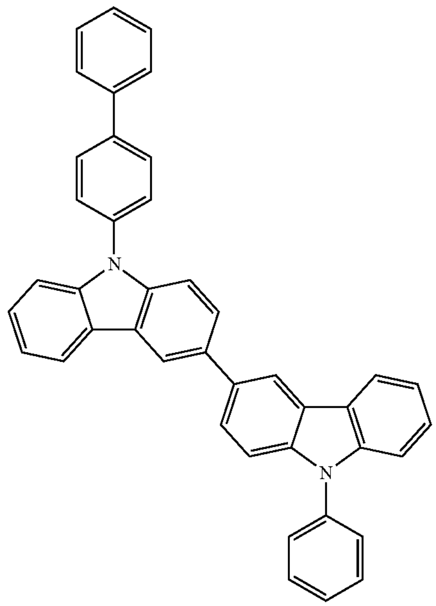
[Compound 130]
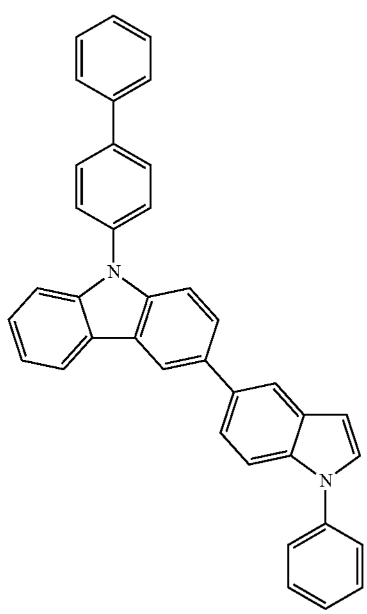
-continued
[Compound 131]
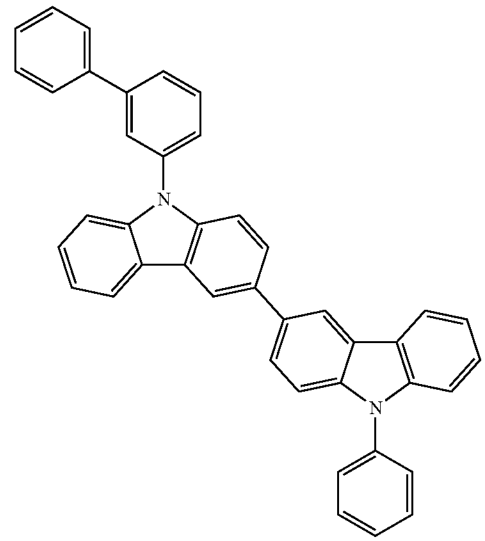
[Compound 132]
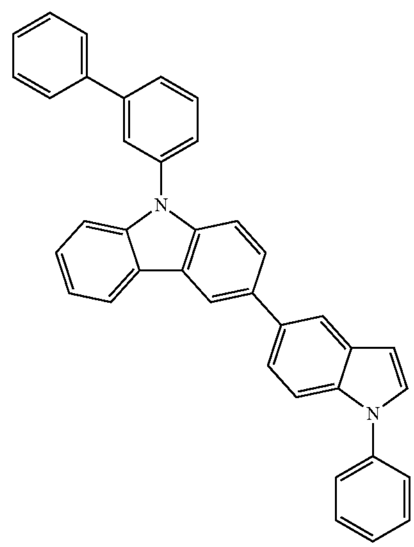
[Compound 133]
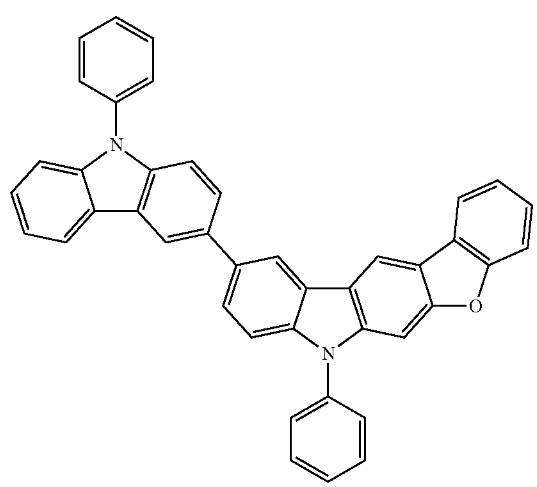

-continued

[Compound 134]

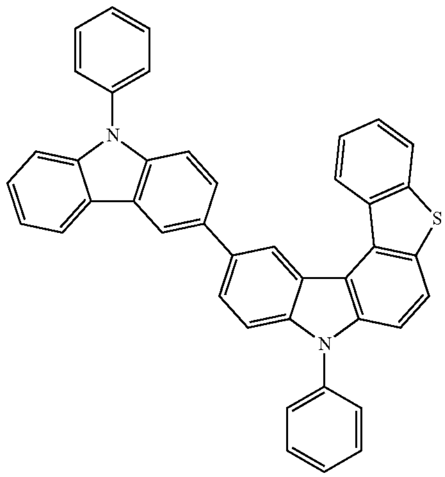

[Compound 135]

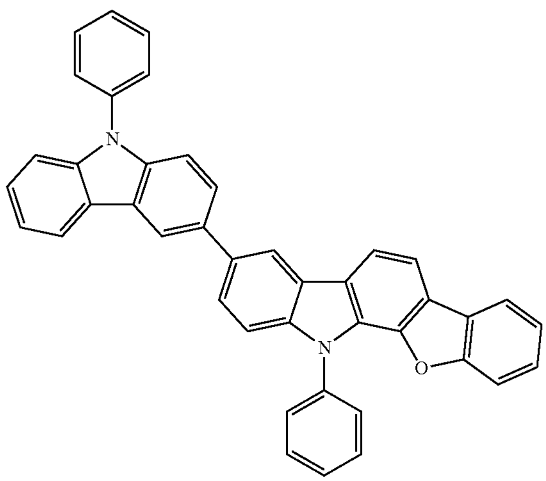

-continued

[Compound 136]

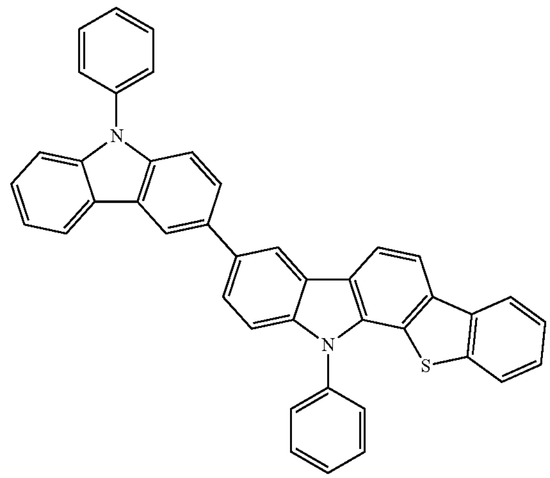

13. The organic light-emitting diode of claim 9, wherein the organic layer further comprises a hole barrier layer or an electron barrier layer.

14. The organic light-emitting diode of claim 9, wherein at least one of the layers is formed using a single-molecule deposition process or a solution process.

15. The organic light-emitting diode of claim 8, wherein the organic light-emitting diode is applied to a device selected from among flat display devices, flexible display devices, monochrome or grayscale flat illumination devices, and monochrome or grayscale flexible illumination devices.

16. The organic light-emitting diode of claim 9, wherein the organic layer interposed between the first electrode and the second electrode comprises an electron transport layer, the heterocyclic compound of claim 1 being used in the electron transport layer.

* * * * *